(12) United States Patent
Kawasaki

(10) Patent No.: US 7,894,009 B2
(45) Date of Patent: *Feb. 22, 2011

(54) LIQUID CRYSTAL DISPLAY DEVICE AND A MANUFACTURING METHOD OF THE SAME

(75) Inventor: Kiyohiro Kawasaki, Osaka (JP)

(73) Assignee: Au Optronics Corporation, Hsin-Chu (TW)

( * ) Notice: Subject to any disclaimer, the term of this patent is extended or adjusted under 35 U.S.C. 154(b) by 940 days.

This patent is subject to a terminal disclaimer.

(21) Appl. No.: 11/785,939

(22) Filed: Apr. 23, 2007

(65) Prior Publication Data

US 2008/0030637 A1    Feb. 7, 2008

Related U.S. Application Data

(62) Division of application No. 10/963,801, filed on Oct. 14, 2004, now Pat. No. 7,321,404.

(30) Foreign Application Priority Data

Jan. 29, 2004   (JP) .............................. 2004-021288

(51) Int. Cl.
*G02F 1/136* (2006.01)
(52) U.S. Cl. ....................................................... 349/43
(58) Field of Classification Search .................... 349/43
See application file for complete search history.

(56) References Cited

U.S. PATENT DOCUMENTS 6,038,003 A * 3/2000 Kim .............................. 349/43
6,362,858 B1 * 3/2002 Jeon et al. ..................... 349/43
7,321,404 B2 * 1/2008 Kawasaki ..................... 349/43

* cited by examiner

*Primary Examiner*—James A Dudek
(74) *Attorney, Agent, or Firm*—Bacon & Thomas, PLLC

(57) ABSTRACT

In the conventional manufacture method that has reduced the number of manufacture processes by forming semiconductor layers and source-drain wires for a channel-etch type insulating gate transistor in a single photo etching process using halftone exposure technology, the channel length increases when the photosensitive resin pattern used at above formation process of source-drain patterning is reduced. Hence the manufacture tolerance (margin) is small, and the yield decreases when the distance between the source wire and drain wire is shortened. This invention suggests the 4-mask process and, 3-mask process of the TN type liquid crystal display devices and IPS-type liquid crystal display devices by combining the following: streamline technology to form the already known pixel electrodes and scanning lines simultaneously; new technology to streamline the opening formation process in gate insulating layers and island formation process of semiconductor layer, using halftone exposure technology; and new technology to streamline the protective layer formation process for electrode terminals by adding halftone exposure technology to the already known anode oxidization technology for source-drain wires.

9 Claims, 27 Drawing Sheets

LIQUID CRYSTAL DISPLAY DEVICE AND A MANUFACTURING METHOD OF THE SAME

This application is a Division of nonprovisional application Ser. No. 10/963,801, filed Oct. 14, 2004.

FIELD OF THE INVENTION

This invention is related to a liquid crystal display device that has a color image display function, especially to an active type liquid crystal display device.

DESCRIPTION OF THE RELATED ART

With the advancement of fine processing technology, liquid crystal material technology, high density assembly technology, etc. in recent years, a large quantity of television and other image display devices are now commercially available with liquid crystal display devices of 5-75 cm in diagonal dimension. In addition, color display has been obtained easily by forming an RGB colored layer on one of the 2 glass substrates that are part of a liquid crystal panel. The active-type liquid crystal panels that have switching elements in each pixel, especially, are able to provide less cross talk, quick response speed, and images with high contrast ratio.

These liquid crystal display devices (liquid crystal panels) usually have matrix formation of approximately 200-1,200 scanning lines and 300-1,600 signal lines, but larger screens and higher precision are being offered simultaneously nowadays in order to meet the increase of display capacity.

FIG. 21 shows how the liquid crystal device is mounted onto a liquid crystal panel. The methods to provide electric signals to the image display area include the following: 1) The method to connect a semiconductor integrated circuit chip 3 that provides driving signals to electrode terminals 5 of scanning lines formed on one of the transparent insulating substrates that compose the liquid crystal 1, a glass substrate 2 for example, with a conductive adhesive. 2) The TCP (Tape-Carrier-Package) method to pressure-weld the TCP film 4, which has terminals of gold or solder-plated copper foil on a thin polyimide resin film base for example, the electrode terminals 6 of signal lines, using an appropriate adhesive that includes a conductive medium. Both methods are shown here for convenience, but the most appropriate method between the two is selected in actual cases.

The wiring paths 7 and 8, which connect the pixels within the image display area located in the center area of the liquid crystal panel 1 and electrodes 5 and 6 for scanning lines and signal lines, do not need to be composed of the same conductive material as the electrodes 5 and 6.

FIG. 22 shows the equivalent circuit of an active liquid crystal display device, which distributes an insulating gate type transistor 10 in each pixel as a switching element, 11 (7 in FIG. 21) means the scanning line, 12 (8 in FIG. 21) means the signal line, and 13 means a liquid crystal cells and the liquid crystal cells 13 are treated as capacitors for electricity. Elements drawn in solid lines are formed on glass substrate 2, one of the two substrates to compose a liquid crystal panel, and the opposing electrode 14, which is shared among the liquid crystal cells 13, drawn with dotted line, is formed on the principal panel that faces the other glass substrate 9. In the case the off resistance of the insulating gate type transistor 10 or the resistance of liquid crystal cells 13 is low or the tone of the display images is emphasized, a circuit device such as a supplementary storage capacitance 15 is added to the liquid crystal cell 13 in order to increase the time constant of the liquid cell 13 as a load. In addition, 16 means a storage capacitance line which is the common bus bar for the storage capacitance 15.

FIG. 23 shows the cross section of the main part of image display for a liquid crystal display device. The two glass substrates, 2 and 9, which compose a liquid crystal panel 1 are formed at a specific distance such as a few μm, according to the spacer material (not shown) such as pillar-shaped resin spacers formed color filter 9, or resin-based fibers, beads, and the gap is a closed space encapsulated by a sealing material and encapsulating material consisting of organic resin near the peripheral of the glass substrate 9. Liquid crystal 17 are filled in this closed space.

To obtain color display, a thin organic film of 1-2 μm in thickness, or colored layer 18, including a dye and/or pigment on the closed space side of the glass substrate 9 gives the color display function; in such a case, the glass substrate 9 is called color filter (CF). Depending on the characteristics of the liquid crystal material 17, a polarizing plate 19 is attached to the upper surface of the glass substrate 19 and/or lower surface of the glass substrate 2, and the liquid crystal panel 1 functions as an electro-optical device. Today, most of the commercially available liquid crystal display panels use a TN (Twisted Nematic)-type liquid crystal material, normally requiring 2 polarizing plates 19. Transmissive liquid crystal panels, though not shown here, use rear lighting as a light source, radiating white light up from a lower position.

The polyimide based thin resin film 20 of approximately 0.1 μm in thickness for example, which is formed on two glass substrates 2 and 9 after being exposed to liquid crystal 17, is a film that orientates liquid crystal molecules into specific directions. 21 is a drain electrode (wire) that connects a drain of the insulating gate type transistor 10 and pixel electrode 22 of transparent conductivity, normally formed at the same time as the signal (source) lines 12. A semiconductor layer 23 is found between the signal lines 12 and drain electrode 21 and is explained later in detail. The Cr thin film layer 24 of about 0.1 μm in thickness, which is formed in the border area of the adjacent colored layer 18 on the color filter 9, is a light shielding component that prevents outside light from coming into the semiconductor layer 23, scanning lines 11, and signal lines 12; this established technology is commonly known as black matrix (BM).

Here, the structure and manufacturing method of an insulating gate type transistor as a switching element are explained. Two kinds of insulating gate type transistors are frequently used today, but one of the two types, the etch-stop type, is introduced here as the conventional example. FIG. 24 shows the plan view for a unit pixel of the active substrate (a semiconductor device for a display device) that composes a conventional liquid crystal panel. The manufacturing process is briefly explained below by showing the cross section of FIG. 24 (e) at lines A-A', B-B', and C-C' in FIG. 25.

First, a primary metal layer of approximately 0.1-0.3 μm in film thickness is deposited on a principal plane of a glass substrate 2 of 0.5-1.1 mm in thickness, such as Corning's product number 1737 as an example of a substrate with high heat-resistance, high chemical-resistance, and high transparency, using a vacuum film-depositing equipment such as an SPT (sputter), and scanning lines 11 which also work as gate electrodes 11A and storage capacity lines 16 are formed selectively using fine processing technology such as photosensitive resin patterns as shown in FIGS. 24 (a) and 25 (a). The scanning line material is selected after considering the all-around heat resistance, chemical resistance, and conductivity, but a metal with high-heat resistance such as Cr, Ta, and Mo or an alloy such as MoW is usually used.

It is reasonable to use AL (aluminum) as a material for scanning lines for lowering the resistance value of the scanning lines in response to larger screens and higher precision of liquid crystal panels, but the general technologies used today are lamination with the said heat resistant metals such as Cr, Ta, Mo, or their silicides and addition of an oxidized layer (A1203) onto the AL surface, using anode-oxidization, for AL alone has low heat resistance. In other words, scanning lines 11 consist of 1 or more metal layers.

Next, deposit 3 kinds of thin film layers successively, such a primary SiNx (silicon nitride) layer 30 which composes a gate insulating layer, a primary amorphous silicon (a-Si) layer 31 which includes almost no impurities and composes a channel for an insulating gate type transistor, and a secondary SiNx layer 32 which composes the insulating layer to the protect channel, using a PCVD (plasma CVD) equipment over the entire surface of the glass substrate 2 with 0.3, 0.05, and 0.1 μm in thickness respectively, for example. Using the fine processing technology such as photosensitive resin patterns as shown in FIGS. 24 (b) and 25 (b), selectively leave the secondary SiNx layers above the gate electrodes 11A narrower than the gate electrodes 11A, making them protective insulating layers 32D, and expose the primary amorphous silicon layer 31.

After depositing a secondary amorphous silicon layer 33, including an impurity such as phosphorus, over the entire surface with 0.05 μm in thickness for example, also using the PCVD equipment, deposit successively, 1) a thin film layer 34 as a heat-resistant metal layer of about 0.1 μm in thickness, such as Ti Cr, Mo, etc., 2) an AL thin film layer 35 of about 0.3 μm in thickness as a low resistance wire layer, and 3) a Ti thin film layer 36 as an intermediate conductive layer of about 0.1 μm in thickness, using a vacuum film-depositing equipment such as the SPT. As shown in FIGS. 24 (c) and 25 (c), using fine processing technology such as photosensitive resin patterns, selectively form drain wires 21 and form signal lines 12 which also work as the source electrode for an insulating gate type transistor, both consisting of a laminate of 3 thin film layers, 34A, 35A, and 36A, which are source-drain wire materials. This selective pattern formation is done through 1) etching Ti thin film layer 36, AL thin film layer 35, and Ti thin film layer 34 in this order, using the photosensitive resin patterns, as used in the formation of source-drain wires, as masks, 2) removing the secondary amorphous silicon layer 33 between the source electrode 12 and the drain electrode 21, and 3) exposing the protective insulating layers 32D. At other areas, the said selective pattern formation is done through removing the primary amorphous silicon layer 31 and exposing the gate insulating layer 30. This method is called the etch-stop method, for the etching of the secondary amorphous silicon layer 33 is automatically completed in an environment where the secondary SiNx or 32D (protective insulating layers, etch-stop layers, or channel protective layers) exists.

After the formation of the drain wires 12 and drain wires 21, 1) deposit a SiNx layer of about 0.3 μm in thickness as a transparent insulating layer over the entire surface of the glass substrate 2, using the PCVD equipment as same as the gate insulating layer, making this a passivation insulating layer 37, 2) selectively remove the passivation insulating layer 37, using fine processing technology such as photosensitive resin patterns as shown in FIGS. 24 (d) and 25 (d), 3) form openings 62 at the drain electrodes 21, another openings 63 at the scanning lines and another openings 64 at the signal lines 12 to be formed outside an image display area, 4) expose the drain electrodes 21, part 5 of scanning lines 11 and part 6 of the signal lines 12. Openings 65 are formed in the same manner at the electrode patterns, which have parallel-bundled the storage capacity lines 16, exposing part of the storage capacity lines 16.

Lastly, complete this process by 1) depositing a transparent conductive layer of about 0.1-0.2 μm in thickness, such as ITO (Indium-Tin-Oxide) or IZO (Indium-Zinc-Oxide), using a vacuum film-depositing equipment such as the SPT, 2) selectively forming pixel electrodes 22, making this an active substrate 2, on the passivation insulating layer 37 containing the openings 62, using fine processing technology such as photosensitive resin patterns as shown in FIGS. 24 (e) ad 25 (e). Part of the exposed scanning lines 11 within the openings 63 and part of the signal lines 12 within the openings 64 may compose electrode terminals 5 and 6, respectively, and electrode terminals 5A and 6A consisting of ITO may be selectively formed on the passivation insulating layer 37, containing the openings 63 and 64 as shown in the figures. However, short circuit wire 40s, which connect the electrode terminals 5A and 6A, are usually formed at the same time, for resistance increase by forming stripes between the electrodes 5A/6A and short circuit wires 40 may be used as the high resistance needed for measures against static electricity (not shown in figures). Although not given part number, but electrode terminals for the storage capacity lines 16, containing the opening 65, are formed.

The low resistance wire layer 35 consisting of AL is not absolutely necessary if the wire resistance of the signal lines 12 is not a problem. In such a case, simplification is possible by making a single layer out of a source wire 12 and drain wire 21 if a heat resistant metal material such as Cr, Ta, and MoW is selected. As described above, it is important to secure an electric connection between the source/drain wires and the secondary amorphous silicon layer, through a heat resistant metal layer; see the prior example in the Japanese Unexamined Patent Application Publication, the Heisei 7-74368 issue, for detailed description of heat-resistance in the insulating gate type transistors. Furthermore, FIG. 24 (c) shows that the storage capacitance 15 is formed in the area 50 (a diagonal line going up to the right hand side), where the storage capacity line 16 and the drain electrode 21 are overlapped at level on both sides of the gate insulating layer 30, but its detailed description is not given here.

The 5-mask process mentioned above is not described in detail here, but this has been obtained as a result of streamlining of the island-forming process for the semiconductor layer and contact-formation process; 7-8 photomasks used to be required before, but only 5 of them is required nowadays through the introduction of dry etching technology, largely contributing to cost reduction. In order to reduce the production cost of liquid display devices, it would be necessary to reduce the process cost of active substrates during the manufacturing process and to reduce the components cost during the panel assembly process and module mounting process as we all know. There are two ways to reduce the process cost, process reduction to reduce the process steps and changing to cheaper process development or process, but the 4-mask process in which active substrates are obtained with 4 photomasks is described here as an example of process reduction. This 4-mask process reduces the photo etching process by introducing halftone technology, and FIG. 26 shows the plan view for a unit pixel of active substrate that correspond to the 4-mask process. FIG. 27 shows the cross section at A-A', B-B', and C-C' lines of FIG. 26(e). As already mentioned above, two kinds of insulating gate type transistors are frequently used, but the insulating gate type transistors of the channel etching type are used here.

First, deposit a primary metal layer about 0.1-0.3 µm in thickness over the principal plane of the glass substrate 2, as in the 5 mask process, using a vacuum film-depositing equipment such as the SPT, and selectively form scanning lines 11 doubling the gate electrodes 11A, and storage capacity lines 16 using fine processing technology such as photosensitive resin patterns.

Next, deposit the 3 kinds of thin film layers successively over the entire surface of the glass substrate 2, using the PCVD equipment: 1) an SiNx layer 30 composing the gate insulating layer, 2) a primary amorphous silicon layer 31 including almost no impurities and composing a channel for an insulating gate type transistor, and 3) a secondary amorphous silicon layer 33 including impurities and composing the source-drain for an insulating gate type transistor with such as about 0.3, 0.2, and 0.05 µm in thickness, respectively. Deposition of the source-drain wire materials follows; using the vacuum film-depositing equipment such as the SPT, 1) deposit a) a Ti thin film layer 34 of 0.1 µm in thickness for a heat-resistant metal layer for example, b) an AL thin film layer 35 of 0.3 µm in thickness for a low resistance wire layer for example, and c) a Ti thin film layer 36 of 0.1 µm in thickness for an intermediate conductive layer for example, and 2) selectively form drain electrodes 21 and signal lines 12 that also work as source electrodes for the insulating gate type transistors. However, in this selective pattern formation, the channel-forming area 80B between the source-drain (diagonal line) is 1.5 µm in thickness for example, as shown in FIGS. 26(*b*) and 27(*b*) by using the halftone exposure technology, and one of the most notable feature of streamlined 4-mask process is that it forms photosensitive resin patterns 80A and 80B, which are thinner than 3 µm, the thicknesses of the film in 80A (12) and 80A (21) in the source-drain wire-forming areas, respectively.

As positive photosensitive resin is normally used for these photosensitive resin patterns 80A and 80B during the manufacture of substrates for liquid crystal display devices, the source/drain wire-forming area 80A is black, meaning that Cr thin film is formed, the channel area 80B is gray, meaning that line-and-space Cr patterns of 0.5-1 µm in width are formed for example, and other areas are white, meaning that photomasks with removed Cr thin film may be used. Line and space is not resolved since resolution of the exposure equipment is low in the gray area, and about half of the photomask light from the lamp light source may be transmitted, making it possible to obtain photosensitive resin patterns 80A and 80B, which have a concave cross section as shown in FIG. 27(*b*) according to the remaining film property of positive photosensitive resin. In addition, by forming a thin film, in the gray area, such as MoSi2 with different thickness from Cr thin film and not the Cr thin film slit, photomasks with equivalent functions may be obtained.

After exposing the gate insulating layer 30 by successively etching Ti thin film layer 36, AL thin film layer 35, Ti thin film layer 34, secondary amorphous silicon layer 33, and primary amorphous silicon layer 31 using the said photosensitive resin patterns 80A and 80B as masks as shown in FIG. 27(*b*), if the film of the photosensitive resin patterns 80A and 80B is reduced by more than 1.5 µm using a method such as the oxygen plasma ashing method as shown in FIGS. 26(*c*) and 27(*c*), the photosensitive pattern 80B is lost and the channel area is exposed, enabling 80C (12) and 80C (21) to be left as they are only at the source/drain wire-forming areas. Now etch again the Ti thin film layer, AL thin film layer, Ti thin film layer, secondary amorphous silicon layer 33A, and primary amorphous silicon layer 31A by using the photosensitive resin patterns 80C(12) and 80C(21), whose film has been reduced in thickness, as masks. But etch the primary amorphous silicon layer 31A, leaving approximately 0.05-0.1 µm. For the source/drain wires are formed by etching the primary amorphous silicon layer 31A leaving approximately 0.05-0.1 µm after etching the metal layer, the insulating gate type transistors manufactured in this method are called channel-etched. Furthermore, for the resist pattern 80A is converted to 80C after its film is thinned down in the said plasma treatment, it is desirable to strengthen anisotropy in order to regulate the pattern dimension changes; oxygen plasma treatment by the RIE (Reactive Ion Etching) method is desirable, and ICP (Inductive Coupled Plasma) method or TCP (Transfer Coupled Plasma) method, both has plasma source of higher density, is even more desirable.

Next, after removing the said photosensitive resin patterns 80C(12) and 80C(21), do the following as for the 5-mask process: 1) form a passivation insulating layer 37 by depositing an SiNx layer of approximately 0.3 µm in thickness, as a transparent insulating layer, on the entire surface of the glass substrate 2, 2) form openings 62, 63, and 64 at the drain electrodes 21, and at the electrode terminal-forming areas of scanning lines 11 and signal lines 12, using fine processing technology such as photosensitive resin patterns as shown in FIGS. 26(*d*) and 27(*d*), 3) remove the passivation insulating layer 37 and the gate insulating layer 30 within the openings 63 to expose part 5 of scanning lines, and remove the passivation insulating layer 37 within the openings 62, 64 to expose part of drain wires 21 and part 6 of signal lines, and 4) similarly form openings 65 on the storage capacitor lines 16 and expose part thereof.

Lastly, 1) deposit a transparent conductive layer of approximately 0.1-0.2 µm in thickness, such as ITO or IZO, using a vacuum film-depositing equipment such as the SPT and 2) complete forming an active substrate 2 by selectively forming transparent conductive pixel electrodes 22 containing the openings 62 in the passivation insulating layer 37, using fine processing technology such as shown in FIGS. 26(*e*) and 27(*e*). As for the electrode terminals, transparent conductive electrode terminals 5A and 6A are formed from ITO on the passivation insulating layer 37 here, containing the openings 63 and 64.

SUMMARY OF THE INVENTION

As the contact formation process for drain electrodes 21 and scanning lines 11 is done simultaneously in the 5-mask and 4-mask process as described above, the insulating layers for the corresponding openings 62 and 63 differ in thickness and type. The passivation insulating layer 37 has a lower film-depositing temperature and film of inferior quality, compared to the gate insulating layer 30, resulting in creating a 1-digit difference in the etching speed by fluorinated acid-based etching solution at several 1000 A/minute and several 100 A/minute, respectively; as an excessive etching occurs on the upper part of the cross section at the openings 62 on the drain electrodes 21, not allowing to regulate the hole diameter, it uses fluorinated gas-based dry etching method.

The openings 62 on drain electrodes 21 only have a passivation insulating layer 37 even after using the dry etching method, making it impossible to avoid excessive etching, compared to the openings 63 on scanning lines 11; as a result, film of the intermediate inductive layer 36A may get thinner due to the etching gas, depending on the material used for the layer. Furthermore, when removing the photosensitive resin patterns after etching, it is usually done by 1) eliminating approximately 0.1-0.3 µm of the photosensitive resin pattern surface by oxygen plasma ashing in order to remove polymers from the fluorinated surface, followed by 2) applying chemical treatment, using organic stripping solution such as Tokyo Ohka Kogyo's stripping solution 106, for example. However, when the film of the intermediate conductive layer 36A gets thinner, exposing the aluminum ground material 35A, an insulator AL203 is formed on the surface of the aluminum layer 35A with oxygen plasma ashing treatment, making it difficult to obtain good ohmic contact with the pixel electrode 22. Thus, there is an attempt to avoid this problem by set up the film 0.2 μm thicker in order to allow the reduced film thickness of the intermediate inductive layer 36A. Another way to avoid this problem is to remove the aluminum layer 35A, expose the ground material heat resistant metal layer or the thin film layer 34A, and form the pixel electrode 22 when forming openings 62-65; in this case, there is a merit of not having to have an intermediate conductive layer 36A from the beginning.

However, as the said measures do not always work as effectively as expected if the thin film's homogeneity within the surface thickness is not good; the result is the same when the etching speed's homogeneity within the surface is not good. The second measure above does not require the intermediate inductive layer 36A, but the removing process of the aluminum layer 35A needs to be added, and there was a possibility of pixel electrode 22 being cut off when the cross section control for openings 62 is not appropriate.

In addition, in channel-etch type insulating gate transistors, if the primary amorphous silicon layer 31 with no purities in the channel area is not deposited thicker than necessary (usually 0.2 μm or more with the channel etch type), it tends to get irregular transistor properties, especially the Off-state current, as it is largely affected by homogeneity inside the glass substrate. This is very significant from the standpoint of production cost as it affects operation rate of a PCVD equipments and particle-generating status.

Furthermore, as the channel-forming process used in the 4-mask process selectively removes the source/drain wire materials and semiconductor layer between the source wire 12 and the drain wire 21, it determines the channel length (4-6 μm in today's mass produced goods), which largely affects the On-state properties of insulating gate type transistors. The channel length fluctuation has significant effects on the On-state current of insulating gate type transistors, usually requiring strict manufacture management, but the channel length or the pattern dimension of the halftone exposure area is affected by many parameters such as exposure value (light source intensity and photomask pattern precision, especially line and space dimensions), coat thickness of the photosensitive resin, photosensitive resin development, and the film reduction volume of the photosensitive resin in the said etching process. The channel length is not always stable and high-yielding partly due to the homogeneity of these volumes within the surface; as a result, manufacture management even more strict than before is needed, but it has not reached the perfected high-level yet. The tendency is more clear especially when the channel length is 6 μm or below. That is due to the fact that the channel length is formed 3 μm or longer than the default value as the dimension between photosensitive resin patterns 80A becomes 3 μm or longer if films of the photosensitive resin patterns 80A and 80B get reduced isotropically while the film thicknesses of the photosensitive resin patterns 80A and 80B are reduced by 1.5 μm.

The invention has taken this situation into consideration; it not only deters nonconformity during the contact forming time, which is common at the prior 5-mask process and 4-mask process, but also lessens the number of manufacture processes, using the halftone exposure technology that has a large manufacturing margin. Furthermore, this helps lower the liquid crystal panel cost. It is clear that further reduction of the number of manufacture processes is needed in order to correspond to the demand increase, and this invention's value is further enhanced by using technologies to simplify other manufacture processes to lower the cost.

This invention successfully reduce the number of manufacture processes by adapting to this invention a streamlined manufacture process of pixel electrodes, whose technology is disclosed in the prior technology Japanese Unexamined Patent Application Publication H7-175088. Next, the number of manufacture processes is further reduced by applying halftone exposure technology to the semiconductor layer forming process and to the contact forming process for scanning lines, in which pattern precision control are easily done. In the event that insulating gate type transistors that are the etch-stop type with protective insulating layers on the channels are used, an insulating layer is formed on the source/drain surface, making the formation of a passivation layer not necessary by forming source/drain wires, using the photosensitive organic insulating layer in order to add a passivation function to the source/drain wires of the insulating gate type transistors as disclosed in the Japanese Unexamined Patent Application Publication H2-275925, and also by leaving a photosensitive organic insulating layer as it is. In the event that insulating gate type transistors of the channel etch type that do not have protective insulating layers on the channels are used, process streamlining and lower temperature are achieved by adding anode-oxidization technology that forms an insulating layer on the surfaces of source/drain wires consisting of aluminum as disclosed in the Japanese Unexamined Patent Application Publication H2-216129. For further process reduction, the protective layer forming process for electrode terminals is streamlined by applying the halftone technology also in anode-oxidized layer formation of source/drain wires. [Patent document 1] Japanese Unexamined Patent Application Publication H7-74368. [Patent document 2] Japanese Unexamined Patent Application Publication H7-175088. [Patent document 3] Japanese Unexamined Patent Application Publication H2-275925. [Patent document 4] Japanese Unexamined Patent Application Publication H2-216129. [Patent document 5] Japanese Unexamined Patent Application Publication S59-9962.

The insulating gate type transistors described in Claim 1 are a bottom-gate type, characterized by forming gate electrodes consisting of 1 or more primary metal layers on an insulating substrate, 2) forming island-like primary semiconductor layers including no impurities above the gate electrodes through 1 or more gate insulating layers, 3) forming a pair of a secondary semiconductor layer including impurities, which comprise the source-drains of the insulating gate type transistors, by overlapping with gate electrodes on the said primary semiconductor layers, 4) forming source-drain wires on the said secondary semiconductor layers and on the gate-insulating layer, which include a heat-resistant metal and consist of 1 or more anode-oxidizable layers, and 5) forming anode-oxidized layers on the source-drain wires and channels, except in the electrically connecting areas of the source wires; for the anode-oxidized layer has a passivated function, there is no need to add a passivation insulating layer such as SiNx. Claims 5, 6, 9, 11, and 12 shall clearly explain what such transistors are in relation to liquid crystal display devices.

A liquid crystal display device, as described in Claim 2, is characterized by self alignment between the semiconductor layers containing the channels of the insulating gate type transistors and the openings formed in the gate insulating layer for connection with scanning lines in the liquid crystal display device that is filled with liquid crystal between 1) a primary transparent insulating substrate that aligns, in a 2-dimensional matrix on a principal plane, unit pixels that have at least a) insulating gate type transistors, b) scanning lines that also work as gate electrodes and signal lines that also work as source wires for the said insulating gate type transistors, c) pixel electrodes that are connected to drain wires (and d) counter electrodes formed within a specific distance from the said pixel electrodes,) and 2) a secondary transparent insulating substrate or a color filter that faces the said primary transparent insulating substrate.

This structure is possible only after the formation of semiconductor layers and openings are achieved with the photo etching technology (patterning) using the same photomask and it is the basis for the reduction of manufacturing processes made possible by this invention.

A liquid crystal display device in Claim 3, as described in Claim 2, which has at least the following characteristics in a liquid crystal display device that is filled with liquid crystal between 1) a primary transparent insulating substrate that aligns, in a 2-dimensional matrix on a principal plane, unit pixels that have at least a) insulating gate type transistors, b) scanning lines that also work as gate electrodes and signal lines that also work as source wires for the said insulated gate type transistors, and c) pixel electrodes that are connected to drain wires and 2) a secondary transparent insulating substrate or a color filter that faces the said primary transparent insulating substrate; I) Forming 1) scanning lines consisting of a laminate of a transparent conductive layer and a primary metal layer and 2) transparent conductive pixel electrodes on a principal plane of a primary transparent insulating substrate, II) Forming island-like primary semiconductors layer with no impurities through the plasma protective layer and the gate insulating layer above the gate electrodes, III) Forming a pair of secondary semiconductor layers with impurities that comprise the source-drains for the insulating gate type transistors, partly overlapping with gate electrodes on the said primary semiconductor layers, IV) Forming openings, which self align with the said island-like primary semiconductor layers, in the plasma protective layer and the insulating layer on the said pixel electrodes to expose pixel electrodes, V) Forming 1) source (signal) wires consisting of 1 or more secondary metal layers with a heat resistant metal layer on the said secondary semiconductor layers and the gate insulating layer and 2) drain wires consisting also of a secondary metal layer on a) the said secondary semiconductor layers, b) the gate insulating layer, and c) part of the pixel electrodes within the said openings, and VI) Forming a passivation insulating layer on the said primary transparent substrate with openings on the said pixel electrodes.

For transparent conductive pixel electrodes are formed at the same time as scanning lines by this composition, they are formed on the glass substrate. This feature is seen in the majority of this invention or liquid crystal display devices. In addition, there is no nonconformity relating to contact formation because a conventional insulating layer, SiNx, is formed on an active substrate and also because the film thicknesses of passivation insulating layers on the electrode terminals of scanning lines and signal lines become equal.

Likewise, the liquid crystal display device in Claim 4, as described in Claim 2, is characterized by the following: I) Forming 1) scanning lines, 2) pseudo electrode terminals of scanning lines which are part of the scanning lines, 3) pseudo electrode terminals of the signal lines, and 4) pseudo pixel electrodes, all are consisting of a laminate of a transparent conductive layer and a metal layer, on a principal plane of the primary transparent insulating substrate, II) Forming island-like primary semiconductor layers with no impurities through the plasma protective layer and the gate insulating layer above the gate electrodes, III) Forming a pair of secondary semiconductor layers with impurities that comprise the source-drains for the insulating gate type transistors, partly overlapping with gate electrodes on the said primary semiconductor layers, IV) Forming openings, which self align with the said island-like primary semiconductor layers, in the plasma protective layer and the gate insulating layer on the 1) pseudo electrode terminals of the said scanning lines, 2) pseudo electrode terminals of the signal lines, and 3) pseudo pixel electrodes, exposing pseudo electrode terminals of the scanning lines, pseudo electrode terminals of the signal lines, and pseudo pixel electrodes, respectively, V) Forming 1) source wires (signal lines) consisting of 1 or more of secondary metal layers, which include a heat-resistant metal layer on the said secondary semiconductor layers and the gate insulating layer and 2) drain wires also consisting of a secondary metal layer on the said secondary semiconductor layers, the gate insulating layer, and on part of the pseudo pixel electrodes within the said openings, and VI) Forming a passivation insulating layer, on the said primary transparent insulating substrate, with openings on the said pseudo electrode terminals of the scanning lines, pseudo electrode terminals of the signal lines, and pseudo pixel electrodes, exposing in each opening transparent conductive a) electrode terminals of scanning lines, b) electrode terminals of signal lines, and 3) pixel electrodes, respectively.

A liquid crystal display device similar to the liquid crystal display device described in Claim 3 with this composition, but the electrode terminals are limited to the transparent conductive layers.

Likewise, the liquid crystal display device in Claim 5, as described in Claim 2, is characterized by the following: I) Forming scanning lines consisting of 1 or more primary metal layers on a principal plane of a transparent insulating substrate, II) Forming island-like primary semiconductor layers with no impurities through 1 or more gate insulating layers above the gate electrodes, III) Forming a pair of secondary semiconductor layers with impurities that comprise the source-drains for the insulating gate type transistors, partly overlapping with gate electrodes on the said primary semiconductor layers, IV) Forming openings, which self align with the said island-like primary semiconductor layers, in the gate insulating layer on the said scanning lines outside an image display area, exposing part of the scanning lines, V) Forming source (signal)/drain wires, on the said secondary semiconductor layers and gate insulating layer, which consist of 1 or more anode-oxidizable metal layers including a heat-resistant metal layer, VI) Forming 1) transparent conductive pixel electrodes on part of the said drain wires and gate insulating layer and 2) transparent conductive electrode terminals on the signal lines outside the image display area, VII) Forming anode-oxidized layers on the surfaces of the source/drain wires, except on part of the said drain wires and electrode terminals of signal lines, and VIII) Forming silicon oxide layers on the primary semiconductor layers between the said source/drain wires.

With this composition, transparent conductive pixel electrodes are located at the very top of the glass substrate for they are formed during the final process. Silicon oxide layers with impurities are formed on the channels between source-drains, protecting the channels and forming tantalum pentoxide ($Ta_2O_5$) or aluminum oxide ($Al_2O_3$) that is an insulating anode-oxidized layer on the surfaces of signal lines and drain wires, adding a passivation function to it. Therefore, there is no need to deposit a passivation insulating layer on the entire surface of a glass substrate, and the heat-resistance problem of the insulating gate type transistors is eliminated. Furthermore, for the insulating layer that protects the channel is obtained by converting an amorphous silicon layer with impurities to silicon oxide layer through anode oxidization, a TN type liquid crystal display device, which does not require the deposition of a thick amorphous silicon layer with no impurities composing a channel layer, is obtained.

Likewise, the liquid crystal display device in Claim 6, as described in Claim 2, is characterized by the following: I) Forming 1) scanning lines consisting of a laminate of a transparent conductive layer and a primary metal layer and 2) transparent conductive pixel electrodes, on a principal plane of the primary transparent insulating substrate, II) Forming island-like primary semiconductor layers with no impurities through a plasma protective layer and a gate insulating layer above the gate electrodes, III) Forming a pair of secondary semiconductor layers with impurities comprising the source-drain for the insulating gate type transistors, partly overlapping with gate electrodes on the said primary semiconductor layers, IV) Forming openings, which self align with the said island-like primary semiconductor layers, in the plasma protective layer and gate insulating layer above the said pixel electrodes, exposing the said pixel electrodes, V) Forming 1) source wires (signal lines) consisting 1 or more of the anode-oxidizable metal layer including a heat-resistant metal layer on the said secondary semiconductor layers and the gate insulating layer and 2) drain wires consisting also of an anode-oxidizable metal layer on the said secondary semiconductor layers, the gate insulating layer and on part of the pixel electrodes within the said openings, VI) Forming anode-oxidized layers on the surfaces of source/drain wires, except on electrode terminals of the said signal lines, and VII) Forming silicon oxide layers on the primary semiconductor layers between the said source/drain wires.

With this composition, transparent conductive pixel electrodes are formed on the glass substrate as they are formed at the same time as scanning lines. In addition, like the liquid crystal display device described in Claim 5, a TN type liquid crystal display device, which does not require the deposition of a thick amorphous silicon layer with no impurities comprising a channel layer, is obtained.

Likewise, the liquid crystal display device in Claim 7, as described in Claim 2, is characterized by the following: I) Forming 1) scanning lines consisting of a laminate of a transparent conductive layer and a primary metal layer, 2) transparent conductive electrode terminals of the scanning lines, which are part of the scanning lines, 3) transparent conductive pixel electrodes, and 4) transparent conductive electrode terminals of the signal lines, on the principal plane of a primary transparent insulating substrate, II) Forming island-like primary semiconductor layers with no impurities through a plasma protective layer and a gate insulating layer above the gate electrodes, III) Forming protective insulating layers narrower than the gate electrodes on the said primary semiconductor layers, IV) Forming openings, which self align with the said island-like primary semiconductor layers, in the plasma protective layer and the gate insulating layer on the said pixel electrodes, electrode terminals of scanning lines, and electrode terminals of signal lines, exposing pixel electrodes, electrode terminals of scanning lines, and electrode terminals of signal lines within each opening, V) Forming a pair of secondary semiconductor layers with impurities that comprise the source-drains of the insulating gate type transistors, on part of the said protective insulating layers and on the primary semiconductor layers, VI) Forming 1) source wires (signal lines) consisting of 1 or more of secondary metal layers, which include a heat-resistant metal layer on the gate insulating layer, the secondary semiconductor layers, and on part of the electrode terminals of the signal lines and 2) drain wires also consisting of the secondary metal layers on the gate insulating layer, the secondary semiconductor layers, and on part of the pixel electrodes within the said openings, and VII) Forming photo-sensitive organic insulating layers on the said source/drain wires.

With this composition, transparent conductive pixel electrodes are formed on the glass substrate for they are formed at the same time as scanning lines. Also the insulating gate type transistors are etch-stop type, protective layers are formed on the channels, and photosensitive organic insulating layers are formed on source-drain wires. As a result, a TN type liquid crystal display device having a passivation function with transparent conductive electrode terminals are obtained. Therefore, there is no need to deposit a passivation insulating layer on the entire surface of a glass substrate, and the heat-resistance problem of the insulating gate type transistors is eliminated.

Likewise, the liquid crystal display device in Claim 8, as described in Claim 2, is characterized by the following: I) Forming 1) scanning lines consisting of a laminate of a transparent conductive layer and a primary metal layer, (2) transparent conductive electrode terminals of the scanning lines, which are part of the scanning lines, 3) transparent conductive electrode terminals of the signal lines,) and 4) transparent conductive pixel electrodes, on the principal plane of a primary transparent insulating substrate, II) Forming island-like primary semiconductor layers with no impurities through a plasma protective layer and a gate insulating layer above the gate electrodes, III) Forming protective insulating layers narrower than the gate electrodes on the said primary semiconductor layers, IV) Forming openings, which self align with the said island-like primary semiconductor layers, in the plasma protective layer and gate insulating layer on the said pixel electrodes, and on part of the signal lines (or electrode terminals of the scanning lines, and electrode terminals of the signal lines) outside an image display part, exposing transparent conductive pixel electrodes and transparent conductive part of scanning lines (or electrode terminals of the scanning lines, and electrode terminals of the signal lines) within each opening, V) Forming a pair of secondary semiconductor layers with impurities that comprise the source-drains of the insulating gate type transistors, on part of the said protective insulating layers and the primary semiconductor layers, VI) Forming 1) source (signal) wires consisting of 1 or more secondary metal layers that include a heat-resistant metal layer on the gate insulating layer and the secondary semiconductor layers (and part of the electrode terminals for the signal lines), 2) drain wires also consisting of the secondary metal layer on the gate insulating layer, the secondary semiconductor layers, and part of the pixel electrodes within the said openings, 3) electrode terminals of scanning lines also consisting of the secondary metal layer on part of scanning lines within the said openings (or transparent electrode terminals of scanning lines), and 4) electrode terminals of signal lines comprising part of the signal lines (or transparent conductive electrode terminals of the signal lines), and VII) Forming photosensitive organic insulating layers on the signal lines except on the electrode terminals for the said signal lines.

With this composition, transparent conductive pixel electrodes are formed on the glass substrate for they are formed at the same time as scanning lines. Also the insulating gate type transistors are etch-stop type, protective insulating layers are formed on channels and photosensitive organic insulating layers are formed on signal lines; as a result, a TN type liquid crystal display device is obtained that has added a minimum passivation function to the active substrate. Therefore, the heat-resistance problem of the insulating gate type transistors is eliminated in the same way as the liquid crystal display device described in Claim 7. Either a transparent conductive layer or a metal layer may be selected for electrode terminals.

Likewise, the liquid crystal display device in Claim 9, as described in Claim 2, is characterized by the following: I) Forming 1) scanning lines consisting of a laminate of a transparent conductive layer and a primary metal layer, ((2) transparent conductive electrode terminals of the scanning lines, which are part of the scanning lines, 3) transparent conductive electrode terminals of the signal lines,) and 4) transparent conductive pixel electrodes, on the principal plane of a primary transparent insulating substrate, II) Forming island-like primary semiconductor layers with no impurities through a plasma protective layer and a gate insulating layer above the gate electrodes; III) Forming protective insulating layers narrower than the gate electrodes on the said primary semiconductor layers, IV) Forming openings, which self align with the said island-like primary semiconductor layers, in the plasma protective layer and the gate insulating layer on the said pixel electrodes, and on part of the signal lines (or electrode terminals of the scanning lines, and electrode terminals of the signal lines) outside an image display area, exposing transparent conductive pixel electrodes and transparent conductive part of the scanning lines (or electrode terminals of the scanning lines, and electrode terminals of the signal lines) within each opening, V) Forming a pair of secondary semiconductor layers with impurities that comprise the source-drain of the insulating gate type transistor, on part of the said protective insulating layers and the primary semiconductor layers, VI) Forming 1) source (signal) wires consisting of 1 or more anode-oxidizable metal layers that include a heat-resistant metal layer on the gate insulating layer and the secondary semiconductor layers (and part of the electrode terminals for the signal lines), 2) drain wires also consisting of an anode-oxidizable metal layer on the gate insulating layer, the secondary semiconductor layers, and on part of the pixel electrodes within the said openings, 3) electrode terminals of the scanning lines consisting also of an anode-oxidizable metal layer on part of the scanning lines within the said openings (or transparent conductive electrode terminals of the signal lines), and 4) and electrode terminals of the signal lines comprising part of the said signal lines (or transparent conductive electrode terminals of the signal lines), and VII) Forming anode-oxidized layers on the source/drain wires except on the said electrode terminals.

With this composition, transparent conductive pixel electrodes are formed on the glass substrate for they are formed at the same time as scanning lines. Also the insulating gate type transistors are etch-stop type, protective insulating layers are formed on channels, and tantalum pentoxide (Ta2O5) or aluminum oxide (Al2O3), that is an insulating anode-oxidized layer, is formed on the surfaces of signal lines at least; as a result, a TN type liquid crystal display device is obtained that has added a passivation function. Therefore, the heat-resistance problem of the insulating gate type transistors is eliminated in the same way as the liquid crystal display device described in Claim 6. In addition, there is no need to deposit a thick amorphous silicon layer with no impurities composing the channel layer in the same way as the liquid crystal display devices described in Claim 5. Either a transparent conductive layer or a metal layer may be selected for electrode terminals, but a metal layer has fewer limitations against processing.

A liquid crystal display device in Claim 10, as described in Claim 2, which has at least the following characteristics in a liquid crystal display device that is filled with liquid crystal between 1) a primary transparent insulating substrate that aligns, in a 2-dimensional matrix on a principal plane, unit pixels that have at least a) insulating gate type transistors, b) scanning lines that also work as gate electrodes and signal lines that also work as source wires for the said insulated gate type transistors, c) pixel electrodes that are connected to drain wires and d) counter electrodes formed within a specific distance from the said pixel electrodes, and 2) a secondary transparent insulating substrate or a color filter that faces the said primary transparent insulating substrate:

I) Forming scanning lines and counter electrodes consisting of 1 or more primary metal layers on a principal plane of a transparent insulating substrate;

II) Forming island-like primary semiconductor layers with no impurities through 1 or more gate insulating layers above the gate electrodes;

III) Forming openings, which self align with the said island-like primary semiconductor layers, on the said scanning lines outside an image display area, exposing part of the scanning lines within the said openings;

IV) Forming a pair of secondary semiconductor layers with impurities that comprise the source-drains for the insulating gate type transistors on the said primary semiconductor layers, partly overlapping with the gate electrodes;

V) Forming 1) source wires (signal lines)/drain wires (pixel electrodes) consisting of 1 or more secondary metal layers which include a heat-resistant metal layer, on the said secondary semiconductor layers and the gate insulating layer and 2) electrode terminals of scanning lines consisting also of the secondary metal layer on the said openings, and 3) electrode terminals of signal lines composing part of the said signal lines, and VI) Forming a passivation insulating layer which has openings on the said electrode terminals of scanning lines and signal lines, on the said primary transparent insulating substrate.

For the metallic counter electrodes are formed at the same time as scanning lines by this composition, they are formed on the glass substrate. An IPS type liquid crystal display device is obtained which has no nonconformity relating to contact formation because a conventional insulating layer, SiNx, is formed on an active substrate and also because the film thickness of passivation insulating layers on the electrode terminals of scanning lines and signal lines becomes equal.

Likewise, the liquid crystal display device in Claim 11, using the insulating gate type transistor as described in Claim 1, is characterized by the following: I) Forming scanning lines and counter electrodes consisting of 1 or more primary metal layers on a principal plane of a transparent insulating substrate, II) Forming island-like primary semiconductor layers with no impurities through 1 or more gate insulating layers above the gate electrodes, III) Forming a pair of secondary semiconductor layers with impurities that compose the source-drains for the insulating gate type transistors on the said primary semiconductor layers, partly overlapping with gate electrodes, IV) Removing the gate insulating layer within the openings, which are formed on part of the scanning lines outside an image display area, V) Forming 1) source wires (signal lines)/drain wires (pixel electrodes) consisting of 1 or more anode-oxidizable metal layers, which include a heat-resistant metal layer on the said secondary semiconductor layers and the gate insulating layer and 2) electrode terminals of scanning lines consisting also of an anode-oxidizable metal layer on the said openings, and 3) electrode terminals of signal lines comprising part of the said signal lines, VI) Forming anode-oxidized layers on the surfaces of source/drain wires, except on the electrode terminals of the said signal lines, and VII) Forming oxidized silicon layers on the primary semiconductor layers between the said source/drain wires.

For the metallic counter electrodes are formed at the same time as scanning lines by this composition, they are formed on the glass substrate. In the same way as the liquid crystal display devices described in Claim 6, silicon oxide layers with impurities are formed on the channels between the source-drains, protecting the channels and forming tantalum pentoxide (Ta2O5) or aluminum oxide (Al2O3) that is an insulating anode-oxidized layer on the surface of signal lines and drain wires, adding a passivation function to it. Therefore, there is no need to deposit a passivation insulating layer on the glass substrate, and problems relating to the heat resistance of insulating gate type transistors are eliminated. This way, an IPS type liquid crystal display device is obtained, which does not require a thick amorphous silicon layer with no impurities composing a channel layer to be deposited, as with the liquid crystal display device described in Claim 5.

Likewise, the liquid crystal display device in Claim 12, as described in Claim 2, has at least the following: I) Forming scanning lines and counter electrodes consisting of 1 or more primary metal layers on a principal plane of a transparent insulating substrate, II) Forming island-like primary semiconductor layers with no impurities through 1 or more gate insulating layers above the gate electrodes, III) Forming a pair of secondary semiconductor layers with impurities that comprise the source-drains for the insulating gate type transistors, partly overlapping with gate electrodes on the said primary semiconductor layers, IV) Forming openings, which self align with the said island-like primary semiconductor layers, on the said scanning lines outside an image display area, exposing part of the scanning lines within the said openings, V) Forming 1) source wires (signal lines)/drain wires (pixel electrodes) consisting of 1 or more anode-oxidizable metal layers, which include a heat-resistant metal layer on the said secondary semiconductor layers and the gate insulating layer and 2) electrode terminals of scanning lines consisting also of an anode-oxidizable metal layer on the said openings, and 3) electrode terminals of signal lines comprising part of the said signal lines, VI) Forming anode-oxidized layers on the surfaces of source/drain wires, except on the electrode terminals of the said signal lines, and VII) Forming silicon oxide layers on the primary semiconductor layers between the said source/drain wires.

With this structure, the IPS type liquid crystal display device which is equivalent to the liquid crystal display device described in Claim 11, except for the fact that there is self alignment between semiconductor layers and the openings which are formed in the gate insulating layer for electrically connecting to the scanning lines, may be obtained.

A manufacturing method for a liquid crystal display device in Claim 13, as described in Claim 2, has at least the following characteristics, for its active substrate: I) The process for forming scanning lines, II) The process for depositing 1) a gate insulating layer and 2) a semiconductor layer, III) The process for forming photosensitive resin patterns 1) that have openings at the scanning lines outside an image display area and 2) the thickness of which at the semiconductor layer-forming area above the gate electrodes is thicker than in other areas, IV) The process for 1) removing at least the gate insulating layer within the said openings and 2) exposing part of the scanning lines, using the said photosensitive resin patterns as masks, V) The process for reducing the thickness of the said photosensitive resin patterns and exposing the said semiconductor layer, VI) The process for forming island-like semiconductor layers which are wider than the gate electrodes above the gate electrodes, using the said reduced photosensitive resin patterns as masks, and VII) The process for forming source/drain wires.

With this structure, reduction of the number of photo etching processes is achieved: processes that treat the forming process of island-like semiconductor layers and the forming process of openings in the gate insulating layer with halftone exposure technology, using a single photomask.

A manufacturing method for a liquid crystal display device in Claim 14, using the insulating gate type transistor as described in Claim 1, has at least the following characteristics in a liquid crystal display; I) The insulating gate transistor is the channel etching type, and II) The process for anode-oxidizing source/drain wires and the channels of the said insulating gate type transistors except for the electrode terminal areas of signal lines, at the time of forming source/drain wires consisting of an anode-oxidizable metal.

With this structure, insulating silicon oxides are formed on the channels consisting of an amorphous silicon or a poly silicon as well as insulating anode-oxidized layers are formed on the source-drain wires. It is needless to form an insulating passivation layer on an active substrate.

Claim 15 is the manufacturing methods of the liquid crystal display device, as described in Claim 3, which is characterized by the following: I) The process for forming scanning lines and pseudo pixel electrodes both consisting of a laminate of a transparent conductive layer and a primary metal layer on a principal plane of the primary transparent insulating substrate, II) The process for treating the island-forming process of semiconductor layers and the openings-forming process in the gate insulating layer, using 1 photomask by halftone exposure technology, III) The process for forming source/drain wires, and IV) The process for forming a passivation insulating layer that has openings on the pixel electrodes and on the electrode terminals of the scanning lines and the signal lines.

With this composition, the following is achieved: 1) the number of photo etching processes, which treat pixel electrodes and scanning lines with 1 photomask, is reduced, and 2) the number of photo etching processes, which treat island-forming process of semiconductor layers and openings-forming process at the gate insulating layer, using 1 photomask is also reduced. This enables the production of TN-type liquid crystal display devices with 4 photomasks, and transparent conductive pixel electrodes are obtained by removing the primary metal layers during the openings-forming process at the gate insulating layer.

Claim 16 is the manufacturing methods of the liquid crystal display devices, as described in Claim 4, which are characterized by the following: I) The process for forming scanning lines, pseudo electrode terminals for scanning lines and signal lines, and pseudo pixel electrodes, all consisting of a laminate of a transparent conductive layer and a primary metal layer, II) The process for treating the island-forming process of semiconductor layers and the openings-forming process in the gate insulating layer, using 1 photomask by halftone exposure technology, III) The process for forming source-drain wires, IV) The process to form openings on the pseudo pixel electrodes and on electrode terminals for scanning lines and signal lines after depositing a passivation insulating layer, and V) The process for removing the passivation insulating layer and the primary metal layer in the openings.

This composition is quite similar to the manufacturing methods of liquid crystal display devices described in Claim 3, also enabling the production of a TN-type liquid crystal display device with 4 photomasks. However, the difference from the liquid crystal display device manufacturing methods described in Claim 3 is that transparent conductive pixel electrodes are obtained by removing the primary metal layer during the opening-forming process in the passivation insulating layer.

Claim 17 is the manufacturing methods of the liquid crystal display devices as described in Claim 5, and is characterized by the following: I) The process for forming scanning lines, II) The process for treating the island-forming process of semiconductor layers and the openings-forming process in the gate insulating layer, using 1 photomask by halftone exposure technology, III) The process for forming source/drain wires that consist of an anode-oxidizable metal layer, IV) The process for forming transparent conductive pixel electrodes and transparent conductive electrode terminals for scanning lines and signal lines, using photosensitive resin patterns, and V) The process for anode oxidizing the source-drain wires and amorphous silicon layers between the source-drain wires using the said photosensitive resin patterns as masks.

This composition makes it possible to reduce the number of photo etching processes that treat island-forming process of the semiconductor layers and openings-forming process in the gate insulating layer, using 1 photomask. Furthermore, also due to the reduction of number of photo etching processes that treat the formation of pixel electrodes and the formation of the insulating layer for passivation, using 1 photomask, a TN-type liquid crystal display device can be produced using 4 photomasks.

Claim 18 is the manufacturing methods of the liquid crystal display devices as described in Claim 6, which are characterized by the following: I) The process for forming scanning lines, pseudo electrode terminals for scanning lines and signal lines, and pseudo pixel electrodes, all consisting of a laminate of a transparent conductive layer and a primary metal layer, II) The process for treating the island-forming process of semiconductor layers and the openings-forming process in the gate insulating layer, using 1 photomask by halftone exposure technology, and III) The process for forming source-drain wires that consist of an anode-oxidizable metal layer and have anode-oxidized layers on their surfaces.

With this composition, the number of processes to treat the scanning lines and pixel electrodes using 1 photomask and the number of photo etching processes to treat island-forming process of semiconductor layers and openings-forming process in the gate insulating layer using 1 photomask are reduced. In addition, a TN-type liquid crystal display device can be produced with 3 photomasks by selectively forming anode-oxidized layers on the source-drain wires at the time of source-drain wires formation, also helped by the reduced number of manufacturing processes that do not require a passivation insulating layer.

Claim 19 is the manufacturing methods of the liquid crystal display devices as described in Claim 7, which are characterized by the following: I) The process for forming scanning lines, pseudo electrode terminals for scanning lines and signal lines, and pseudo pixel electrodes, all consisting of a laminate of a transparent conductive layer and a primary metal layer, II) The process for forming protective insulating layers, III) The process for treating the island-forming process of semiconductor layers and the openings-forming process in the gate insulating layer, using 1 photomask by halftone exposure technology, and IV) The process for forming source-drain wires that have photosensitive organic insulating layers on their surfaces.

With this composition, the number of photo etching processes that treat the forming process of scanning lines and forming process of pixel electrodes, using 1 photomask, is reduced. This way, a TN-type liquid crystal display device with transparent conductive electrodes can be produced, using 4 photomasks, due to the reduced number of photo etching processes that treat island-forming process of semiconductor layers and openings-forming process in the gate insulating layer, using 1 photomask, and also due to the reduced number of manufacture processes that do not require the formation of a passivation insulating layer by leaving, as they are, the photosensitive organic insulating layers which have been used in the formation of source-drain wires.

Claim 20 is the manufacturing methods of the liquid crystal display devices as described in Claim 8, which are characterized by the following; I) The process for forming scanning lines, (pseudo electrode terminals for the scanning lines and the signal lines), and pseudo pixel electrodes, consisting of a laminate of a transparent conductive layer and a primary metal layer, II) The process for forming protective insulating layers, III) The process for treating the island-forming process of semiconductor layers and the openings-forming process in the gate insulating layer, using 1 photomask by halftone exposure technology, and IV) The process for forming source-drain wires, leaving photosensitive organic insulating layers only on the signal lines with the help of halftone exposure technology.

With this composition, the number of photo etching processes that treat the forming process of scanning lines and the forming process of pixel electrodes, using 1 photomask, is reduced. This way, a TN-type liquid crystal display device can be produced, using 4 photomasks, due to the reduced number of photo etching processes that treat island-forming process of semiconductor layers and openings-forming process in the gate insulating layer, using 1 photomask, and also due to the reduced number of manufacturing processes that do not require the formation of a passivation insulating layer by selectively leaving the photosensitive organic insulating layers only on signal lines, using halftone exposure technology in the formation of source-drain wires.

Claim 21 is the manufacturing methods of the liquid crystal display devices as described in Claim 9, which are characterized by the following: I) The process for forming scanning lines (pseudo electrode terminals for the scanning lines and the signal lines), and pseudo pixel electrodes, consisting of a lamination of a transparent conductive layer and a primary metal layer, II) The process for forming protective insulating layers, III) The process for treating the island-forming process of semiconductor layers and the openings-forming process in the gate insulating layer, using 1 photomask by halftone exposure technology, and IV) The process for forming source/drain wires that consist of an anode-oxidizable metal layer and have anode-oxidized layers on their surfaces.

With this composition, the number of photo etching processes that treat the forming process of scanning lines and the forming process of pixel electrodes, using 1 photomask, is reduced. This way, a TN-type liquid crystal display device can be produced, using 4 photomasks, due to the reduced number of photo etching processes that treat the island-forming process of semiconductor layers and the openings-forming process in the gate insulating layer, using 1 photomask, and also due to the reduced number of manufacturing processes that do not require the formation of a passivation insulating layer by selectively forming the anode-oxidized layers on source-drain wires in the formation of source-drain wires.

Claim 22 is the manufacturing methods of the liquid crystal display devices as described in Claim 10 and are characterized by the following: I) The process for forming scanning lines and counter electrodes, II) The process for treating the island-forming process of semiconductor layers and the openings-forming process in the gate insulating layer, using 1 photomask by halftone exposure technology, III) The process for forming the source wire (signal lines) and drain wire (pixel electrodes), and IV) The process for forming a passivation insulating layer that has openings on the electrode terminals for the scanning lines and the signal lines.

With this composition, the island-forming process of semiconductor layers and the openings-forming process in the gate insulating layer are treated using 1 photomask, the number of photo etching processes is reduced, and the production of IPS-type liquid crystal display devices can be achieved using 4 photomasks. Furthermore, compared to the conventional streamlined 4-mask process, this has fewer modifications and is easier to introduce in mass production.

Claim 23 is the manufacturing methods of the liquid crystal display devices as described in Claim 11 and are characterized by the following: I) The process for forming scanning lines and counter electrodes, II) The process for forming island-like semiconductor layers, III) The process for forming openings in the gate insulating layer, and IV) The process for forming source-drain wires that consist of an anode-oxidizable metal layer, and forming the source wires (signal lines) and drain wires (pixel electrodes) which have anode-oxidized layers on their surfaces.

With this composition, an IPS-type liquid crystal display device can be produced with 4 photomasks by selectively forming anode-oxidized layers on the source-drain wires and on the channel surface between the source-drain wires after the formation of the source wires (signal lines) and the drain wires (pixel electrodes) is completed, helped by the reduced number of manufacture processes that do not require the formation of a passivation insulating layer.

Claim 24 is the manufacturing methods of the liquid crystal display devices as described in Claim 12 and are characterized by the following: I) The process for forming scanning lines and counter electrodes, II) The process for treating the island-forming process of semiconductor layers and openings-forming process in the gate insulating layer, using 1 photomask by halftone exposure technology, and III) The process for forming source wires (signal lines) and drain wires (pixel electrodes) that comprise an anode-oxidizable metal layer and have anode-oxidized layers on their surfaces.

With this composition, the island-forming process of semiconductor layers and the openings-forming process in the gate insulating layer is treated using 1 photomask, the number of photo etching processes is reduced, and an IPS-type liquid crystal display device can be produced with 3 photomasks by selectively forming anode-oxidized layers on the source-drain wires and on the channel surface between the source-drain wires after the formation of the source wires (signal lines) and the drain wires (pixel electrodes) is completed, helped by the reduced number of manufacturing processes that do not require the formation of a passivation insulating layer.

As described above, part of the liquid crystal display devices described in this invention 1) use channel-etching type insulating gate transistors, and 2) anode-oxidize the source-drain wires consisting of anode-oxidizable source-drain wire materials and the channel surface of gate type transistors at the same time, forming aluminum oxide or tantalum oxide and silicon oxide layers as protective layers, respectively; as a result, this does not require a special heating process or excessive heat resistance for insulating gate type transistors that have an amorphous silicon layer as a semiconductor layer. In other words, this helps not to cause the deterioration of electrical performance by passivation formation. Furthermore, it is now possible to selectively protect above the electrode terminals for the scanning lines and the signal lines by using halftone exposure technology when anode-oxidizing the source-drain wires and the channel surface, enabling to stop the number of photo etching processes from increasing.

As the insulating isolation of a pair of amorphous silicon layers with impurities comprising source and drain for insulating gate-type transistors is detached in an electrochemical way to decompose the amorphous silicon layer including impurities using anode oxidization, the damage of a channel semiconductor layer received during etching does not deteriorate electric properties of insulating gate type transistors, and an amorphous silicon layer including no impurities can be reduced to the most appropriate film thickness; the operation rate of a PCVD equipment and a particle generation are also significantly improved.

Likewise, as the other liquid crystal display devices described in this invention use etch-stop type insulating gate transistors that have protective insulating layers on the channels, a passivation function may be added by selectively forming photosensitive organic insulating layers only on the source-drain wires, except on the electrode terminals locating outside the image display area or only on signal lines or by anode-oxidizing the source-drain wires comprising anode-oxidizable source/drain wire materials. Likewise, excessive heat resistance is not required. Furthermore, by using halftone exposure technology during anode-oxidization of source-drain wires, the surfaces of electrode terminals for scanning lines and signal lines can be selectively protected, preventing the number of photo etching processes from increasing.

In addition, by setting as cores 1) the streamlining technology that enables the simultaneous formation of pixel electrodes and scanning lines, using the same photomasks, helped by the introduction of pseudo pixel electrodes, and 2) the process-reducing technology that enables the treatment of the island-forming process of semiconductor layer s and the opening s-forming process in the gate insulating layer, using the same photomask, various active substrates and their manufacturing methods are suggested based on this composition. As a result, liquid crystal display devices are now manufactured, using 4 or 3 photomasks, reducing the number of photo etching processes, which is 5 times conventionally; this is a significant feature from the standpoint of cost reduction for liquid crystal display devices. It should be also noted that yield and quality are not largely affected, as the pattern accuracy of these processes is not very high, making it easy to execute production management.

In addition, as the electrical fields generated between counter electrodes and pixel electrodes in the IPS type liquid crystal display devises, as shown in Embodiments 9 and 10, are applied to a gate insulating layer and an anode-oxidized layer, as the conventional inferior passivation insulating layer does not exist. It also has the benefit of not causing the image sticking of display images easily; the anode-oxidized layer of the drain wires (pixel electrodes) work as high resistances layer rather than insulating layers, resulting in no accumulation of electric charges.

What makes this invention significant, as it is clear from the descriptions above, during the formation of scanning lines and pixel electrodes is as follows; 1) the process of a) forming photosensitive resin patterns whose film at the semiconductor layer-forming areas above the gate electrodes are thicker than in other areas, having openings above the pseudo pixel electrodes consisting of a laminate of a transparent conductive layer and a metal thin film layer, and b) exposing pixel electrodes within the openings using the said photosensitive resin patterns as masks, and 2) the process of a) exposing the semiconductor layer by reducing the film thicknesses of the said photosensitive resin patterns and b) selectively forming semiconductor layers above gate electrodes using the photosensitive resin patterns with reduced film thickness as masks; thus leading the formation of semiconductor layers and openings (contacts) in the gate insulating layer using 1 photomask. As for other compositions, it is self explanatory that liquid crystal display devices with different materials and film thickness in scanning lines, signal lines, pixel electrodes, gate insulating layers, etc. or the differences in their manufacturing methods are also part of this invention. This invention is also useful in reflective and vertical aligned liquid crystal display devices, and it is also clear that the semiconductor layers of insulating gate type transistors are not limited to amorphous silicon.

BRIEF DESCRIPTION OF THE DRAWINGS

The objects and advantages of the present invention will be apparent from the following detailed description of the preferred embodiments of the invention with references to the following drawings.

DETAILED DESCRIPTION OF THE EMBODIMENT(S)

Figure 1:
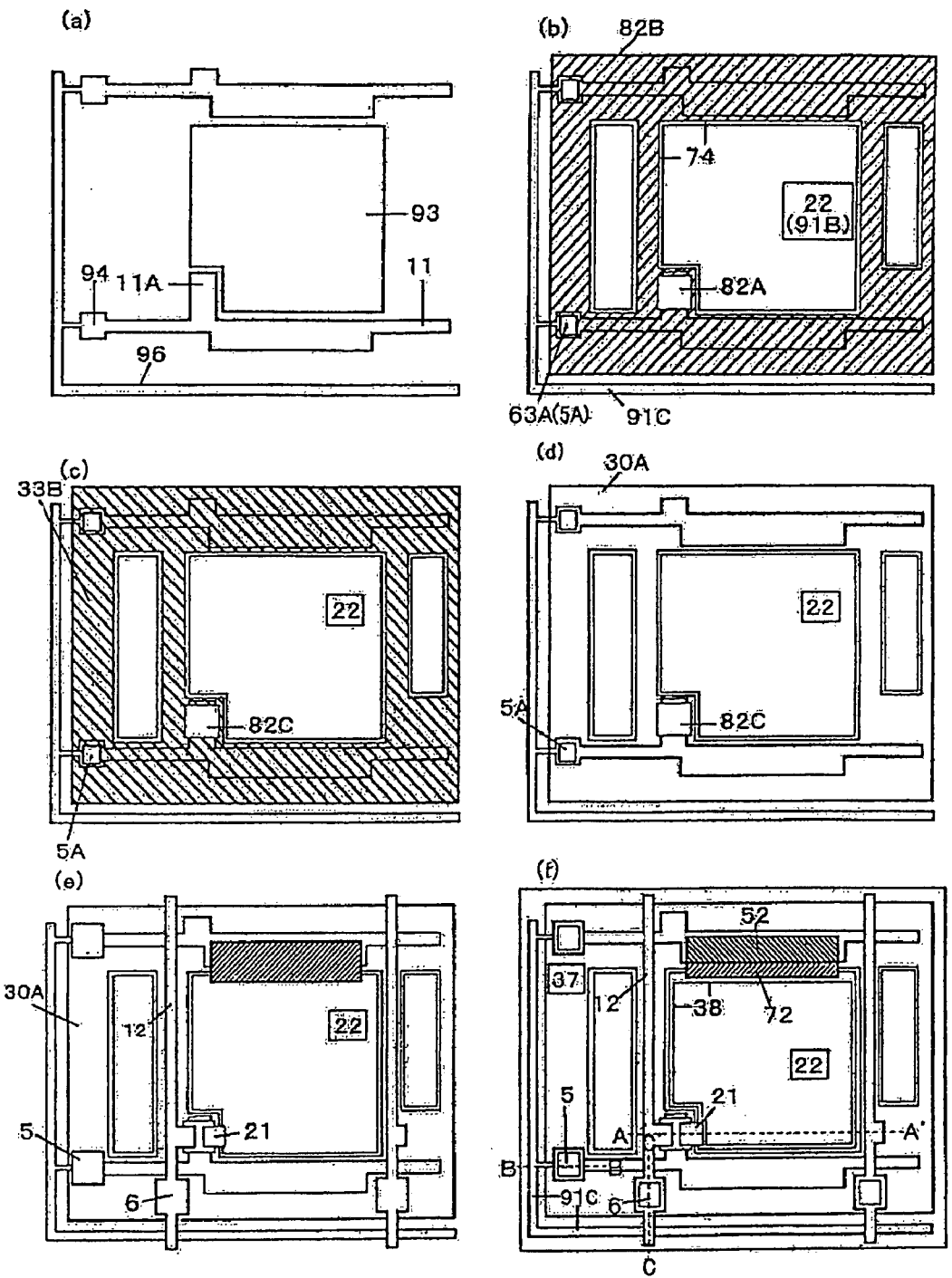
FIG. 1 shows the Plan View of Active Substrate Related to Embodiment 1 of This Invention.
Figure 2:
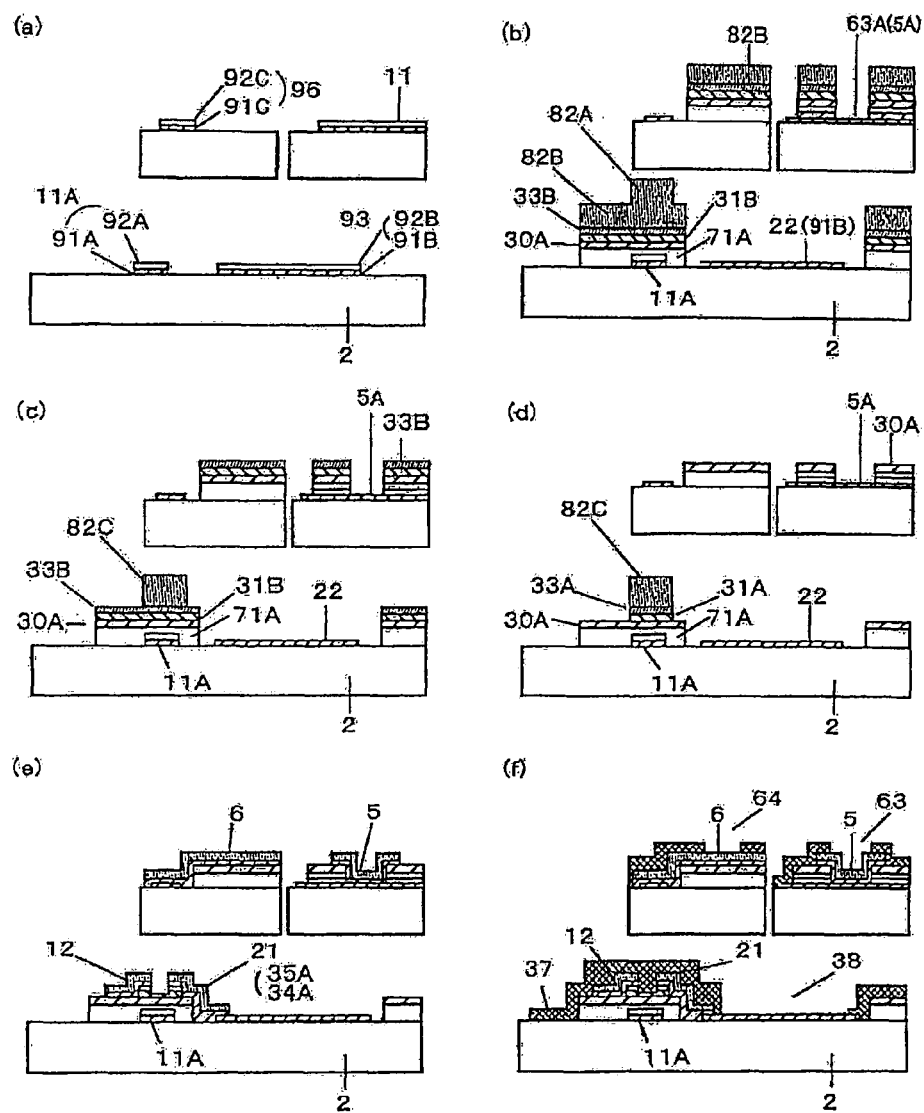
FIG. 2 shows the Manufacture Cross Section of Active Substrate Related to Embodiment 1 of This Invention.
Figure 3:
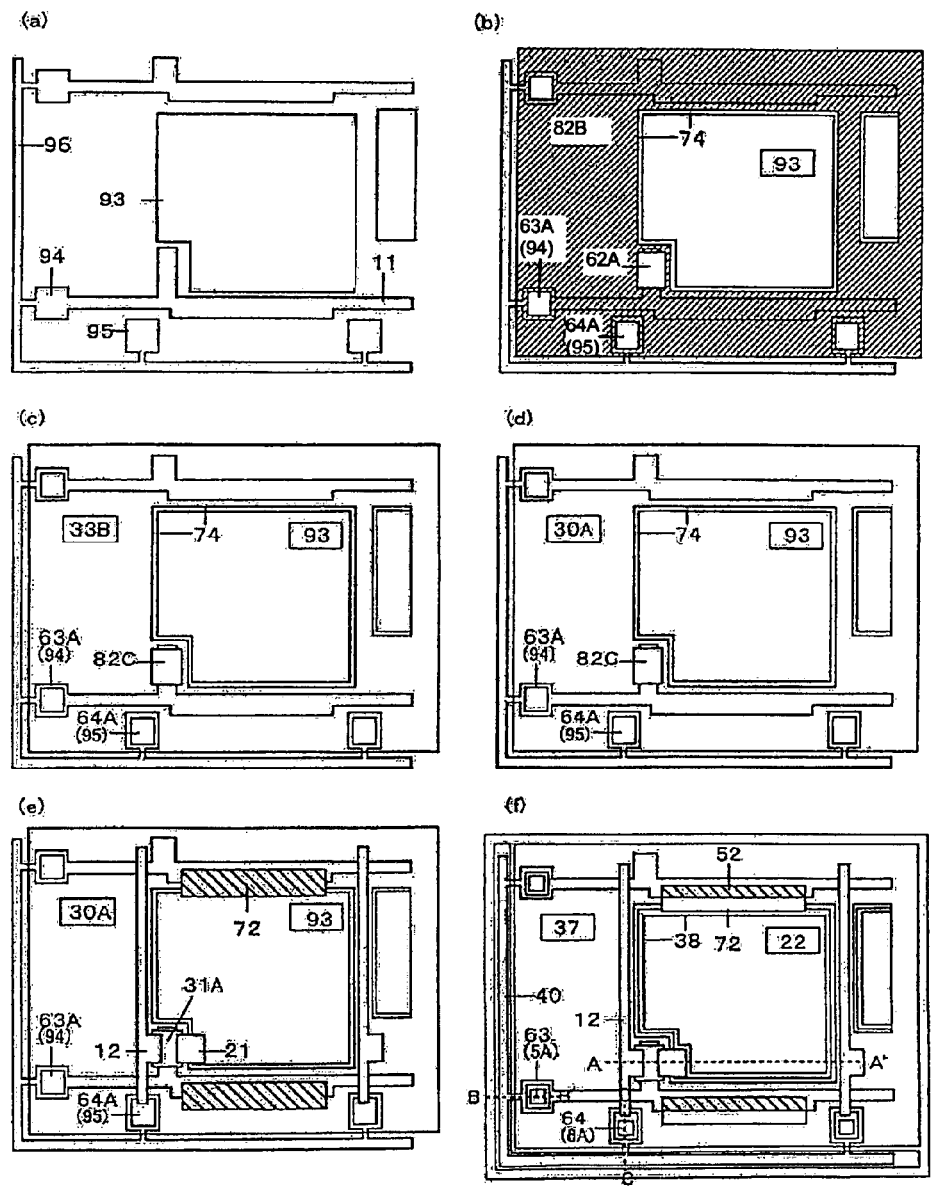
FIG. 3 shows the Plan View of Active Substrate Related to Embodiment 2 of This Invention.
Figure 4:
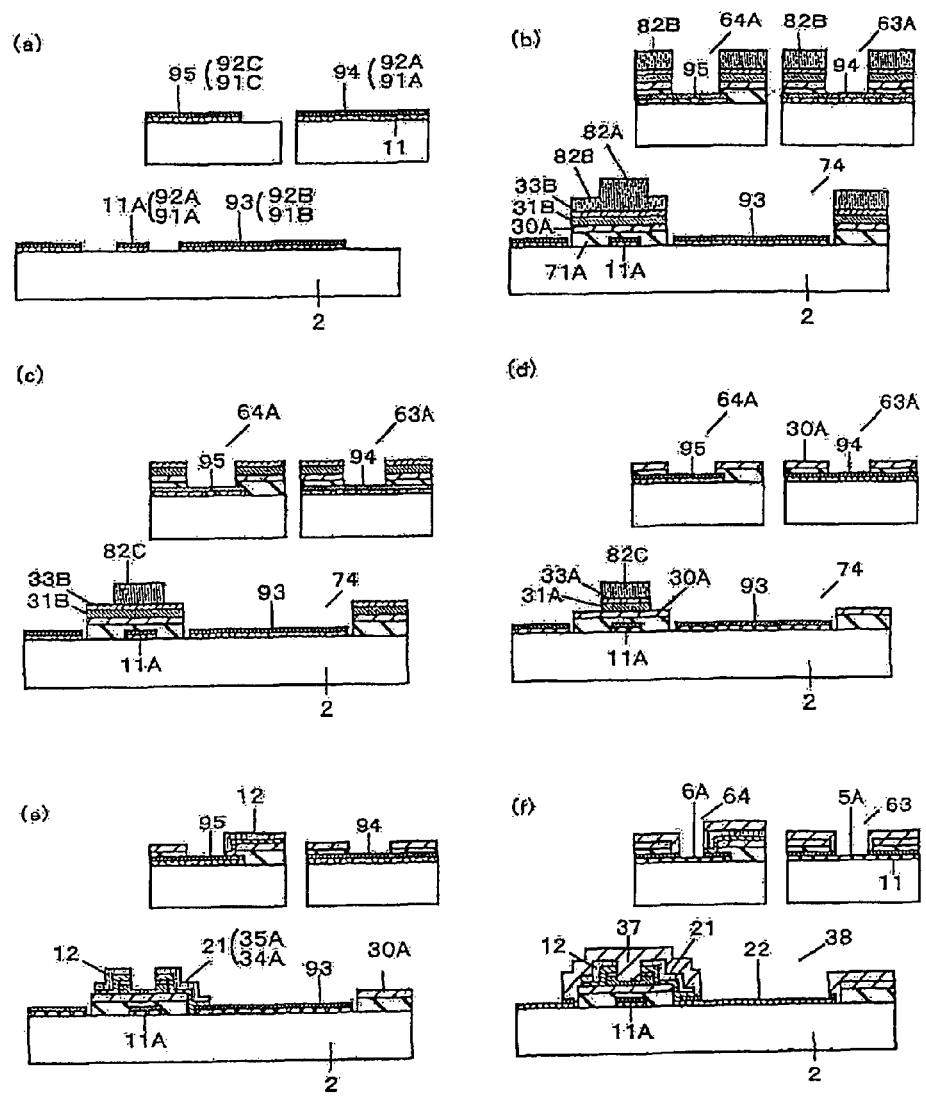
FIG. 4 shows the Manufacture Cross Section of Active Substrate Related to Embodiment 2 of This Invention.
Figure 8:
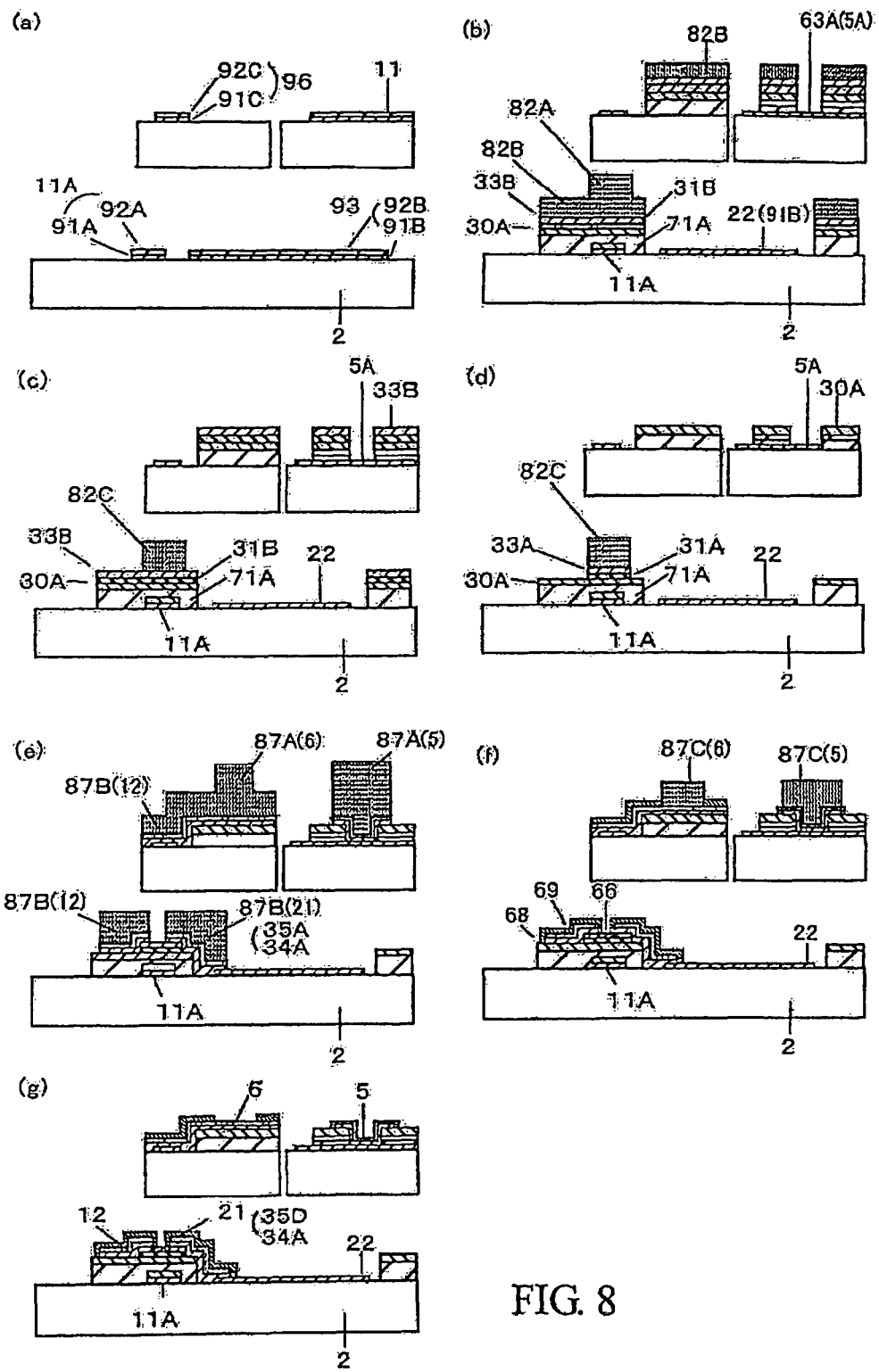
FIG. 8 shows the Manufacture Cross Section of Active Substrate Related to Embodiment 4 of This Invention.
Figure 9:
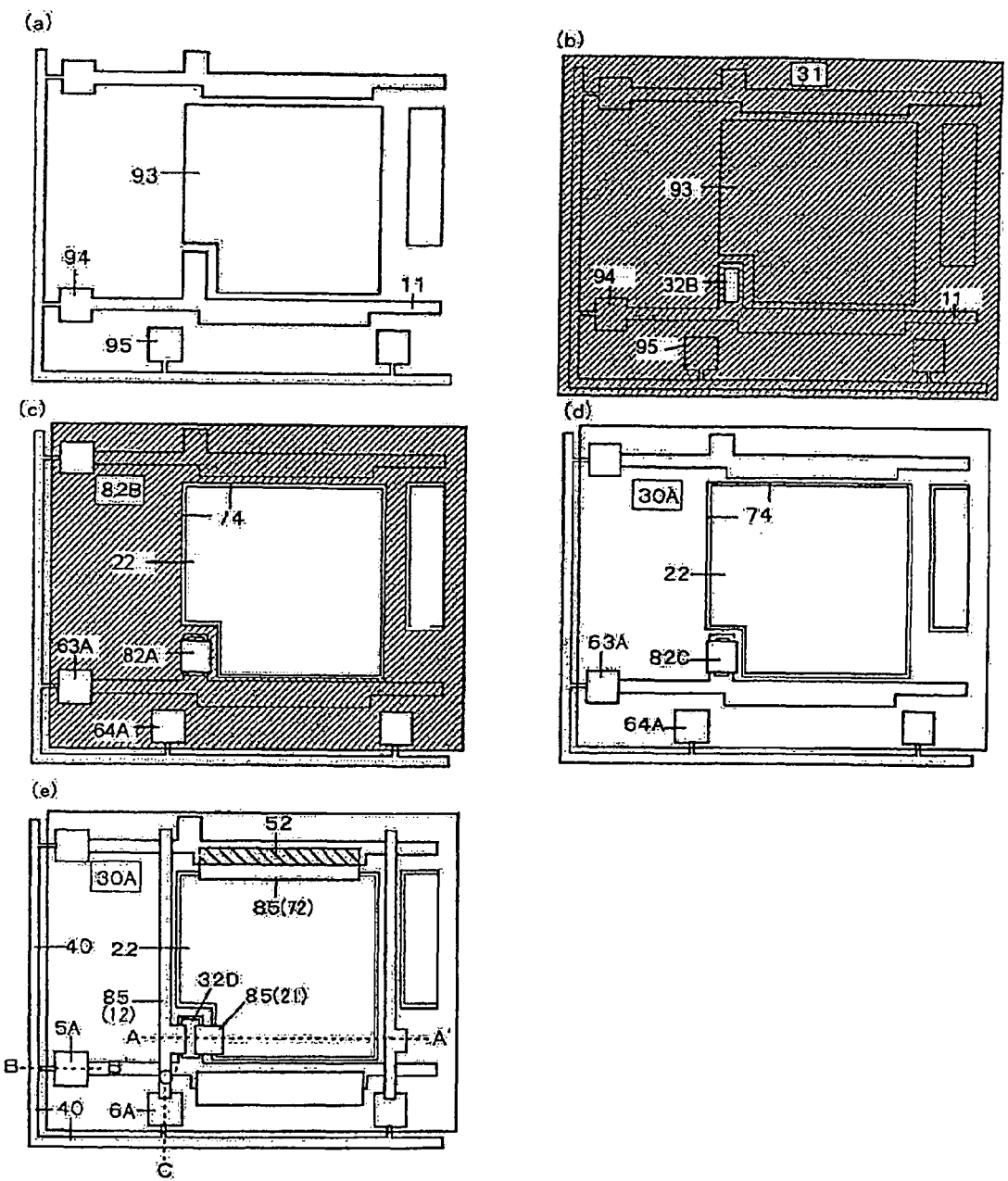
FIG. 9 shows the Plan View of Active Substrate Related to Embodiment 5 of This Invention.
Figure 10:
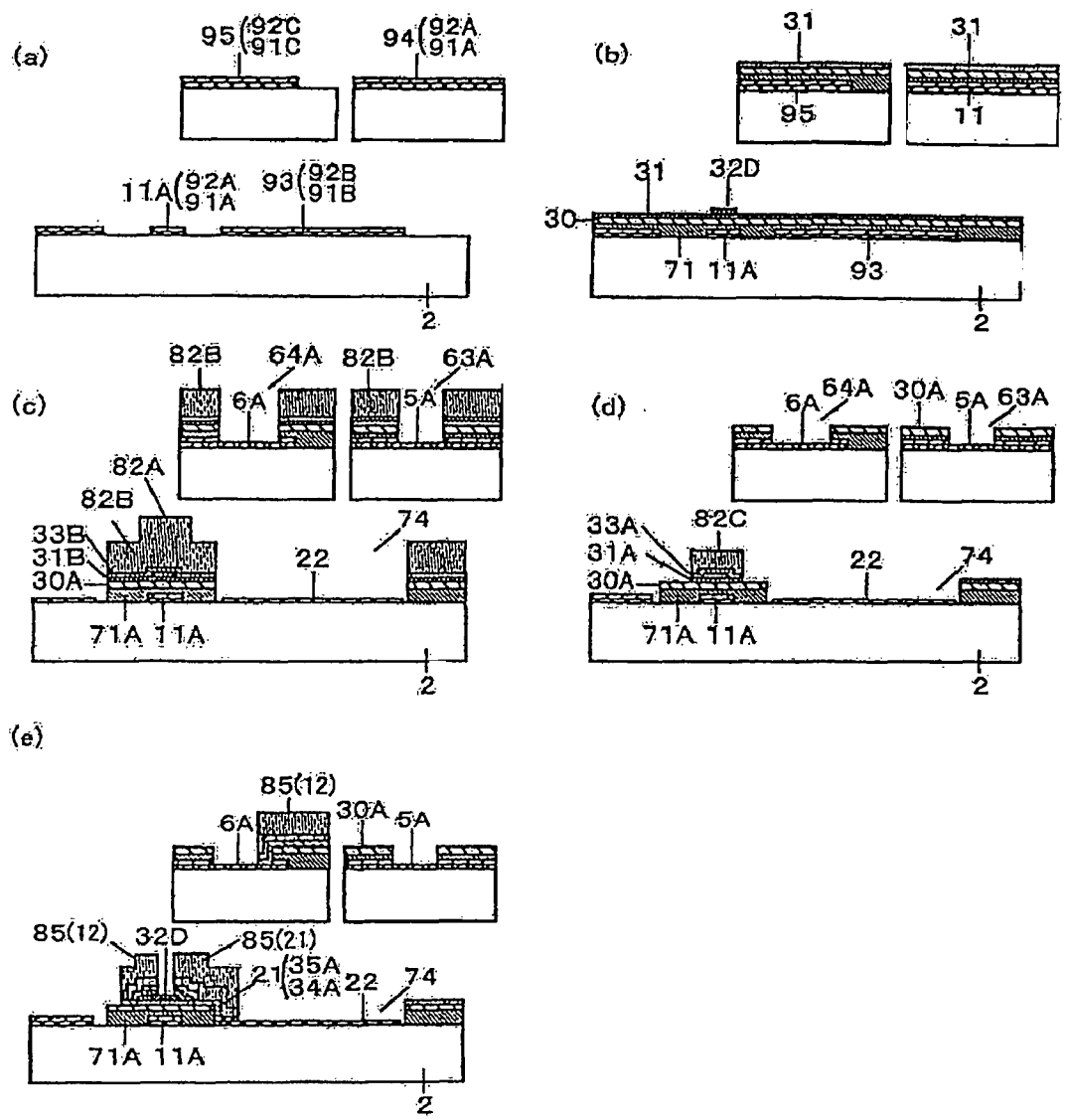
FIG. 10 shows the Manufacture Cross Section of Active Substrate Related to Embodiment 5 of This Invention.
Figure 11:
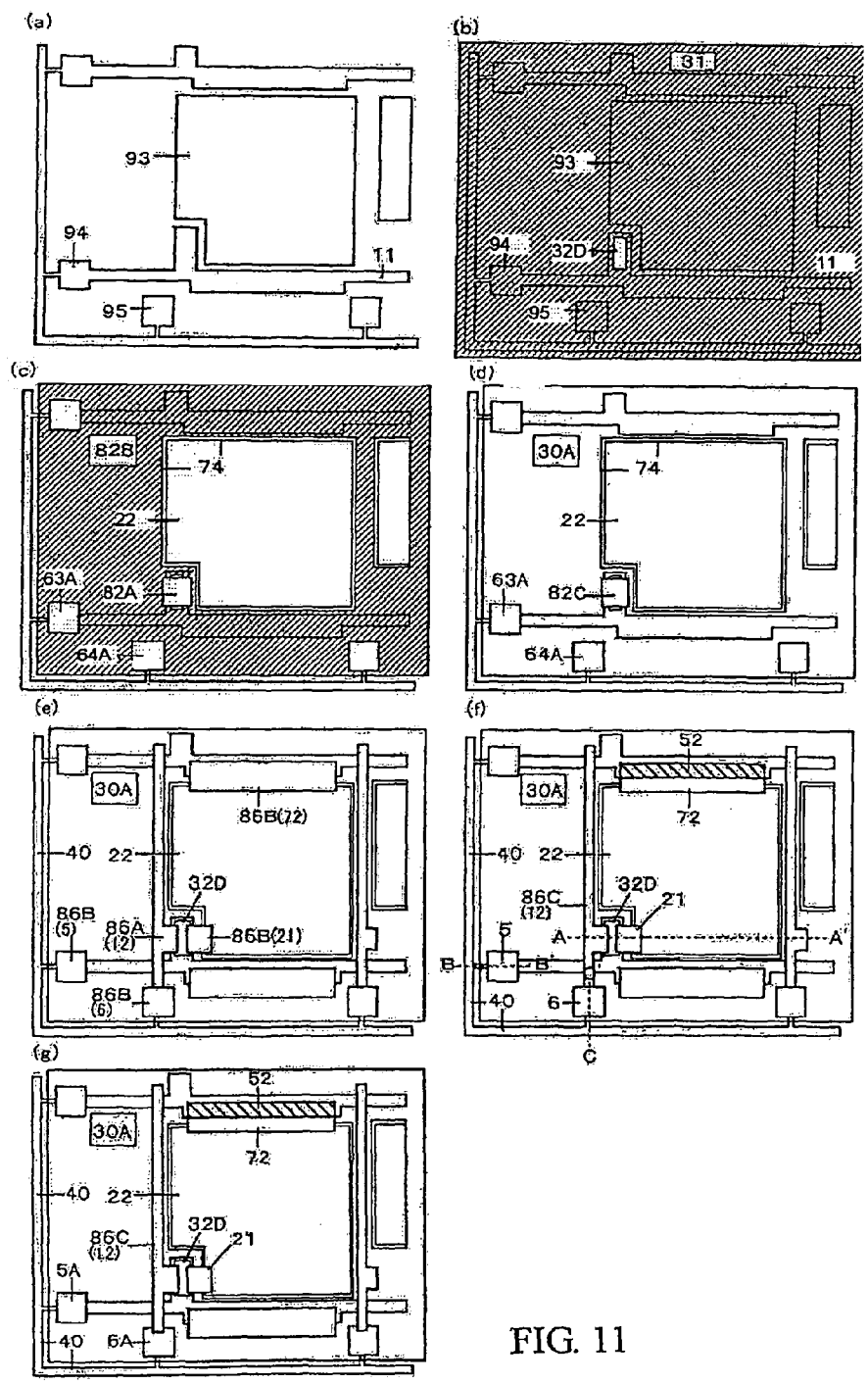
FIG. 11 shows the Plan View of Active Substrate Related to Embodiment 6 of This Invention.
Figure 12:
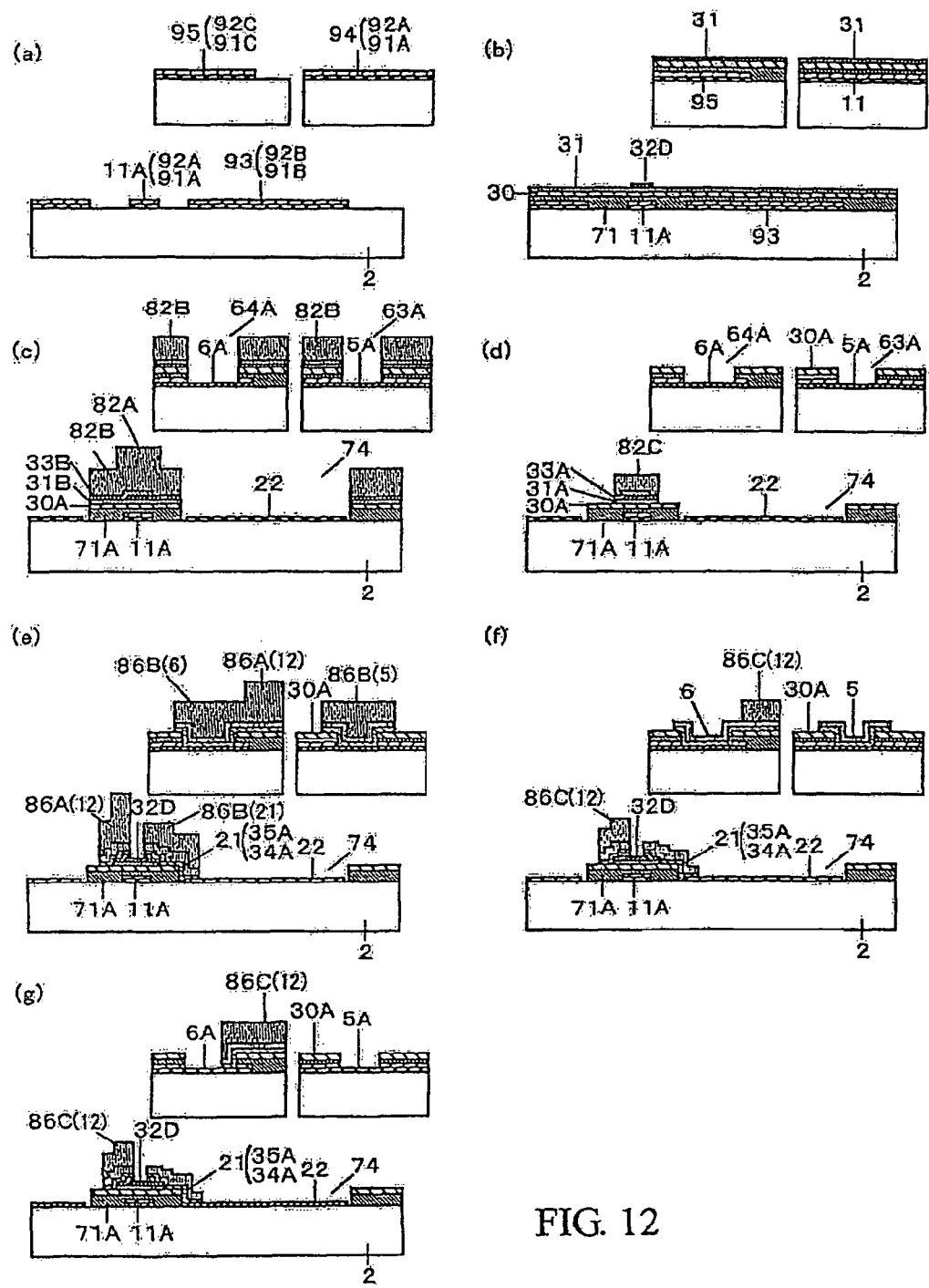
FIG. 12 shows the Manufacture Cross Section of Active Substrate Related to Embodiment 6 of This Invention.
Figure 13:
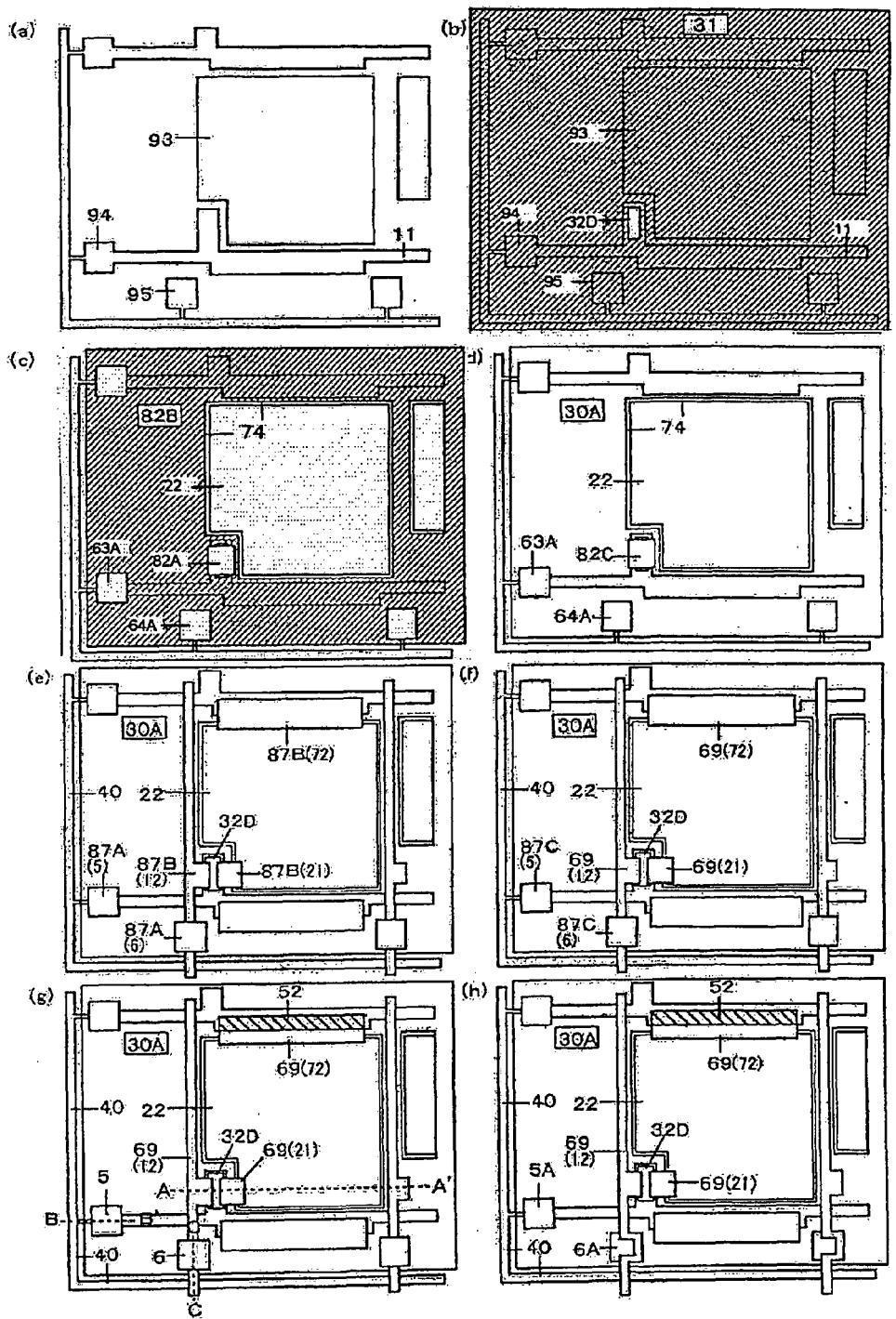
FIG. 13 shows the Plan View of Active Substrate Related to Embodiment 7 of This Invention.
Figure 14:
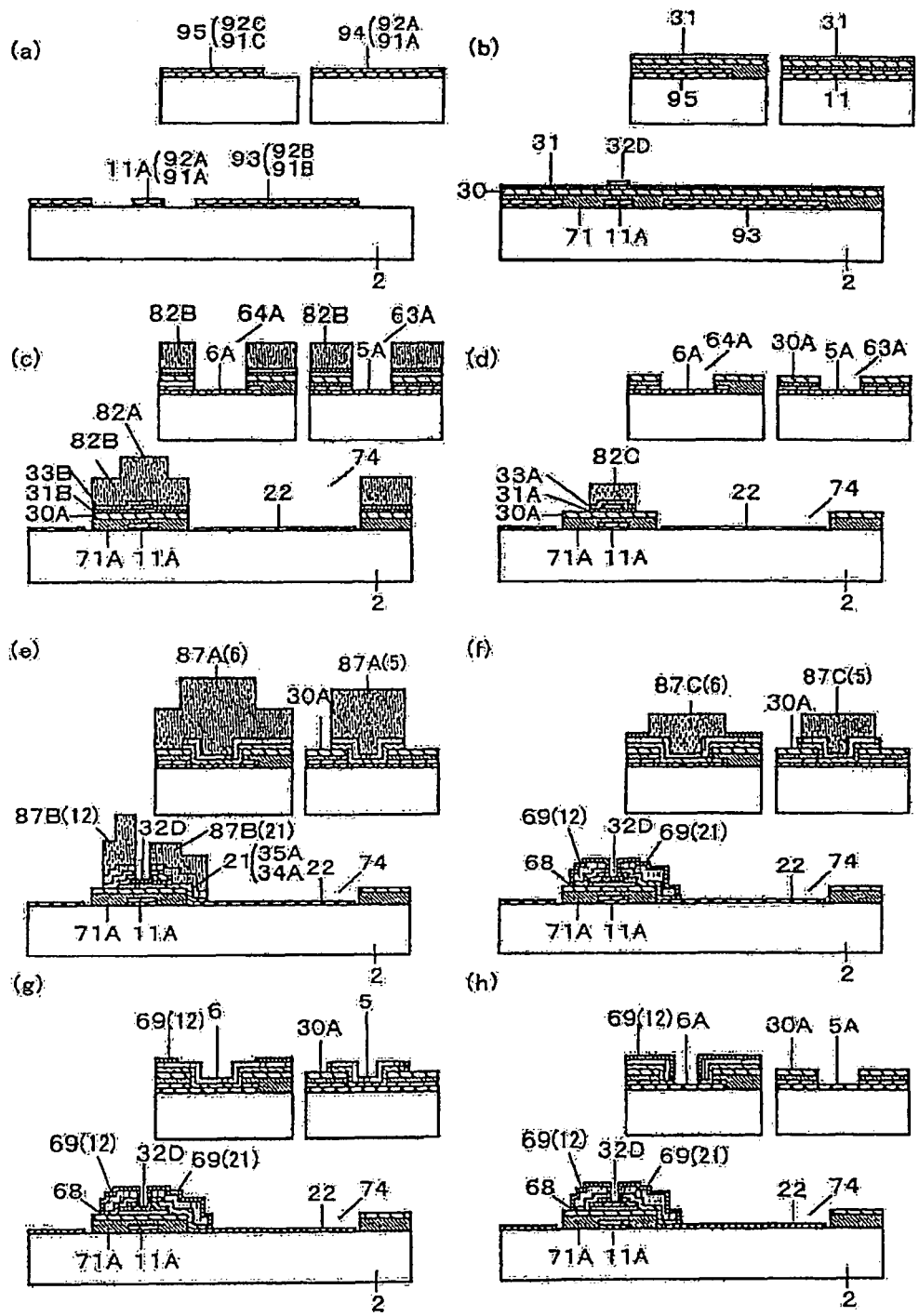
FIG. 14 shows the Manufacture Cross Section of Active Substrate Related to Embodiment 7 of This Invention.
Figure 15:
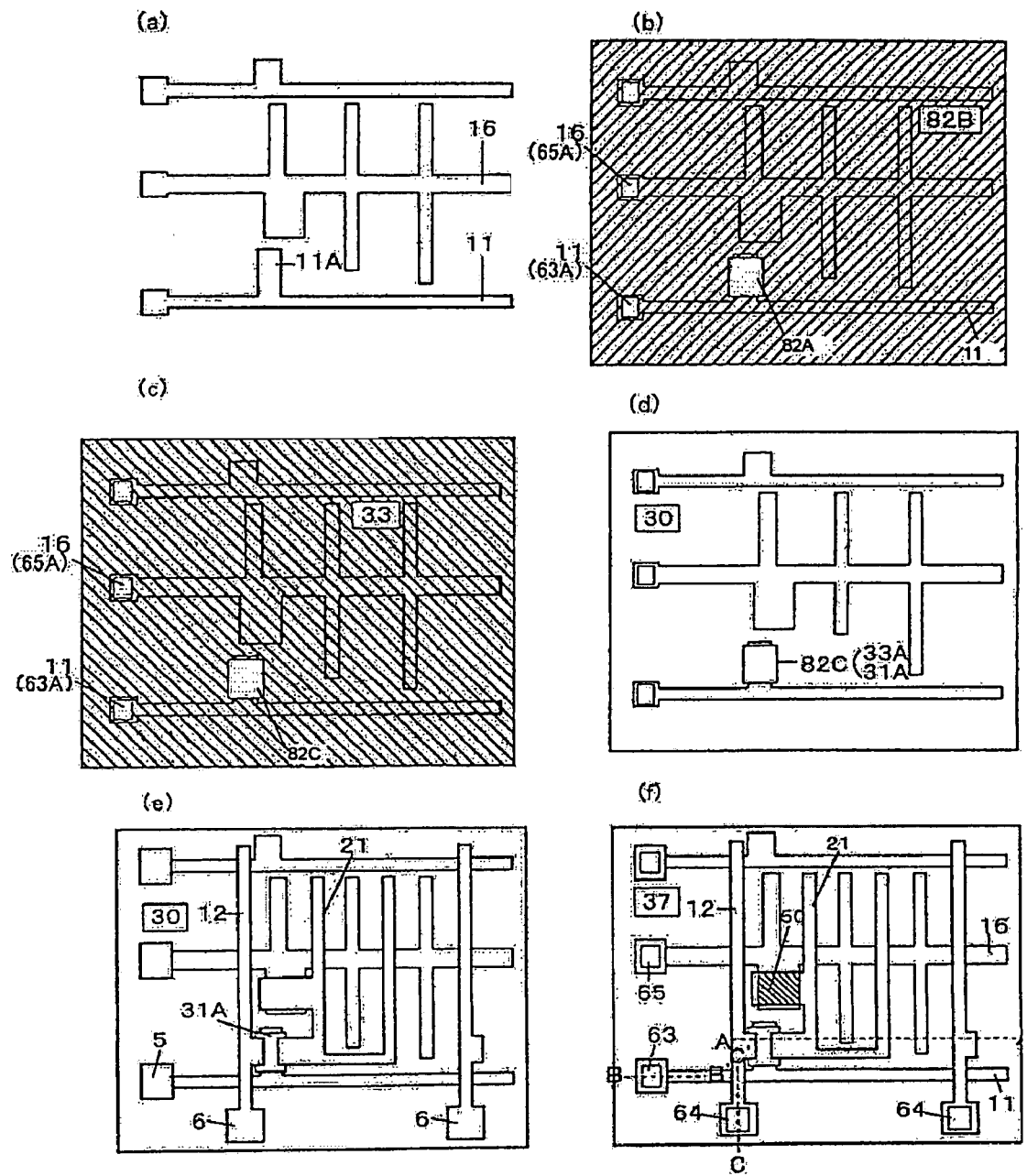
FIG. 15 shows the Plan View of Active Substrate Related to Embodiment 8 of This Invention.
Figure 16:
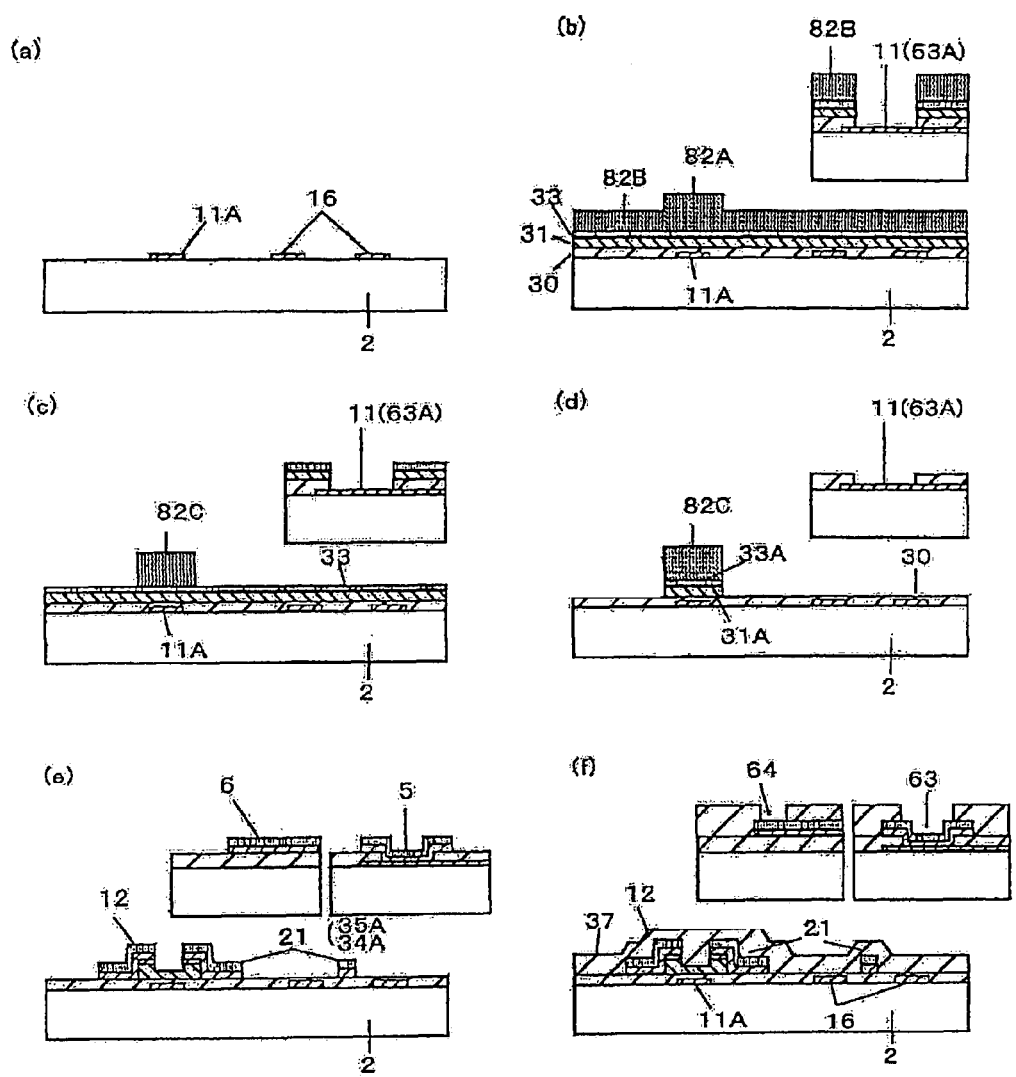
FIG. 16 shows the Manufacture Cross Section of Active Substrate Related to Embodiment 8 of This Invention.
Figure 17:
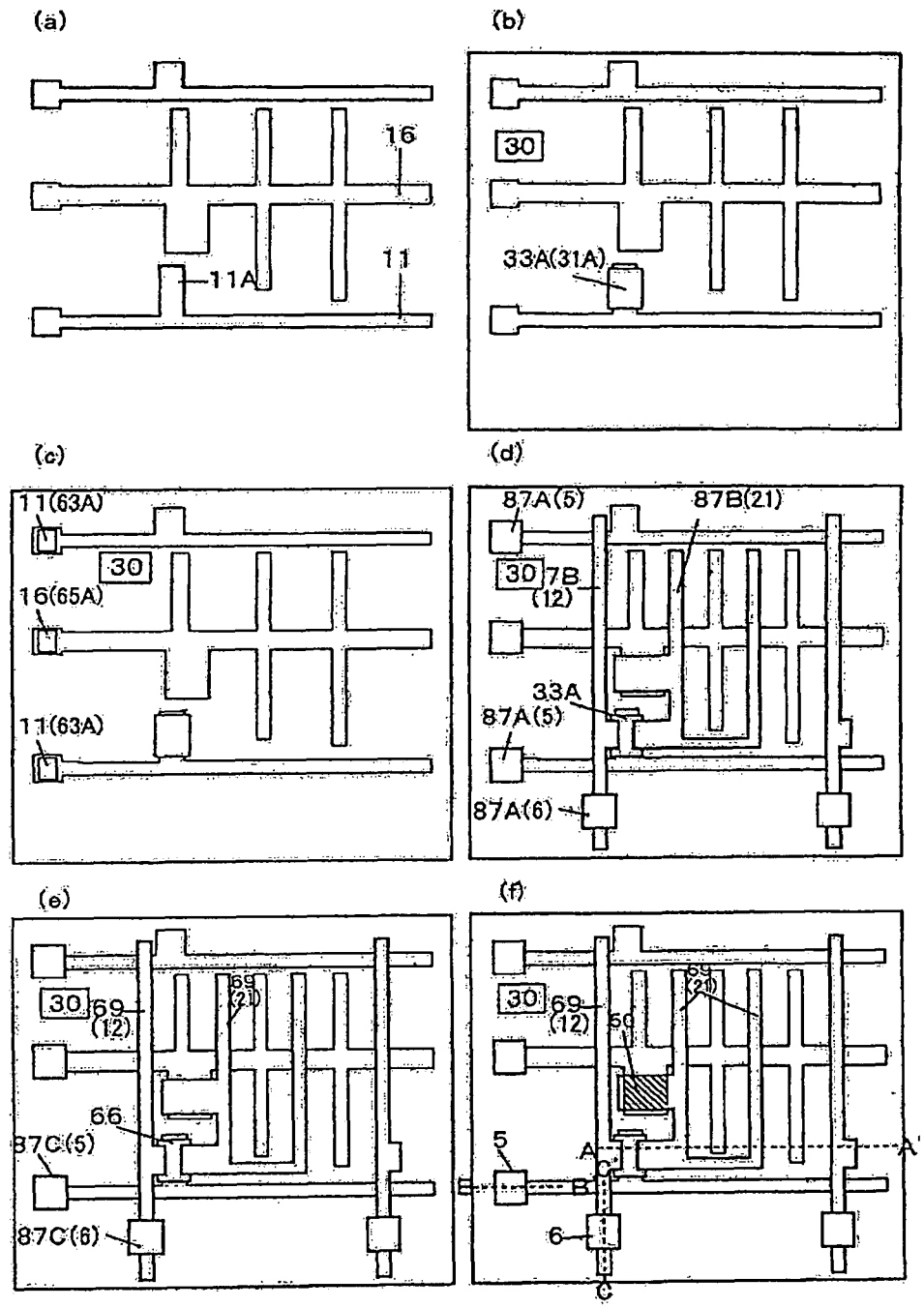
FIG. 17 shows the Plan View of Active Substrate Related to Embodiment 9 of This Invention.
Figure 18:
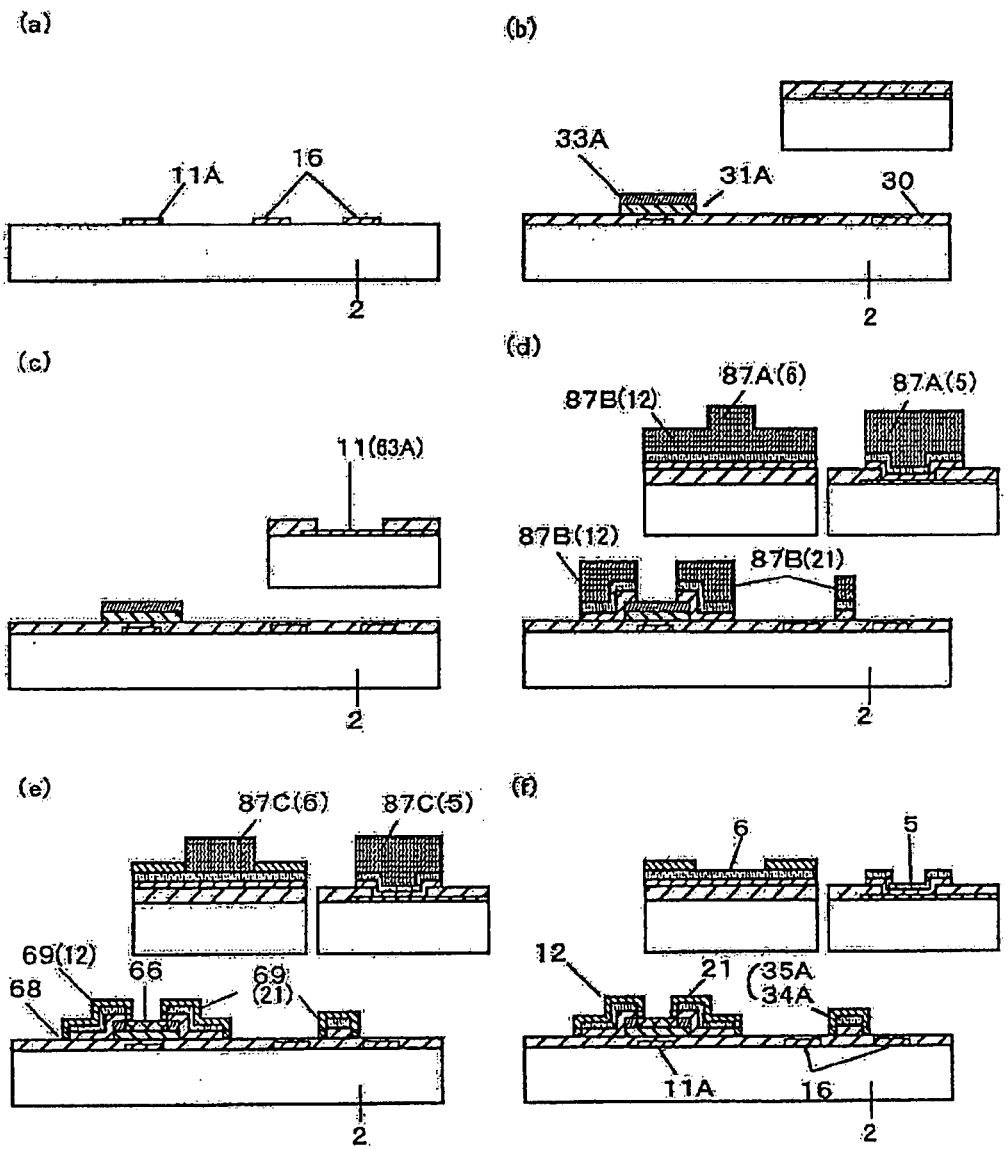
FIG. 18 shows the Manufacture Cross Section of Active Substrate Related to Embodiment 9 of This Invention.
Figure 19:
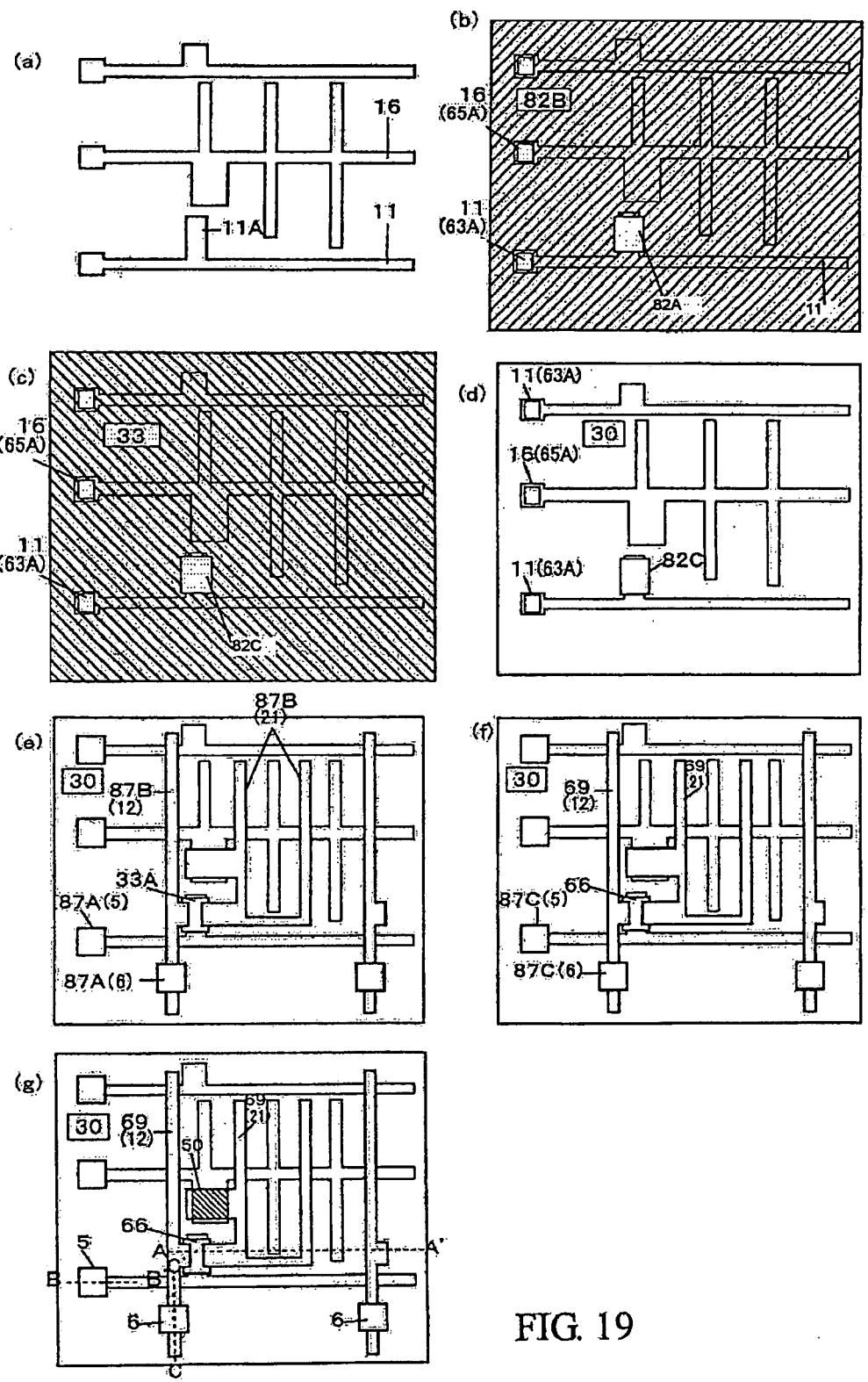
FIG. 19 shows the Plan View of Active Substrate Related to Embodiment 10 of This Invention.
Figure 20:
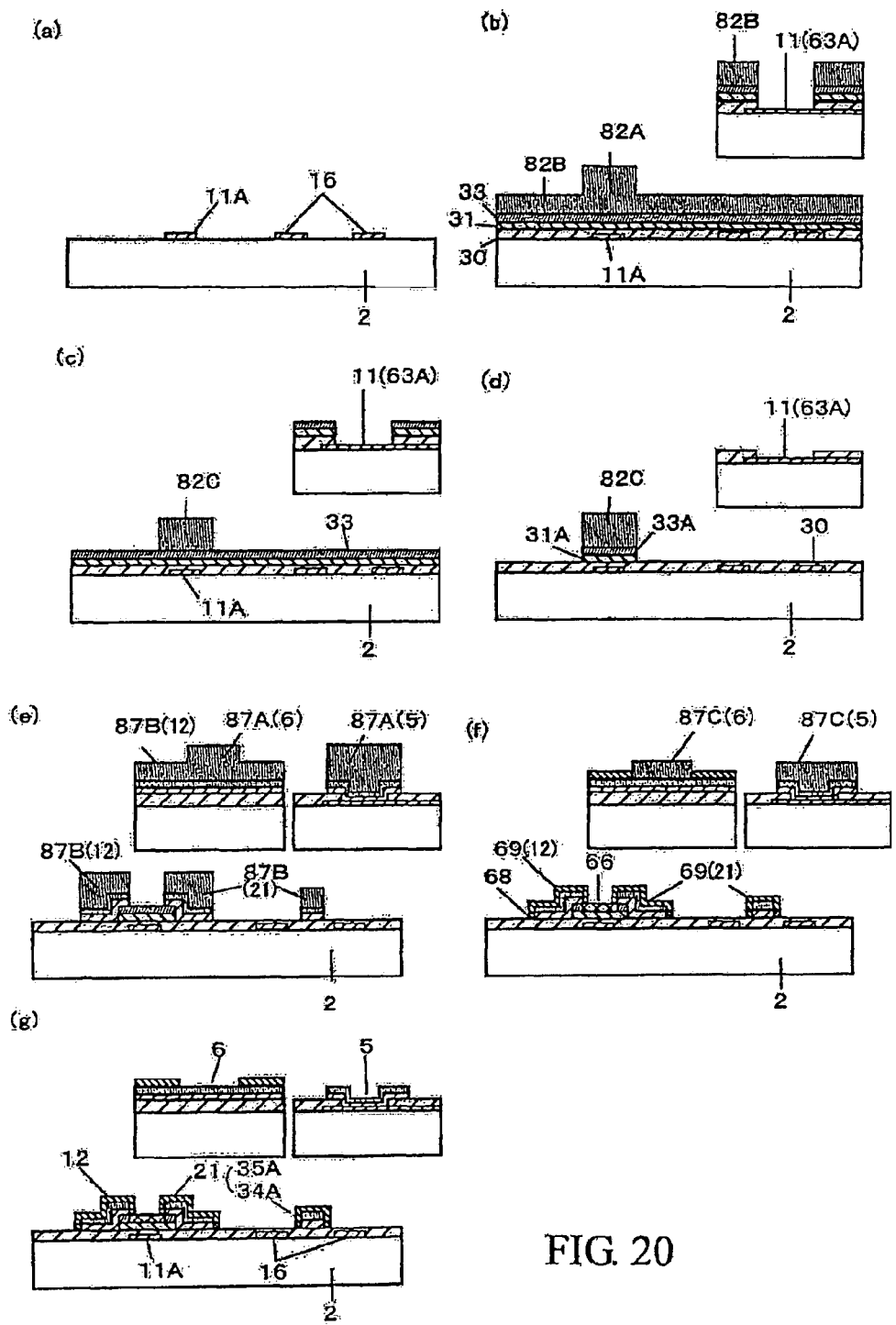
FIG. 20 shows the Manufacture Cross Section of Active Substrate Related to Embodiment 10 of This Invention.
Figure 21:
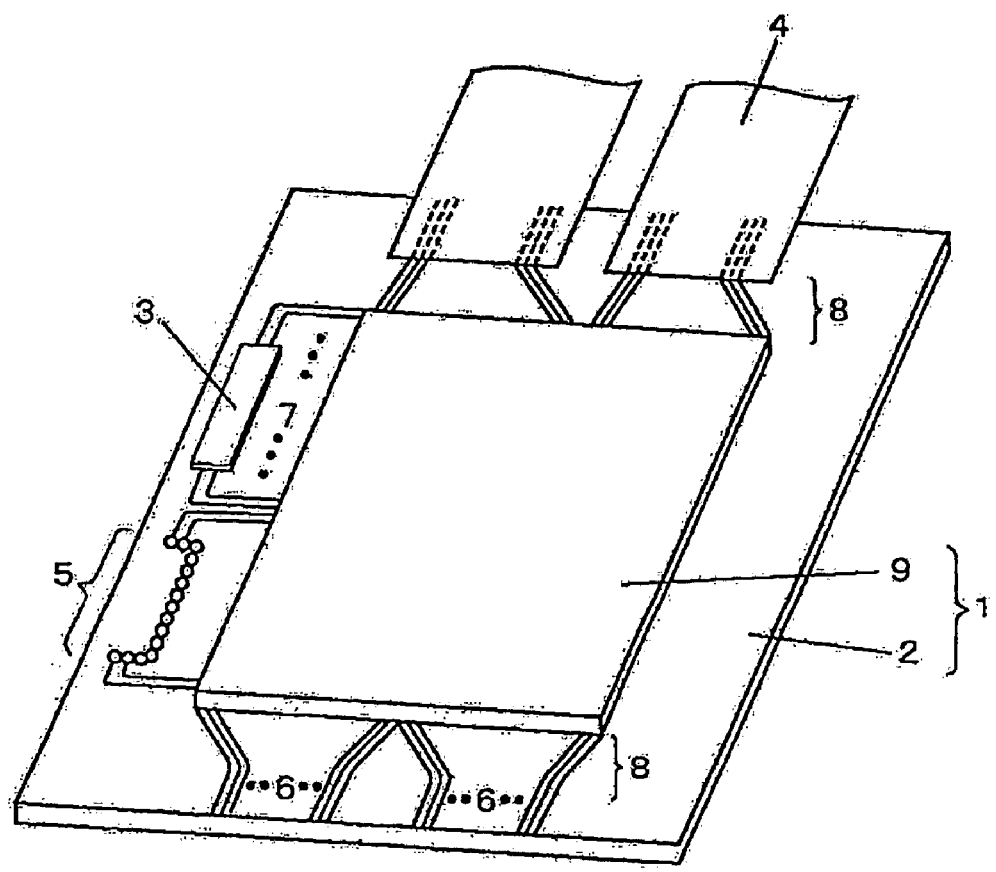
FIG. 21 shows the Perspective View Showing Liquid Crystal Panel Mounting.
Figure 22:
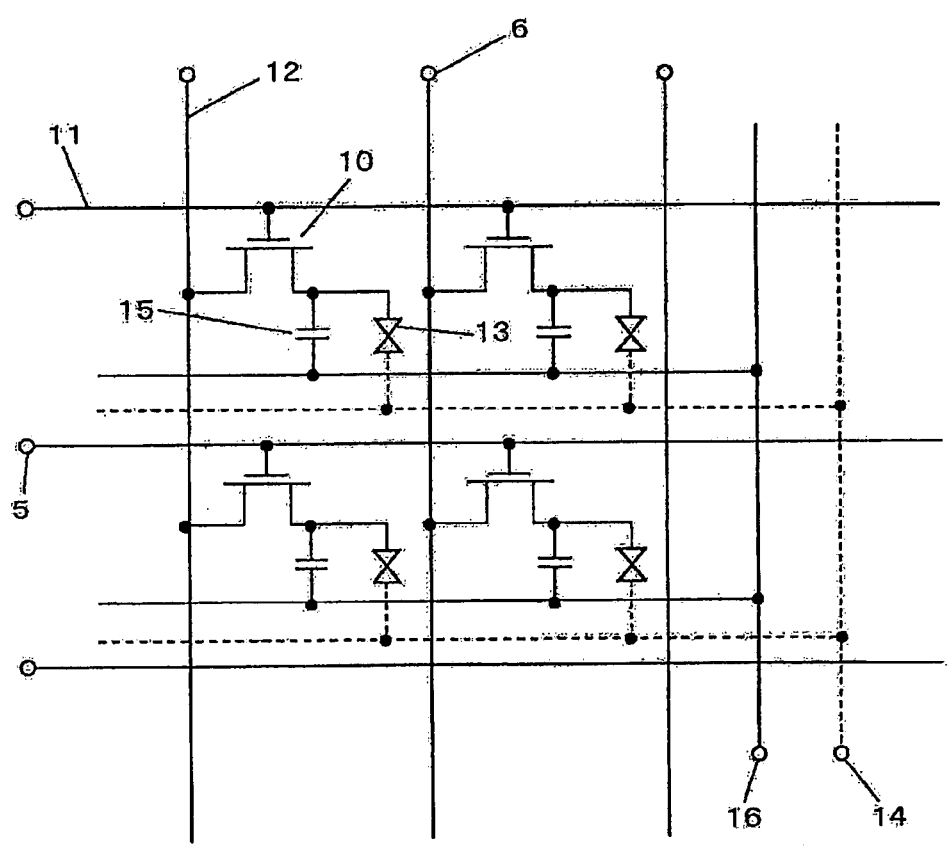
FIG. 22 shows the Equivalent Circuit of the Liquid Crystal Panel.
Figure 23:
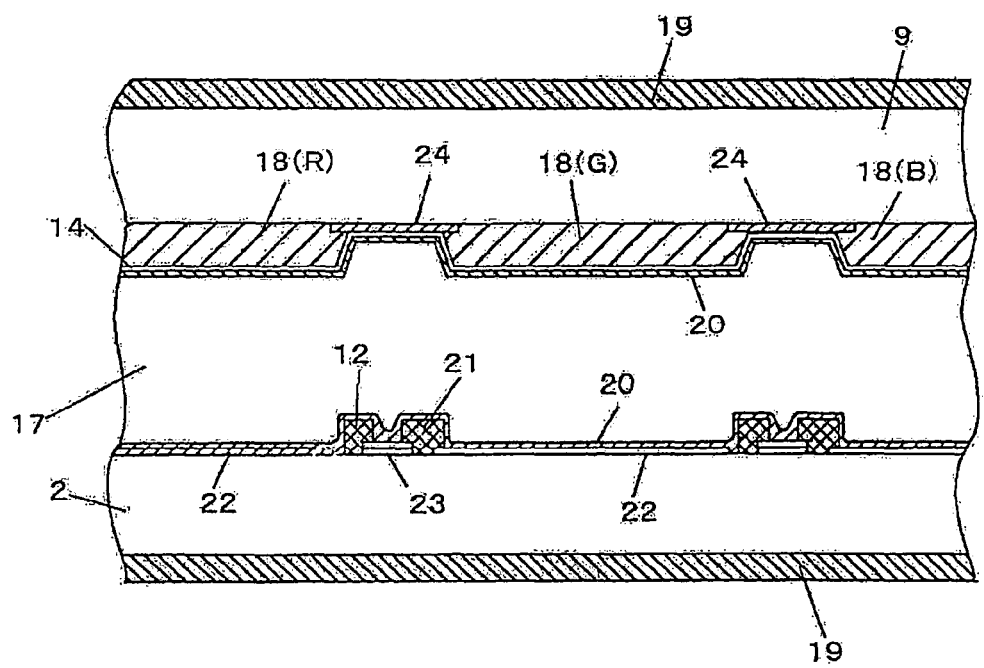
FIG. 23 shows the Cross Section of the Conventional Liquid Crystal Panels.
Figure 24:
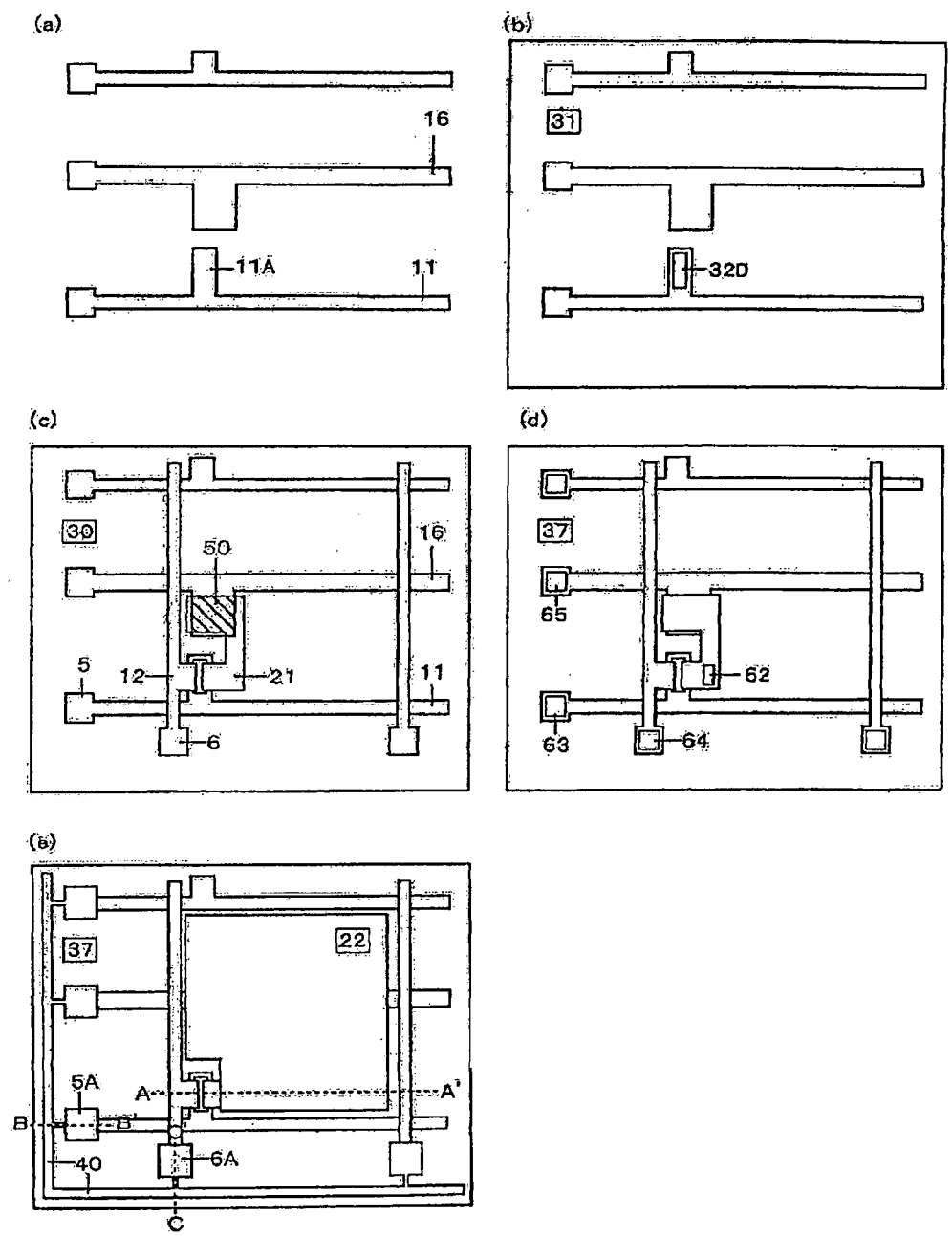
FIG. 24 shows the Plan View of Conventional Active Substrates.
Figure 25:
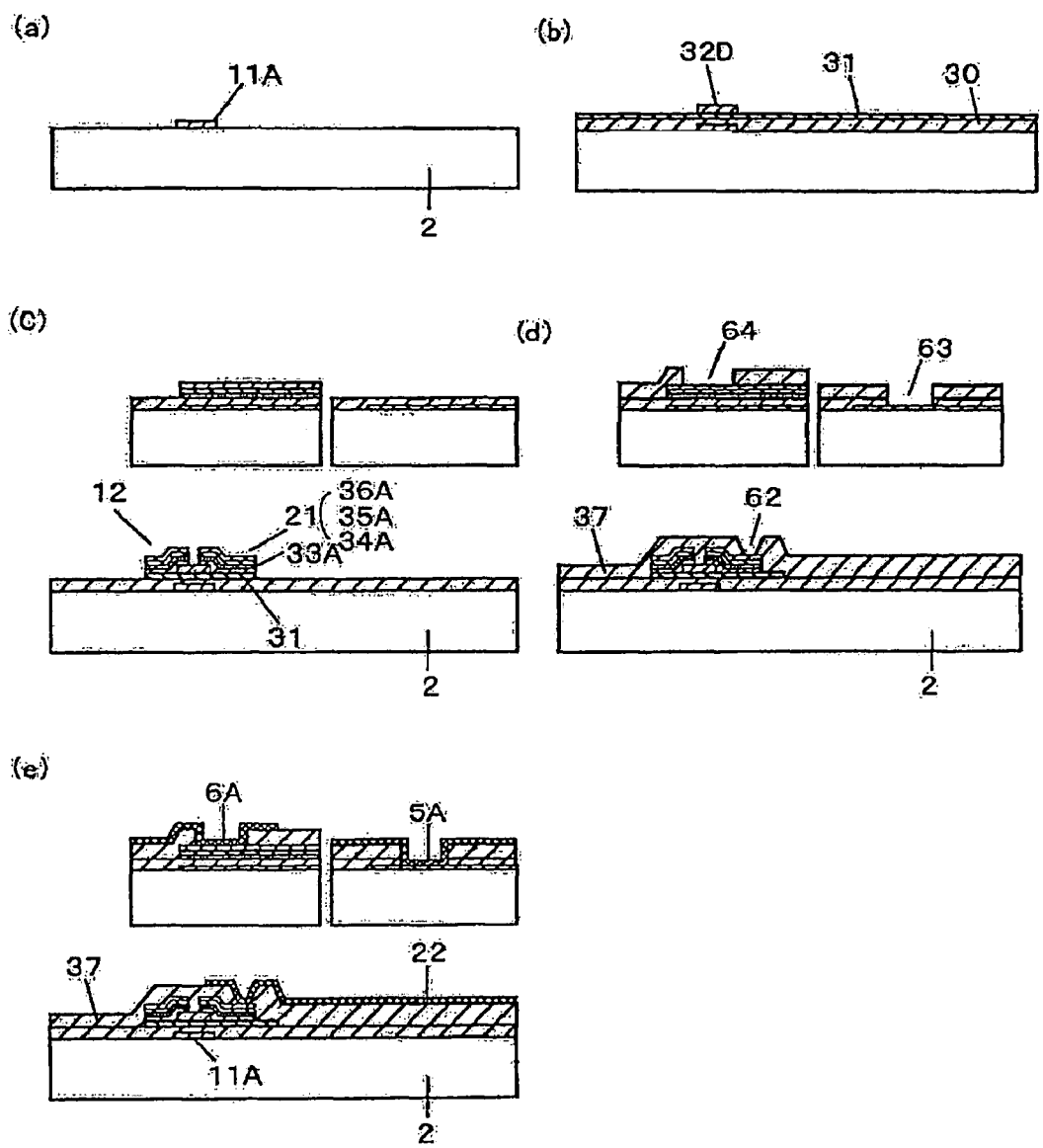
FIG. 25 shows the Manufacture Cross Section of Conventional Active Substrates.
Figure 26:
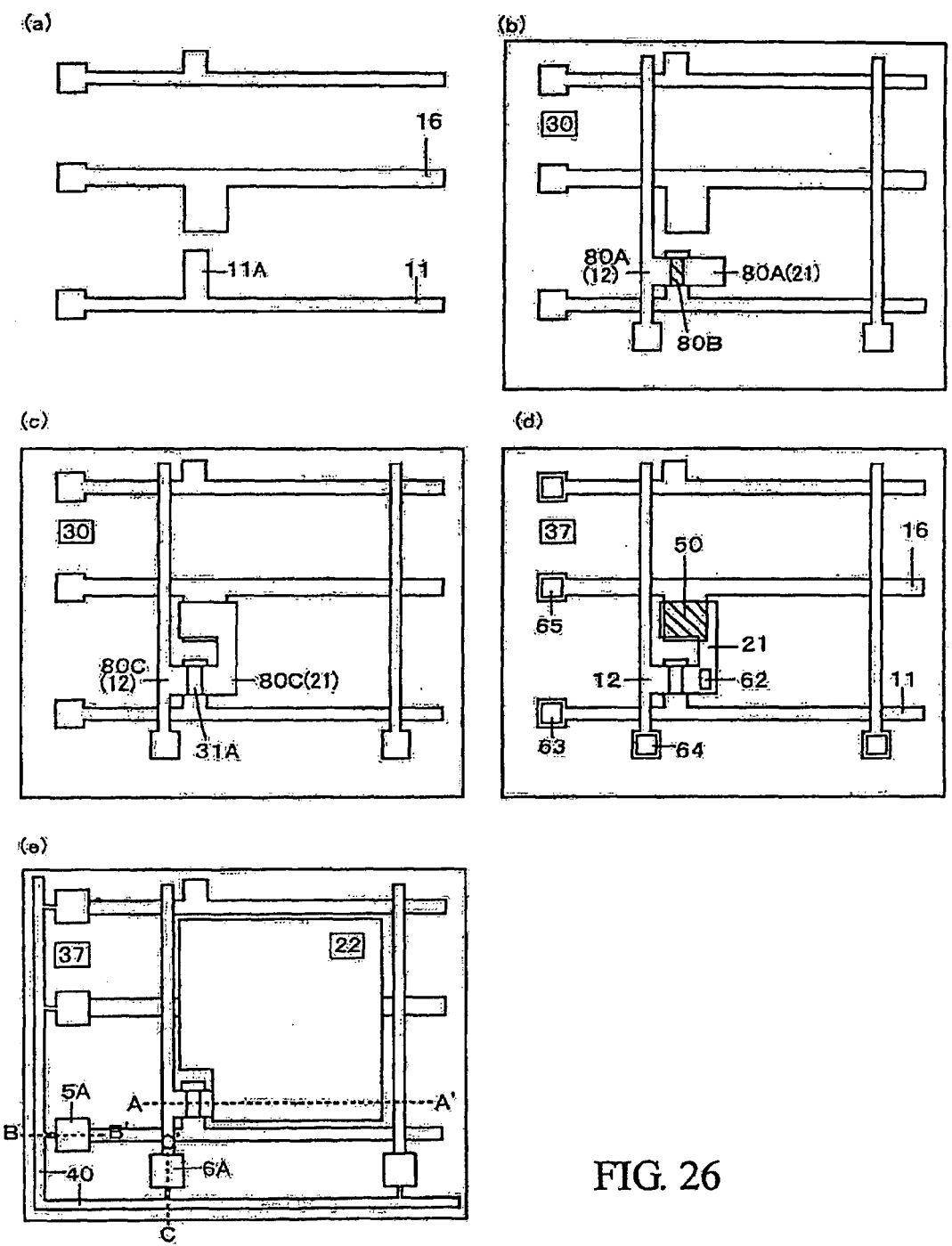
FIG. 26 shows the Plan View of Streamlined Active Substrates.
Figure 27:
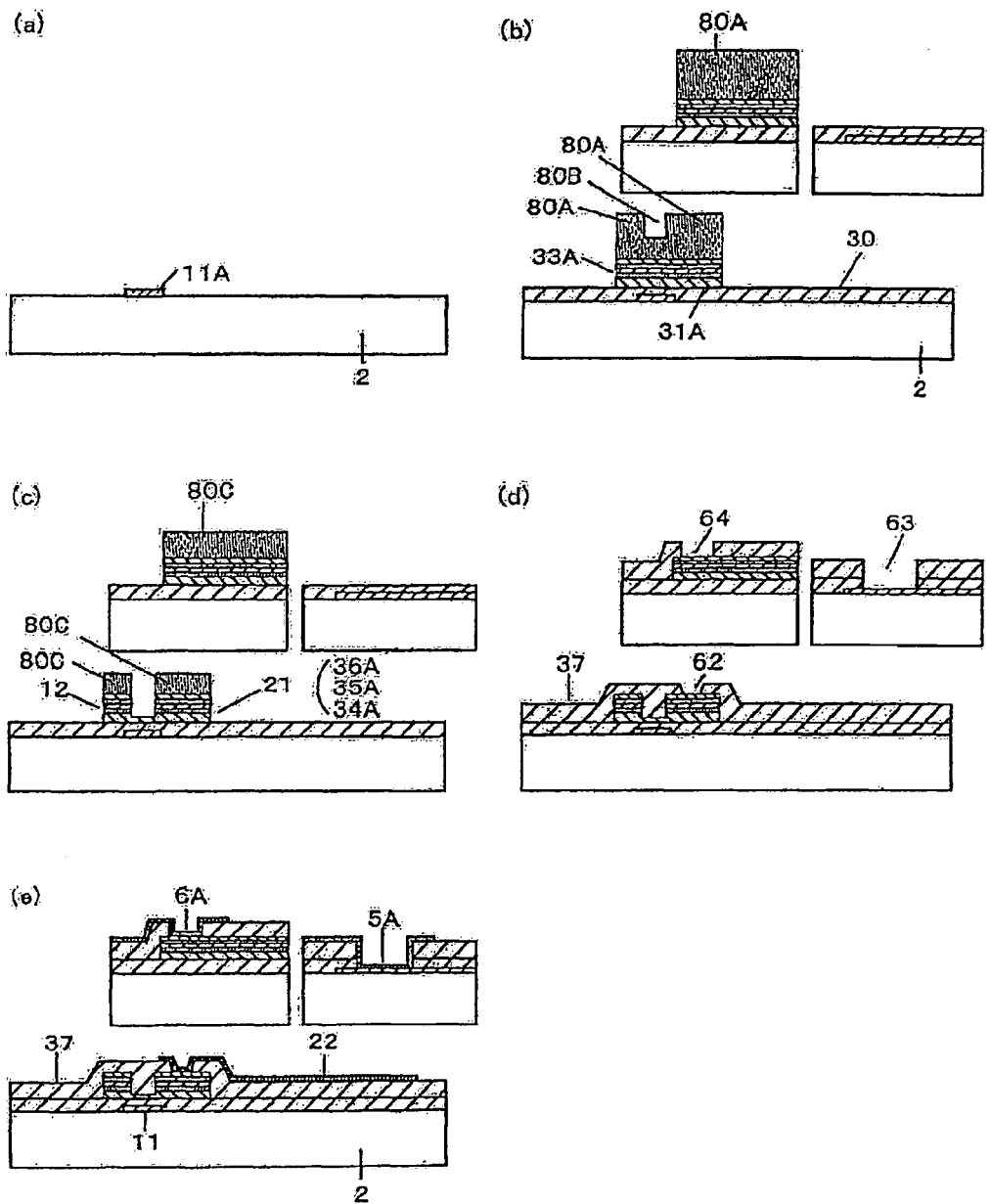
FIG. 27 shows the Manufacture Cross Section of Streamlined Active Substrates.

The embodiments of this invention are explained, using FIGS. 1-20. FIG. 1 shows an active substrate that is related to Embodiment 1, and FIG. 2 shows the cross section of manufacturing processes corresponding to A-A' line, B-B' line, and C—C' line of FIG. 1. Likewise, each plan view of active substrates and cross section of manufacturing processes are shown as follows: Embodiment 2 shown in FIGS. 3 and 4, Embodiment 3 in FIGS. 5 and 6, Embodiment 4 in FIGS. 7 and 8, Embodiment 5 in FIGS. 9 and 10, Embodiment 6 in FIGS. 11 and 12, Embodiment 7 in FIGS. 13 and 14, Embodiment 8 in FIGS. 15 and 16, Embodiment 9 in FIGS. 17 and 18, and Embodiment 10 in FIGS. 19 and 20. Please note that the part that are the same as the conventional embodiments use the same symbols and do not have detailed descriptions.

In Embodiment 1, 1) deposit a transparent conductive layer 91 of 0.1-0.2 μm in thickness, ITO for example, and a primary metal layer 92 of 0.1-0.3 μm in thickness, on a principal plane of a glass substrate 2, using a vacuum film-depositing equipment such as the SPT, and 2) form a) scanning lines 11 that also work as gate electrodes 11A comprising a laminate of a transparent conductive layer 91A and a primary metal layer 92A, pseudo electrode terminals 94 of scanning lines, and pseudo pixel electrodes 93 comprising a laminate layer of a transparent conductive layer 91B and a primary metal layer 92B, using fine-processing technology such as photosensitive resin patterns as shown in FIGS. 1(a) and 2(a). A metal with a high melting point such as Cr, Ta, or Mo, for example, or an alloy or silicide thereof may be selected for the primary metal layer. An aluminum layer or an aluminum alloy layer including Nd sandwiched by a heat-resistant metal layer may also be selected such that a battery reaction does not occur between the ITO in an alkaline developing solution or in resist stripping solution in order to lower the resistance of the scan line. Improving insulation break down voltage with the signal lines through a gate insulating layer and controlling the tapering of the cross-section shape on the electrodes thereof through, dry etching is desirable in order to increase the yield; however, the sputter etch method may be applied for now using Ar (gas), for example, as the new ITO dry etch technology with hydrogen iodide or hydrogen bromide has not made the alimentation by reaction products in the gas exhaust system significantly practical. Furthermore, continuous pattern formation is possible with the same etching solution, depending on materials of the primary metal layer 92, when IZO (Indium-Zinc-Oxide) is used as a transparent conductive layer 91, making tapering of the cross section easy.

Next, deposit a transparent insulating layer, such as TaOx and SiO2 at approximately 0.1 µm of film thickness comprising a plasma protective layer on the entire surface of a glass substrate 2, and this is numbered 71. This plasma protective layer 71 is necessary to avoid the SiNx film quality from changing when the transparent conductive layers 91A and 91B that are exposed at the edge sections of scanning lines 11 and pseudo pixel electrodes 93 at the deposition of SiNx, which is a gate insulating layer and formed by the PCVD equipment mentioned hereinafter; see the prior Japanese Unexamined Patent Application Publication S59-9962 for detail.

After depositing a plasma protecting layer 71, deposit the following 3 thin film layers successively using a PVD equipment as with conventional embodiments, for example approximately at 0.2, 0.2, and 0.05 µm in thickness, respectively: 1) a primary SiNx layer 30 composing a gate insulating layer, 2) a primary amorphous silicon layer 31, with almost no impurities composing the channel for insulating gate type transistors, and 3) a secondary amorphous silicon layers 33 with impurities composing the source-drains for insulating gate type transistors. As the gate insulating layer is the laminate of a plasma protective layer and a primary SiNx layer here, the primary SiNx layer may be formed thinner than the conventional embodiments as a result.

Now, using halftone exposure technology, form photosensitive resin patterns 82A and 82B which have 1) openings above a pseudo short circuit lines 96 formed outside of the image display area, 2) openings 63A above the pseudo electrode terminals 94 that are part of scanning lines 11, and 3) openings 74 above pseudo pixel electrodes 93, and the films of which are thicker than 1-µm or the film thickness of the other area 82B (intermediate halftone area), such as 2 µm for the semiconductor layer-forming area 82A (black area) above the gate electrode 11A. After that, as shown in FIGS. 1(b) and 2(b), 1) etch primary metal layers 92A-92C with photosensitive resin patterns 82A and 82B as their masks, in addition to a) a secondary amorphous silicon layer 33 that is exposed, b) a primary amorphous silicon layer 31, c) a gate insulating layer 30, and d) a plasma protective layer 71, and 2) expose the transparent conductive layers of the pseudo electrode terminals 94, making them part of the scanning lines 5A, 3) expose, likewise, the transparent conductive layers 91C of the pseudo short circuit lines 96, making them short circuit lines 40, and 4) expose the transparent conductive layers 91B of the pseudo pixel electrodes 93, making them pixel electrodes 22. The electrode terminal of the scanning lines 11 is about half of the electrode pitch of the driving LSI at the maximum, at 20 µm or bigger normally, and the production of photomasks to form openings 63A (white area) and its accuracy control of their finished size are both very easy.

Next, when the said photosensitive resin patterns 82A and 82B are reduced in film thickness by 1 µm or more by ashing methods such as oxygen plasma, the photosensitive resin patterns 82B disappear as shown in FIGS. 1(c) and 2(c), exposing secondary amorphous silicon layers 33B and leaving photosensitive patterns 82C as they are only in the semiconductor layer-forming areas above the gate electrodes 11A. Since the pattern width of the island-like semiconductor layer is the total of the distance between the source-drain wires and mask overlaying accuracy, the width would be 10-12 µm when the distance between the source-drain wires is 4-6 µm and the overlaying accuracy is ±3 µm; this dimension is not very accurate. However, the resist pattern is reduced in thickness isotropically by 1 µm when resist patterns 82A are converted to 82C, not only the dimension would be 2 µm smaller but also the mask overlaying accuracy during the formation of the source-drain wires becomes smaller by 1 µm; effects of the latter is bigger than the former during the process. Therefore, it is preferable to strengthen anisotropy in order to regulate the pattern dimension's changes in the said plasma treatment; this means that the following methods are more preferable: 1) oxygen plasma treatment using methods such as RIE, furthermore ICP and TCP that has a plasma source with higher density or 2) corresponding with processes by designing the dimension of resist patterns 82A bigger from the beginning, taking the changing resist pattern dimension into consideration.

Now, 1) using photosensitive patterns 82C as masks as shown in FIGS. 1(d) and 2(d), selectively leave the secondary amorphous silicon layers 33B and primary amorphous silicon layers 31B wider than the gate electrodes 11A, making them 33A and 31A, respectively, and 2) expose the gate insulating layer 30A. The island-like semiconductor layers 33A and 31A, that is a dimension of photosensitive resin pattern 82C, are at least 10 µm big; photomasks, whose areas other than the black area and white area are called halftone exposure area, are easily manufactured, and process management is easy as there is hardly any change in the electrical property of insulating gate type transistors even when the dimension accuracy of island-like semiconductor layers 33A and 31A fluctuates.

At this time, part of the scanning lines 5A, short circuit lines 91C, and pixel electrodes 22, consisting of a transparent conductive layer and being exposed on a glass substrate 2, are exposed to etching gas, but it is a merit that there is no nonconformity such as reduced film thickness of transparent conductive layers, changed resistance value, or changed transparency when fluorine type gas, which is the etching gas for amorphous silicon layers 33B and 31B, is used.

After removing the said photosensitive resin pattern 82C, deposit 1) a thin film layer 34 of approximately 0.1 µm in film thickness as a heat-resistant metal layer such as Ti and Ta, and 2) an AL thin film layer 35 of approximately 0.3 µm in film thickness as a low resistance wire layer in this order using a vacuum film-depositing equipment such as an SPT. Next, as shown in FIGS. 1(e) and 2(e), 1) etch these 2 layers, using fine processing technology as photosensitive resin patterns and 2) selectively form a) drain electrodes 21 for insulating gate type transistors, containing part of the pixel electrodes 22 and b) signal lines 12 that also work as source wires, consisting of a laminate of 34A and 35A. However, as with the conventional embodiments, 1) etch a) a secondary amorphous silicon layer 33A and b) a primary amorphous silicon layer 31A in this order and 2) etch the primary amorphous silicon layer, leaving approximately 0.05-0.1 µm in film thickness. Furthermore, at the time of source-drain wires formation, form 1) the electrode terminals 5 of the scanning lines containing part 5A of the scanning lines within the openings 63A and 2) the electrode terminals 6 of the signal lines comprising part of the signal lines 12, outside an image display area. As for the structure of the source wire 12 and drain wire 21, single layer such as Ta, Cr, and MoW may be formed if the restrictions for the resistance value are lenient.

After forming the source wire 12 and drain wire 21, as with the conventional 5-mask process, 1) deposit, on the entire surface of the glass substrate 2, a secondary SiNx layer of approximately 0.3 µm in thickness as a transparent insulating layer, making it a passivation insulating layer 37, 2) selectively form openings 38, 63, and 64 on pixel electrodes 22, electrode terminals 5 of the scanning lines 11, and electrode terminals 6 of the signal lines 12, respectively, and 3) expose most of the pixel electrode 22 and electrode terminals 5 and 6 as shown in FIGS. 1(f) and 2(f).

When a liquid crystal panel is made by gluing the active substrate 2 thus obtained and a color filter 9 together, the embodiment 1 for this invention is completed. As for the structure of the storage capacitance 15, an structural example of the storage electrode 72, which is formed at the same time as the drain wire 21, containing the pixel electrode 22 as shown in FIG. 1 (f), and the said scanning line 11 being overlapped on a flat surface (a diagonal line going up to the right-hand side 52) between the storage electrode 72 through a plasma protective layer 71A and a gate insulating layer 30A. However, storage capacitance structure is not limited to this alone, and an insulating layer including a gate insulating layer may be formed between a pixel electrode and the storage capacitance line that is formed at the same time as the scanning lines. Other structures are also possible, but detailed descriptions are omitted here.

Embodiment 2, as shown in FIGS. 3(a) and 4(a), selectively form on a principal plane of the glass substrate 2, 1) scanning lines 11 and pseudo electrode terminals 94 of scanning lines, which consist of a laminate of a transparent conductive layer 91A and a primary metal layer 92A and also work as gate electrodes 11A, 2) pseudo pixel electrodes 93 consisting of a laminate of a transparent conductive layer 91B and a primary metal layer 92B, and 3) pseudo electrode terminals 95 of signal lines consisting of a laminate layer of a transparent conductive layer 91C and a primary metal layer 92C.

Next, 1) deposit a transparent insulating layer, such as TaOx and SiO2 at approximately 0.1 μm in thickness, composing a plasma protecting layer on the entire surface of the glass substrate 2, numbering it as 71, and 2) deposit the following 3 thin film layers for example at approximately 0.2, 0.2, and 0.05 μm, respectively, using a PCVD equipment: a) a primary SiNx layer 30 composing a gate insulating layer, b) a primary amorphous silicon layer 31 including almost no impurities and composing the channel for insulating gate type transistors, and c) a secondary amorphous silicon layer 33 including impurities and composing the source-drains for insulating gate type transistors.

After that, form photosensitive resin patterns 82A and 82B, which are characterized as follows, using halftone exposure technology: having 1) openings 63A above the pseudo short circuit lines 96 and above the pseudo electrode terminals 94 which are part of the scanning lines 11, 2) openings 64A above the pseudo electrode terminals 95, 3) openings 74 above the pseudo pixel electrodes 93, and 4) thickness of which is 2 μm thick or the film thickness of the semiconductor layer-forming area 82A above the gate electrode, for example, being thicker than the 1 μm film in another area 82B. And as shown in FIGS. 3(b) and 4(b), 1) etch successively a) a secondary amorphous silicon layer 33 that is exposed, b) a primary amorphous silicon layer 31, c) a gate insulating layer 30, and d) a plasma protective layer 71, and 2) expose the pseudo pixel electrodes 93, pseudo electrode terminals 94, pseudo electrode terminals 95 and pseudo short-circuit lines 96 with photosensitive resin patterns 82A and 82B as their masks.

Now, after the thicknesses of the said photosensitive resin patterns 82A and 82B are reduced by more than 1 μm, using ashing methods such as oxygen plasma, the photosensitive resin patterns 82B disappear as shown in FIGS. 3(c) and 4(c) and a secondary amorphous silicon layer 33B is exposed; photosensitive resin patterns 82C can be left as they are only at the semiconductor layer-forming areas above the gate electrodes 11A.

As shown in FIGS. 3(d) and 4(d), selectively leave the secondary amorphous silicon layers 33B and the primary amorphous silicon layers 31B wider than gate electrodes 11A, making them islands 31A and 33A, respectively, and expose the gate insulating layer 30A.

After removing the said photosensitive resin patterns 82C, deposit the following thin film layer successively using a vacuum film-depositing equipment such as an SPT: 1) a thin film layer 34 as a heat-resistant metal layer at about 0.1 μm, such as Ti and Ta, and 2) an AL thin film layer 35 as a low resistance wire layer at about 0.3 μm. As shown in FIGS. 3(e) and 4(e), etch the thin film layer of these 2 layers successively using fine processing technology such as photosensitive resin patterns, and 2) selectively form a) drain electrodes 21 for insulating gate type transistors containing part of the pseudo pixel electrodes 93 and b) signal lines 12 comprising source wires containing part of the pseudo electrode terminals 95, both consisting of a laminate of 34A and 35A.

After the formation of source wire 12 and drain wire 21, 1) deposit a secondary SiNx layer at approximately 0.3 μm on the entire surface of the glass substrate 2, making it a passivation insulating layer 37, 2) as shown in FIGS. 3(f) and 4(f), form openings 38, 63, and 64 on the pseudo pixel electrodes 93, pseudo electrode terminals 94, and pseudo electrode terminals 95, respectively, and 3) remove the passivation layer and the primary metal layers 92A-C, exposing most of these electrodes to obtain the transparent conductive pixel electrodes 22 and electrode terminals of 5A and 6A.

Embodiment 2 of this invention is completed when a liquid crystal panel is made by gluing the active substrate 2 thus obtained and a color filter 9. The structure of storage capacitance 15 is the same as Embodiment 1.

Embodiments 1 and 2 use silicon nitride (SiNx) deposited with a PCVD equipment on an active substrate 2 in the same manner as conventional embodiments, giving the merit of having fewer changes in their process at existing mass production plants and being easy to apply. However, further reduction of number of processes and cost is possible by adding passivation technology by anode-oxidizing source-drain wires, and this will be described as Embodiments 3 and 4.

In Embodiment 3, 1) first deposit a primary metal layer of approximately 0.1-0.3 μm in thickness, using a vacuum film-depositing equipment such as an SPT, and 2) selectively form a) scanning lines 11 composing gate electrodes 11A and b) storage capacitance lines 16 using fine processing technology as shown in FIGS. 5(a) and 6(a). Metal with a high melting point such as Cr, Ta, Mo, or their alloys, and/or a silicide of them are selected as the primary metal layer, but considering the fact that AL alone has poor heat-resistance in order to lower the resistance of scanning lines, mono-layer structures such as AL (Zr, Ta) alloys or lamination layers such as AL/Ta, Ta/AL/Ta, AL/Ti, Ti/AL/Ti, AL/AL (Ta, Zr) may be selected. Here, AL (Ta, Zr) means AL alloys with high heat resistance, which has added Ta and/or Zr by a few % or less.

Next, 1) deposit the following 3 thin film layers for example in the following order at approximately 0.3, 0.1, and 0.05 μm in thickness, respectively, using a PCVD equipment: 1) a primary SiNx layer 30 composing a gate insulating layer, 2) a primary amorphous silicon layer 31 including almost no impurities and composing the channel for insulating gate type transistors, and 3) a secondary amorphous silicon layer 33 including impurities and composing the source-drain for insulating gate type transistors. Now by using halftone exposure technology as shown in FIGS. 5(b) and 6(b), 1) form photosensitive resin patterns 82A and 82B having 1) openings 63A at part of the scanning lines 11 2) openings 65A at part of the storage capacitance lines 16, outside of the image display area, and 3) thickness of which is thicker than 1 μm or the film thickness of the other area 82B, such as 2 μm for the semiconductor layer formation area 82A above the gate electrode 11A, and selectively remove a) a secondary amorphous silicon layer 33, b) a primary amorphous silicon layer 31, and c) a gate insulating layer 30 within the openings 63A and 65A, and expose part of the scanning lines 11 and storage capacitance lines 16.

Figure 5:
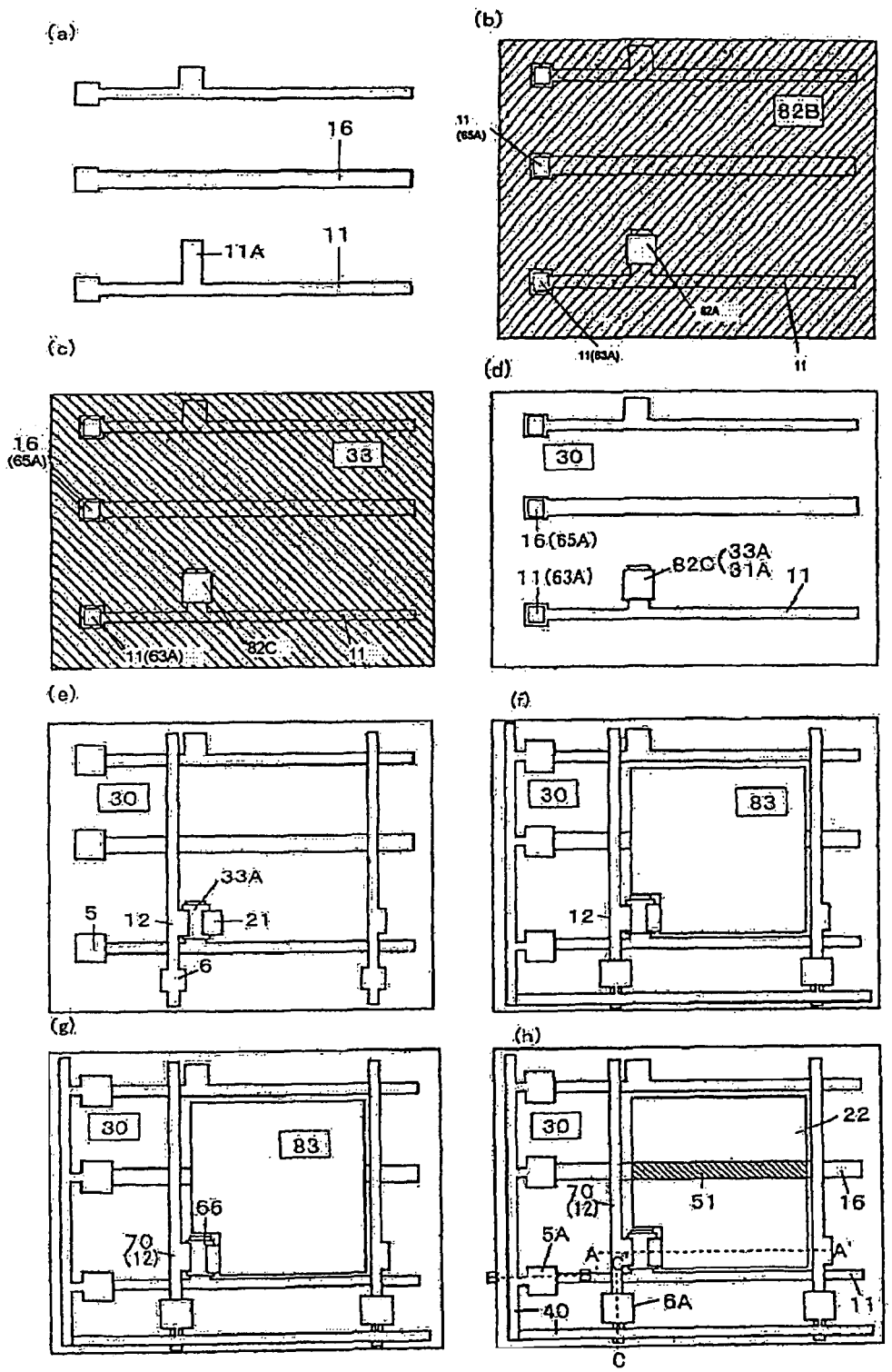
FIG. 5 shows the Plan View of Active Substrate Related to Embodiment 3 of This Invention.
Figure 6:
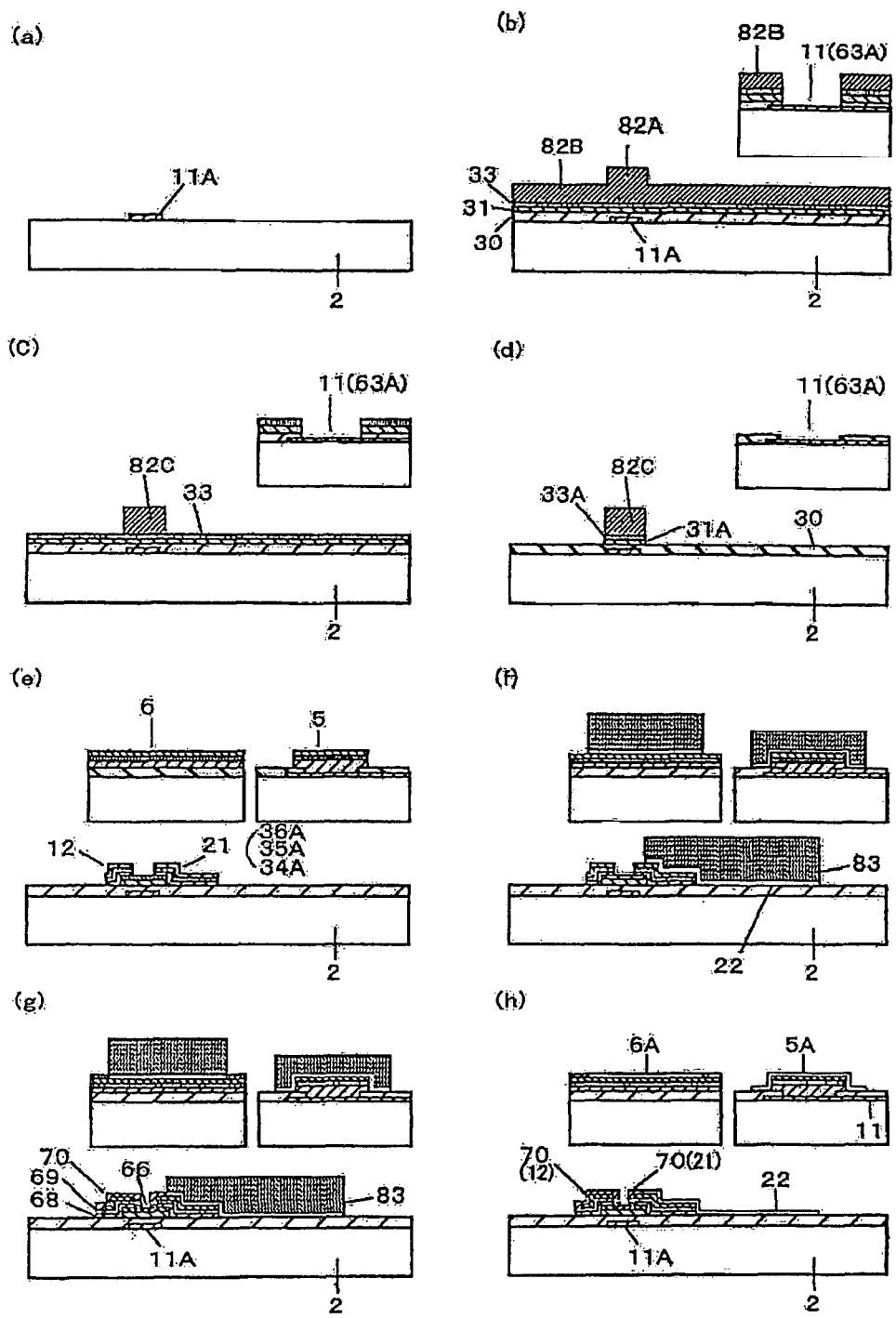
FIG. 6 shows the Manufacture Cross Section of Active Substrate Related to Embodiment 3 of This Invention.

When the thicknesses of the said photosensitive resin patterns 82A and 82B are reduced by 1 μm or more, using ashing methods such as oxygen plasma, the photosensitive resin patterns 82B disappear as shown in FIGS. 5(*c*) and 6(*c*), exposing the secondary amorphous layer 33, leaving the photosensitive resin patterns 82C as they are only at the semiconductor layer formation areas above the electrodes 11A. Selectively leave the secondary amorphous silicon layer 33 and the primary amorphous silicon layer 31 wider than the gate electrode 11A, making islands 33A and 31A, using the photosensitive resin patterns 82C as masks as shown in FIGS. 5(*d*) and 6(*d*), exposing the gate insulating layer 30. Please note that the scanning lines 11 may get thinner, depending on the material used for the scanning lines 11 as part of the scanning lines 11 exposed within the openings 63A are exposed to etching gas or etching solution at this point. However, the effects of oxidization can be easily avoided if Ti is selected as the source-drain wire material for the lowest layer even if AL alloys may be exposed. The following method is also possible: deposit the scanning lines 11 as a Ti/AL/Ti laminate layer for example as described in the conventional embodiments, remove AL, and expose the lower layer Ti even if the upper layer Ti disappears.

After removing the said photosensitive resin patterns 82C, using a vacuum film-depositing equipment such as an SPT deposit: 1) a thin film layer 34 of approximately 0.1 μm in thickness as an anode-oxidizable heat-resistant metal layer such as Ti and Ta, 2) an AL thin film layer 35 of approximately 0.3 μm in thickness as an anode-oxidizable low resistance wire layer, and 3) a thin film layer 36 of approximately 0.1 μm in thickness as an anode-oxidizable intermediate conductive layer such as Ta. Next, 1) etch the source-drain wire materials made of these 3 thin film layers in the order described using fine processing technology such as photosensitive resin patterns and 2) as shown in FIGS. 5(*e*) and 6(*e*), selectively form a) drain electrodes 21 for insulating gate type transistors and b) signal lines 12 composing source wire electrodes, both consisting of a laminate of 34A, 35A and 36A. For the selective formation of patterns for the source wire 12 and drain wire 21, it is no longer necessary to etch the secondary amorphous silicon layer 33A including impurities and the primary amorphous silicon layer 31A including no impurities, thus the thickness of the primary amorphous silicon layer may be thin as 0.1 μm. By the way, at the time the source wire 12 and drain wire 21 are formed, electrode terminals 5 of scanning lines, including part of the scanning lines 11 within the openings 63A as well as the electrode terminals 6 composing part of the signal lines are also formed. It is possible to simplify the source-drain wire structures into anode-oxidizable Ta single layer if resistance restrictions are lenient. In addition, as chemical potential of AL alloys including Nd decreases, restricting chemical corrosion reaction against ITO in alkaline solutions such as development solutions and resist removal solutions, the intermediate conductive layer 36A is no longer necessary; 2-layer structures (34A and 35A) may be used for the lamination layer structure of source wire 12 and drain wire 21, slightly simplifying the structure of the source wire 12 and drain wire 21.

After the source wire 12 and drain wire 21 are formed, 1) deposit a transparent conductive layer such as ITO of 0.1-0.2 μm in film thickness on the entire surface of the glass substrate 2 using a vacuum film-deposing equipment such as an SPT, and 2) selectively form pixel electrodes 22 on the gate insulating layer 30, containing part of the drain electrodes 21 using fine processing technology such as a photosensitive resin pattern 83 as shown in FIGS. 5(*f*) and (6). In this process, form transparent conductive layers also on the electrode terminals 5 of scanning lines and on the electrode terminals 6 of signal lines, naming them transparent conductive electrode terminals of 5A and 6A. In this embodiment, as with the conventional embodiments, it is easy to set up a transparent conductive short circuit line 40, make high resistance by forming stripes in the area between the electrodes 5A/6A and short circuit line 40, and to use it as the high resistance necessary for measures against static electricity.

Next, 1) form oxidized layers on the surfaces of the source wire 12 and the drain wire 21 by anode-oxidization while lighting them, using the said photosensitive resin pattern 83 as a mask, and 2) form as shown in FIGS. 5(*g*) and 6(*g*), a) a silicon oxide layer ($SiO_2$) 66, an insulating layer, including impurities and b) a silicon oxide layer (not shown) including no impurities by anode-oxidizing the secondary amorphous silicon layer 33A including impurities, which is exposed between the source wire 12 and drain wire 21, and anode-oxidizing part of the primary amorphous silicon layer 31A including no impurities.

Ta is exposed in the upper surface of the source wire 12 and drain wire 21, and Ta, AL, and Ti lamination layers are exposed on the sides; through anode oxidation, Ta is changed to tantalum pentoxide ($Ta_2O_5$) or 70, AL to an insulating layer alumina ($AL_2O_3$) or 69, and Ti to a semiconductor titanium oxide ($TiO_2$) or 68, respectively. The titanium oxide layer 68 is not an insulating layer, but it does not bring passivation problems as the film is considerably thin and the exposed area is small; it is preferable to select Ta also for the heat resistant metal thin film layer 34A. However, please note that unlike Ti, Ta lacks the ability to absorb a surface-oxidized layer of the bed layer, making ohmic contact easier.

The secondary amorphous silicon layer 33A including impurities at channels increases leak currents of insulating gate type transistors unless it is all insulated toward the thickness direction. It has been described in the prior embodiment that the use of light illumination during the execution of anode-oxidization is very important. This means that if a leak current of an insulating gate type transistor exceeds 1 μA when approximately 10,000 luxes of strong light is illuminated, current density of about 10 $mA/cm2$ is obtained; this is necessary to obtain good film quality in anode oxidation.

Furthermore, electric purity of channel is increased, and complete electric isolation between the source wire 12 and drain wire 21 is achieved by changing up to a part (up to 100 A or so) of a primary amorphous silicon layer 31A to a silicon oxide layer including no impurities (not shown); the primary amorphous silicon layer 31A includes no impurities and is in contact with a silicon oxide layer 66 including impurities, which is formed by setting up the voltage 10 V or so higher than the 100 V or over, the chemical conversion voltage high enough to change a secondary amorphous silicon layer 33A including impurities to a silicon oxide layer 66, an insulating layer, through anode oxidation. In short, a high On/Off ratio is obtained when the Off-state current of the insulating gate type transistors decrease enough.

0.1-0.2 μm of film thickness would be thick enough for the oxidized layers formed through anode oxidization, tantalum pentoxide 70, alumina 69, and titanium oxide 68 layers, for the passivation of wires, and more than 100 V of voltage is applied, using a chemical conversion solution such as ethylene glycol. Please note that all the signal lines 12 must be electrically formed (connected) either in a line or a series upon anode oxidizing the source wire 12 and drain wire 21; unless the line or series is released sometime or somewhere during the following manufacturing processes, some problems would definitely arise with regard to not only the electric tests of the active substrate 2 but also the actual operation of liquid crystal display devices. Transpiration by laser light irradiation or mechanical removal by scribing is an easy way for such release; detailed description is omitted here.

The reason to cover up the pixel electrode 22 with a photosensitive resin pattern 83 is because 1) there is no need to anode-oxidize the pixel electrode 22 and 2) chemical conversion current that flows to the drain electrode 21 via an insulating gate type transistor does not need to be more than necessary.

Lastly, remove the said photosensitive resin patterns 83 and complete it as an active substrate 2 as shown in FIGS. 5(*h*) and 6(*h*). Make a liquid crystal panel by gluing together the active substrate 2 thus obtained and a color filter 9, and this completes Embodiment 3. As for the structure of storage capacitance 15, FIG. 5(*h*) shows an example (51: a diagonal line going up to the right-hand side) of a structure in which the storage capacitance line 16 and pixel electrode 22 overlap at level on both sides of the gate insulating layer 30.

In Embodiment 3, an active substrate is made using 4 photomasks with a reduced number of photo etching processes by applying halftone exposure technology to layers with low pattern accuracy, which has removed the gate insulating layer for the island-formation process of the semiconductor layers and contacts (openings) formation process for the scanning lines. As it is now possible to make active substrates with 3 photomasks after further reducing the number of processes by also using the technology to treat the formation of pixel electrodes and scanning lines with the same photomask as shown in Embodiment 1, this is explained as Embodiment 4.

Embodiment 4 has the same process as Embodiment 1 up to the formation process of island-like semiconductor layers and contacts. However, the primary amorphous silicon layer 31 may be as thin as 0.1 μm. After removing the photosensitive resin pattern 82C, whose film thickness was reduced, 1) deposit a) a thin film layer 34 as an anode-oxidizable heat resistant metal layer, such as Ti and Ta, at approximately 0.1 μm in thickness and b) an AL thin film layer 35 as an anode-oxidizable low resistance wire layer at approximately 0.3 μm in thickness. Next, 2) etch the source-drain wire materials consisting of these 2 thin film layers in this order, using fine processing technology such as photosensitive resin patterns 87A and 87B, and 3) selectively form a) drain electrodes 21 for the insulating gate type transistors containing part of the pixel electrodes 22 within openings 74, and b) signal lines 12 comprising source electrodes, both comprising a laminate of 34A and 35A. At the time the source wire 12 and drain wire 21 are formed, electrode terminals 5 of scanning lines, containing part of the scanning lines (5A) comprising a transparent conductive layer and electrode terminals 6 comprising part of the signal lines are also formed. Embodiment 4 is characterized especially by forming, in advance, photosensitive resin patterns 87A and 87B, which are thicker than 3 μm in thickness for example, the film thickness of areas (black areas) 87A (5) and 87A (6) that correspond to electrode terminals 5 and 6 or thicker than 1.5 μm for example, the film thickness of areas (halftone areas) 87B (12) and 87B (12) that correspond to the source wire 12 and the drain wire 21, using halftone exposure technology. The minimum dimension for the area 87A that corresponds to electrode terminals 5 and 6 is large at several 10 μm, making it easy to manufacture photomasks and control the finished dimensions. Since the minimum dimension of the area 87B that corresponds to the source wire 12 and the drain wire 21 has relatively high dimension accuracy at 4-8 μm, it requires high accuracy also in the halftone area. However, as the source wire 12 and the drain wire 21 are formed by 1 exposure treatment and 1 etching treatment, change in their pattern dimension is small, compared with the active substrates formed with 1 exposure treatment and 2 etching treatments, using the conventional halftone exposure technology; it is easy to control the pattern accuracy in the dimension control of the source wire 12 and the drain wire 21 or in the length control of a channel between the source wire 12 and the drain wire 21.

After the formation of the source wire 12 and drain wire 21, the photosensitive resin patterns 87B disappear if the said photosensitive resin patterns 87A and 87B are reduced in film thickness by 1.5 μm or more, using an ashing method such as oxygen plasma, exposing the source wire 12 and drain wire 21; photosensitive resin patterns 87C (5) and 87C (6) can be left as they are only on the electrode terminals 5 and 6. This invention is characterized especially by the fact that there are hardly any effects of the pattern dimension due to oxygen plasma treatment, as it may be clear for the size of the electrode terminals 5 and 6. Now, 1) anode-oxidize the source wire 12 and the drain wire 21, as shown in FIGS. 7(*f*) and 8(*f*) while illuminating light as in Embodiment 3, using photosensitive resin patterns 87C (5) and 87C (6) as masks, forming oxidized layers 68 and 69 and 2) at the same time, anode-oxidize the secondary amorphous silicon layer 33A which is exposed between the source wire 12 and the drain wire 21, and also anode-oxidize part of the primary amorphous silicon layer 31A which is adjacent to the secondary amorphous silicon layer 33A, forming a) a silicon oxide layer 66 including impurities, and b) a silicon oxide layer (not shown) including no impurities, which are insulating layers.

Figure 7:
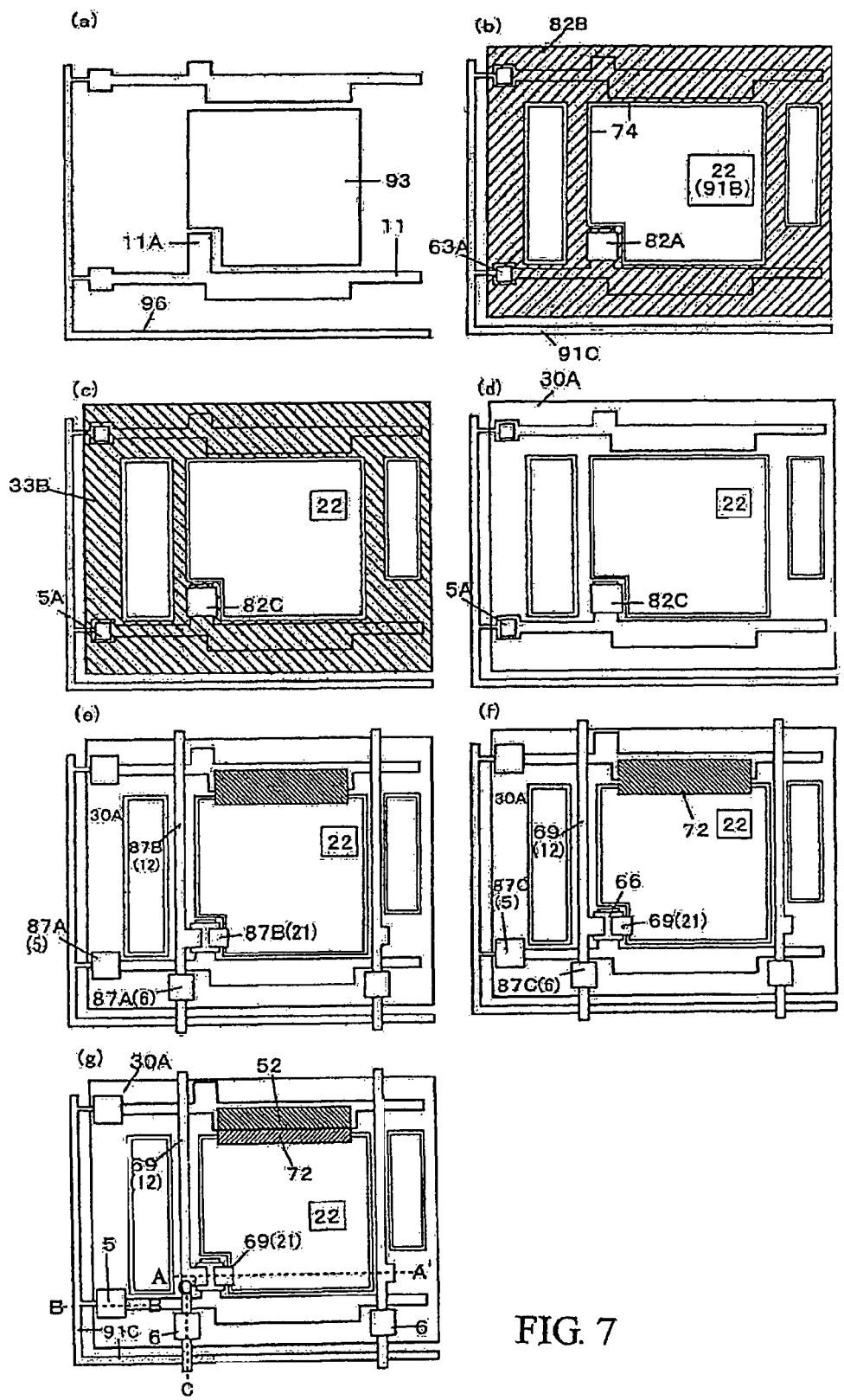
FIG. 7 shows the Plan View of Active Substrate Related to Embodiment 4 of This Invention.

After completing the anode oxidization, if photosensitive resin patterns 87C (5) and 87C (6) are removed, electrode terminals 5 and 6, each of which has an anode-oxidized layer on the side and consists of a low resistance metal layer, are exposed as shown in FIGS. 7(*g*) and 8(*g*). However, an anode-oxidized layer is not formed on the side of the electrode terminal 5 unless 1) part of the scanning lines 5A are connected to the short circuit line 91C as a measure against static electricity, for example, and 2) the electrode terminals 6 are formed containing the short circuit line 91C as shown in the figure.

When a liquid crystal panel is made by gluing the active substrate 2 thus obtained and a color filter 9 together, Embodiment 4 for this invention is completed. As for the structure of the storage capacitance 15, an structural example of the 1) storage electrode 72, which is formed at the same time as the source wire 12 and drain wire 21, containing part of the pixel electrode 22 as shown in FIG. 7(*g*), and 2) the protruded area of the scanning line 11 of upper pixel being overlapped at level (a diagonal line going up to the right-hand side 52) on both sides of the laminate of the gate insulating layer 30A and the plasma protective layer 71A, as with Embodiment 1.

When the source wire 12, the drain wire 21, and the secondary amorphous silicon layer 33A are anode oxidized, the pixel electrodes 22, which are electrically connected to the drain electrodes 21, are exposed in Embodiment 4, resulting in the anode oxidation of pixel electrodes 22 at the same time; this is a significant difference from Embodiment 3. Therefore, depending on the film quality of the transparent conductive layer composing the pixel electrode 22, its resistance value may increase due to anode oxidization. In such a case, the film deposition requirements for transparent conductive layers need to be changed accordingly, leaving the layer as insufficient in oxygen. However, the transparency of the transparent conductive layer never decreases due to anode oxidization. Furthermore, the current necessary to anode oxidize the drain electrode 21 and pixel electrode 22 is supplied also through the channel of the insulating gate type transistor, but a large amount of chemical conversion current or chemical conversion over a long period of time is required due to the large pixel electrode 22 size; no matter how strongly the outside light is illuminated, it is very difficult to form anode-oxidized layers of the same film quality and thickness on the drain electrode 21 and storage electrode 72 as on the signal line 12 due to the resistance in the channel area, and making the chemical conversion time longer alone is not sufficient. Nevertheless, the anode-oxidized layer formed on the drain electrode 21 is often reliable enough not to cause practical problems even when it is not perfect. This is because 1) the driving signals applied to the liquid crystal cell are essentially alternating currents and 2) voltage of the opposing electrode 14 on CF 9 is adjusted (flicker reduction) at the time of image testing in order to reduce the direct voltage components between the opposing electrode 14 and pixel electrode 22 (drain electrode 21). Thus, an insulating layer is required only on the signal line 12 to prevent direct current components from flowing.

In Embodiments 1-4, channel-etch type insulating gate transistors are used; a reduced number of photo etching processes is obtained by applying halftone exposure technology to layers with low pattern accuracy for the removal process of the gate insulating layer to form contacts at scanning lines and for the island-formation process of the semiconductor layers, thus active substrates can be made with 4 or 3 photomasks. Formation of active substrates with 4 photomasks will be described in Embodiments 5-7 using the etch-stop type insulating gate transistors that have protecting insulating layers on the channels.

In this Embodiment 5, first deposit a transparent conductive layer 91 of about 0.1-0.2 μm in thickness, such as ITO, and a primary metal layer 92 about 0.1-0.3 μm in thickness over a principal plane of the glass substrate 2, as in Embodiment 2, using a vacuum film-producing equipment such as the an SPT, and selectively form scanning lines 1, pseudo electro terminals 94 of the scanning lines, pseudo pixel electrodes 93, and pseudo electrode terminals 95 of the signal lines, using fine processing technology such as photosensitive resin patterns as shown in FIGS. 9(a) and 10(a).

After depositing a plasma protecting layer 71, deposit successively the following 3 thin film layers using a PVD equipment, for example approximately at 0.2, 0.05, and 0.1 μm in thickness, respectively: 1) a primary SiNx layer 30 composing a gate insulating layer, 2) a primary amorphous silicon layer 31 including almost no impurities composing the channel for insulating gate type transistor, and 3) a secondary SiNx silicon layer 32 composing the insulating layer to protect the channel. As the gate insulating layer is the laminate of a plasma protective layer 71 and a primary SiNx layer 30 here, the primary SiNx layer 30 may be formed thinner than the conventional embodiments as a result.

Next, 1) selectively leave the secondary SiNx layer above the gate electrode 11A narrower than the gate electrode 11A as shown in FIGS. 9(b) and 10(b) using fine processing technology, and make them protective insulating layers 32D, and 2) expose the primary amorphous silicon layer 31.

Next, 1) deposit a secondary amorphous silicon layer 33 including impurities such as phosphorus on the entire surface of the glass substrate 2, at approximately 0.05 μm in thickness, using a PCVD equipment. Now by using halftone exposure technology, form 1) photosensitive resin patterns 82A and 82B having a) openings 74 above the pseudo electrode terminals 94, b) openings 63A above the pseudo electrode terminals 94 of the scanning lines and c) openings 64A above the pseudo electrode terminals 95 of the signal lines, outside an image display area, and 2) which are thicker than 1 μm, the film thickness of the other area 82B, such as 2 μm for the semiconductor layer formation area 82A above the gate electrode 11A. Next, etch successively 1) the secondary amorphous silicon layer 33, 2) the primary amorphous silicon layer 31, 3) the gate insulating layer 30, 4) the plasma protecting layer 71, which are in the said openings, and 5) primary metal layers 92A-92C as shown in FIGS. 9(c) and 10(c), exposing the electrode terminals 5A of the scanning lines 11, pixel electrodes 22, and the electrode terminals 6A of the signal lines.

Now, after the thickness of the said photosensitive resin patterns 82A and 82B is reduced by more than 1 μm, using ashing methods such as oxygen plasma, the photosensitive resin pattern s 82B disappear, and a secondary amorphous silicon layer 33B is exposed. At the same time, reduced photosensitive resin pattern s 82C can be left as they are only at the semiconductor layer formation areas above the gate electrodes 11A. The photosensitive resin pattern 82C is the equivalent of the semiconductor layer formation area, and its dimensional change in the etchstop-type insulating gate transistors would not change the electrical properties of the insulating gate type transistors, making the process control quite easy. As shown in FIGS. 9(d) ad 10(d), 1) selectively etch the secondary amorphous silicon layer 33B and the primary amorphous silicon layer 31B, using the photosensitive resin pattern 82C as masks and 2) form island-like semiconductor layers 33A and 31A above the gate electrode 11A, whose patterns are wider than the gate electrode 11A, exposing the gate insulating layer 30A. In this process, the transparent conductive electrode terminals 5A of the scanning lines and 6A of the signal lines and pixel electrodes 22, which are exposed within the said openings 63A, 64A, and 74 respectively, are exposed to the etching gas for the secondary and primary amorphous silicon layers 33A and 31A. It is a significant merit that no nonconformity such as reduced film thickness of the transparent conductive layer due to fluorine etching gas, change in the resistance value, or change in the transparency, as described above.

After removing the said photosensitive resin patterns 82C, using a vacuum film-producing equipment such as an SPT in the source-drain wires formation process, deposit successively: 1) a thin film layer 34 of approximately 0.1 μm in film thickness as a heat-resistant metal layer such as Ti and Ta and 2) an AL thin film layer 35 of approximately 0.3 μm in film thickness as a low resistance wire layer. Next, 1) etch a) the source-drain wire materials comprising these 2 thin film layers, b) second amorphous silicon layers 33A, and c) primary amorphous silicon layers 31A using fine processing technology as photosensitive organic insulating patterns 85 (12) and 85 (21) of 1-2 μm in thickness, exposing the gate insulating layer 30A and protective insulating layers 32D. As shown in FIGS. 9(e) and 10(e), 1) selectively form a) drain electrodes 21 for insulating gate type transistors containing part of the pixel electrodes 22, and b) signal lines 12 composing source electrodes containing part of electrode terminals 6A of the signal lines, both comprising a laminate of 34A and 35A. From this, it must be clear that the transparent conductive electrode terminals 5A and 6A are exposed on the glass substrate 2 after the etching of the source wire 12 and drain wire 21 is finished. As for the structure of the source wire 12 and the drain wire 21, single layer such as Ta, Cr, and MoW may be formed as before if the restrictions for the resistance value are lenient.

When a liquid crystal panel is made by gluing the active substrate 2 thus obtained and a color filter 9 together, Embodiment 5 for this invention is completed. As the photosensitive organic insulating layer patterns 85 are in contact with liquid crystal in this Embodiment 5, it is important to use a photosensitive organic insulating layer, which 1) is highly pure, 2) includes acrylic resin or polyimide resin for main components, 3) has high heat-resistance, and 4) is not the ordinary photosensitive resin whose main component is Novolak-based resin. Depending on the material, it is also possible to make a structure so as to cover the sides of the source wire 12 and drain wire 21. This way, the reliability of the liquid crystal panel is greatly improved. As for the structure of the storage capacitance 15, as shown in FIG. 9(e), an structural example of the 1) storage electrode 72, which is formed at the same time as the source wire 12 and the drain wire 21, containing part of the pixel electrode 22 and 2) the protruded area of the scanning line 11 of upper pixel being overlapped at level (a diagonal line going up to the right-hand side 52) on both sides of the laminate of the gate insulating layer 30A and the plasma protective layer 71A.

As for measures against static electricity, a conventional example as shown in FIG. 9(e) has the structure that 1) places a transparent conductive layer pattern 40 on the periphery of the active substrate 2 and 2) connects the transparent conductive layer pattern 40 to transparent conductive electrode terminals 5A and 6A. However, other measures against static electricity are also easily achieved since the opening formation process in the gate insulating layer 30 has been added.

As mentioned above, electrode terminals of the scanning lines and the signal lines must be transparent conductive due to the restriction brought by the device structure. But the device and process which removes such a restriction is possible and is explained as embodiment 6.

As shown in FIGS. 11(d) and 12(d) in Embodiment 6, the same manufacturing processes as Embodiment 5 are used up to the point 1) the secondary amorphous silicon layers 33B and primary amorphous silicon layers 31B are selectively etched, using the photosensitive resin patterns 82C as masks and 2) island-like semiconductor layers 33A and 31A are formed wider than the gate electrodes 11A above the gate electrodes 11A, exposing the gate insulating layer 30A. However, the pseudo electrode terminals 95 are not absolutely necessary for the reason described hereinafter.

After removing the photosensitive resin patterns 82C, 1) deposit successively a) a thin film layer 34 as a heat resistant metal layer, such as Ti and Ta, at approximately 0.1 µm in thickness and b) an AL thin film layer 35 as a low resistance wire layer, at approximately 0.3 µm in thickness using a vacuum film-depositing equipment such as an SPT in the source-drain wires formation process. Next, 2) etch successively, a) the source-rain wire materials comprising these 2 thin film layers, b) the second amorphous silicon layers 33A, and c) the primary amorphous silicon layers 31A using fine processing technology such as photosensitive organic insulating patterns 86A and 86B, exposing the gate insulating layer 30A and the protective insulating layers 32D, 3) selectively form a) drain electrodes 21 for the insulating gate type transistor containing part of the pixel electrodes 22 within openings 74, and b) signal lines 12 composing source wirings, both consisting of a laminate of 34A and 35A, and at the same time as the formation of the source-drain wires 12 and 21, 4) form a) electrode terminals 5 containing part of the exposed scanning lines, and b) electrode terminals 6 composing part of the signal lines. In short, unlike Embodiment 5, transparent conductive electrode terminals 6A are not absolutely necessary. Embodiment 6 is characterized especially by the prior formation of photosensitive organic insulating layer patterns 86A and 86B, which are thicker then 1.5 µm for example, the film thickness of 86B (21) on the drain electrodes 21, 86B (5) and 86B (6) on the electrode terminals 5 and 6, and 86B (72) on the storage electrodes 72; 86A (12) on the signal lines 12 being 3 µm in thickness, for example. The minimum dimension for the area 86B (5) and 86B (6) corresponding to electrode terminals 5 and 6 is large at several 10 µm, making it easy to manufacture photomasks and control the finished dimensions. Since the minimum dimension of the area 86A (12) corresponding to the signal lines 12 has relatively high dimension accuracy at 4-8 µm, it requires high accuracy also in the halftone area. However, as the source-drain wires are formed by 1 exposure treatment and 1 etching treatment, change in their pattern dimension is small, compared with the source-drain wires formed with 1 exposure treatment and 2 etching treatments as described in the conventional embodiments; this way, factors for pattern width fluctuation are few. It is easy to control the pattern accuracy in the dimension control of the source-drain wires or in the length control of a channel between the source-drain wires. It should be noted that it is the dimension of a protective insulating layer 32D and not the length of a channel between the source-drain wires, which dominates the ON-current of the etch-stop type insulating gate transistor compared with the one of channel-etch type insulating gate transistor.

Now, after the formation of the source wire 12 and the drain wire 21, the thickness of the said photosensitive organic insulating layer patterns 86A and 86B is reduced by more than 1.5 µm by ashing methods such as oxygen plasma, the photosensitive organic insulating layer patterns 86B disappear, and as shown in FIGS. 11(f) and 12(f), the drain wirings 21, the electrode terminals 5 and 6 and the storage electrodes 72 are exposed, leaving as they are the photosensitive organic insulating layers 86C (12), whose film thickness has been reduced, on the signal lines 12. However, if the pattern width of the photosensitive organic insulating layer pattern 86C (12) becomes narrower due to the said plasma treatment, the upper part of the signal lines 12 are exposed, lowering the reliability; it is preferable to control the pattern dimension changes by strengthening anisotropy.

When a liquid crystal panel is made by gluing the active substrate 2 thus obtained and a color filter 9 together, Embodiment 6 for this invention is completed. As the photosensitive organic insulating layer patterns 86C are also in contact with liquid crystal in this Embodiment 6, it is important to use a photosensitive organic insulating layer, which 1) is highly pure, 2) includes acrylic resin or polyimide resin for main components, 3) has high heat-resistance, and 4) is not the ordinary photosensitive resin whose main component is Novolak-based resin. As for the structure of the storage capacitance 15, it is the same as Embodiment 5.

In Embodiment 6, the photosensitive organic insulating layers 86C (12) are formed only on signal lines 12, exposing the drain electrodes 21 while maintaining conductivity as with the storage electrodes 72 and pixel electrodes 22, but enough reliability is obtained because the driving signals that are applied to the liquid crystal cells are essentially alternating currents; the voltage of opposing electrode 14 is adjusted (flicker reduction) at the time of image testing in order to reduce the direct current components between the opposing electrode 14 and pixel electrodes 22 (drain electrodes 21). Thus, insulating layers are required only on the signal lines 12 to prevent direct current components from flowing.

Transparent conductive electrode terminals 6A of signal lines are not necessary if electrode terminals 5 and 6 are formed using the same metal materials as the source-drain wires, but it is necessary for the part that connects the signal line 12 to the static control line 40. Likewise, transparent conductive electrode terminals 5A for the scanning lines 11 are not necessary, either, but it is clear that part of the scanning line 5A comprising a transparent conductive layer is necessary as part (contact area) that connects the metal electrode terminals 5 to the scanning line 11.

As demonstrated in FIGS. 11(g) and 12(g), transparent conductive electrode terminals 5A and 6A may be obtained instead of the electrode terminals 5 and 6 comprising source-drain wire materials by changing the pattern design that 1) does not form metal electrode terminals 5 on the transparent conductive electrode terminals 5A of the scanning lines and 2) forms signal lines 12 containing part of the transparent conductive electrodes 6A of the signal lines 12. As the placement of photosensitive organic insulating layers on the storage electrodes 72 is an optional design item, the device structure within the image display area does not change even when the component materials of the electrode terminals are changed.

As described hereinbefore, Embodiments 5 and 6 help the reduction of manufacturing processes by forming an organic insulating layer only on the source-drain wires and/or source wires (signal lines); since organic insulating layers are normally 1 μm or thicker, the following nonconformities may arise: 1) securing gap accuracy of the liquid crystal cell may be affected, and 2) the steps of an organic insulating layer pattern may disturb the orientation status of orientation film, lowering the contrast ratio. Therefore, a minimum number of processes are added in Embodiment 7 to provide passivation technology giving lower steps in place of the organic insulating layer.

Embodiment 7 follows the same manufacturing processes as Embodiment 6 up to the point where contacts 63A and 64A are formed and semiconductor layers 33A and 31A are formed. After removing the photosensitive resin pattern 82C, using a vacuum film-depositing equipment such as the SPT in the source-drain wire formation process, deposit successively: 1) a thin film layer 34 of approximately 0.1 μm in film thickness as a heat-resistant metal layer such as Ti and Ta and 2) an AL thin film layer 35 of approximately 0.3 μm in film thickness as a low resistance wire layer. Next, 1) etch a) the source-drain wire materials consisting of these 2 thin film layers, b) the second amorphous silicon layer 33A, and c) the primary amorphous silicon layer 31A, using fine processing technology such as photosensitive organic insulating patterns 87A and 87B, exposing the gate insulating layer 30A and protective insulating layers 32D. As shown in FIGS. 13(e) and 14(e), 1) selectively form a) drain electrodes 21 for insulating gate type transistors containing part of the pixel electrodes 22 within the openings 74 and b) signal lines 12 comprising source wires, both comprising a laminate of 34A and 35A, and also 2) form a) electrode terminals 5 of the scanning lines containing the exposed part 5A of the scanning lines and b) electrode terminals 6 comprising part of the signal lines, at the same time as the formation of the source-drain wires 12 and 21. Embodiment 7 is characterized as like as Embodiment 4, especially by the prior formation of photosensitive resin patterns 87A and 87B, which are thicker than 1.5 μm for example, the film thickness of a) 87B (12), 87B (21) and 87B (72) on the source-drain wires 12 and 21, and storage electrode 72 and b) 87A (5) and 87A (6) on the electrode terminals 5 and 6 being 3 μm in thickness, for example.

After the formation of the source-drain wires 12 and 21, the photosensitive resin patterns 87B disappears if the said photosensitive resin patterns 87A and 87B are reduced in film thickness by 1.5 μm or more, using an ashing method such as oxygen plasma, exposing the source-drain wires 12 and 21, and the storage electrodes 72; photosensitive resin patterns 87C (5) and 87C (6), which have been reduced in film thickness, can be left as they are only on the electrode terminals 5 and 6. Now, 1) anode-oxidize the source-drain wires 12 and 21, as shown in FIGS. 13(f) and 14(f) while illuminating light, using photosensitive resin patterns 87C (5) and 87C (6) as masks, forming oxidized layers 68 and 69 and 2) at the same time, anode-oxidize a) a secondary amorphous silicon layer 33A and primary amorphous silicon layer 31A, which are exposed at bottom sides of the source-drain wires 12 and 21, forming insulating layers: silicon oxide layers (SiO2) 66 and 67 (not shown).

After anode oxidization is completed, when the photosensitive resin patterns 87C (5) and 87C (6) are removed, electrode terminals 5 and 6, which have an anode-oxidized layer on the side and comprise a low resistance thin film layer, are exposed. Please note that the insulating layers formed on the sides are thinner compared to electrode terminals 6 of the signal lines since anode-oxidizing currents flows on the sides of the electrode terminal 5 of the scanning lines via the high resistance short circuit line 40 set up for measures against static electricity. As for the structure of the source-drain 12 and wire 21, it may be simplified to an anode-oxidizable single layer such as Ta if the restrictions for the resistance value are lenient. When a liquid crystal panel is made by gluing the active substrate 2 thus obtained and a color filter 9 together, the embodiment 7 for this invention is completed. As for the structure of the storage capacitance 15, it is the same as Embodiments 5 and 6.

In Embodiment 7, depending on the film quality of the transparent conductive layer that composes the pixel electrode 22, resistance value may increase by anode oxidization for the same reason as Embodiment 4; in such as case, requirements for film deposition in the transparent conductive layer must be changed accordingly, leaving it as a layer with insufficient oxygen, but transparency of the transparent conductive layer never decreases due to anode oxidization.

As demonstrated in FIGS. 13(h) and 14(h), transparent conductive electrode terminals 5A and 6A may be obtained instead of the electrode terminals 5 and 6 comprising source-drain wire materials by changing the pattern design that 1) does not form metal electrode terminals 5 on transparent conductive electrode terminals 5A of the scanning lines and 2) forms signal lines 12 containing part of the transparent conductive electrode terminals 6A of the signal lines 12. In such a case, halftone exposure technology is not necessary in the formation of the source-drain wires 12 and 21, but special attention must be paid to the increase of resistance value for transparent conductive electrode terminals 5A and 6A. The device structure within the image display area does not change even when the structure of electrode terminals is changed.

The liquid crystal display devices described hereinbefore use the TN-type liquid crystal cells, but the process reduction suggested in this invention is also useful in the IPS (In-Plain-Switching)-type liquid crystal display devices, which control the electric field of the side direction with a set of pixel electrode and counter electrode that have been formed at a specific distance from each other; this will be described hereinafter.

In Embodiment 8, first 1) deposit a primary metal layer about 0.1-0.3 μm in thickness over the principal plane of the glass substrate 2, using a vacuum film-depositing equipment such as the SPT, and 2) selectively form scanning lines 11 that also work as the gate electrodes 11A and counter electrodes 16 that also work as storage capacitance lines, using fine processing technology.

Next, deposit successively the following 3 thin film layers for example, at approximately 0.3, 0.2, and 0.05 μm, respectively, using a PCVD equipment on the entire surface of the glass substrate 2: a) a primary SiNx layer 30 composing a gate insulating layer, b) a primary amorphous silicon layer 31 including almost no impurities and composing the channels for insulating gate type transistors, and c) a secondary amorphous silicon layer 33 including impurities and composing the source-drains for insulating gate type transistors.

After that, 1) form photosensitive resin patterns 82A and 82B, which are characterized as follows: a) have openings 63A above part of the scanning lines 11 and openings 65A above part of the counter electrodes 16, outside an image display area, b) form photosensitive resin patterns 82A and 82B, which are thicker than 1 μm for example, the thickness of the other area 82B, and 82A at the semiconductor formation area being 2 μm in thickness, using halftone exposure technology, and 2) selectively remove the second amorphous silicon layer 33, the primary amorphous silicon layer 31, and the gate insulating layer 30 within the openings 63A and 65A, using photosensitive resin patterns 82A and 82B as masks, exposing part of the scanning lines 11 and the counter electrode 16.

Now, after the said photosensitive resin patterns 82A and 82B are reduced by 1 μm or more in thickness, using ashing methods such as oxygen plasma, the photosensitive resin patterns 82B disappear as shown in FIGS. 15(c) and 16(c), and a secondary amorphous silicon layer 33 is exposed; photosensitive resin pattern 82C can be left as it is only at the semiconductor layer formation area above the gate electrodes 11A. Then, as shown in FIGS. 15(d) and 16(d), 1) selectively leave the second amorphous silicon layer 33 and the primary amorphous silicon layer 31 wider than the gate 11 electrode A, making islands 33A and 31A, and 2) expose the gate insulating layer 30.

After removing the said photosensitive resin patterns 82C, deposit successively 1) a thin film layer 34 of approximately 0.1 μm in film thickness as a heat-resistant metal layer such as Ti and Ta and 2) an AL thin film layer 35 of approximately 0.3 μm in film thickness as a low resistance wire layer. Next, as shown in FIGS. 15(e) and 16(e), 1) etch the source-drain wire materials comprising these 2 layers, using fine processing technology such as photosensitive resin patterns and 2) selectively form a) drain electrodes 21 for insulating gate type transistors composing the pixel electrodes and b) signal lines 12 composing source wires, both consisting of a laminate of 34A and 35A. However, as with the conventional embodiments, 1) etch a) the secondary amorphous silicon layer 33A and b) the primary amorphous silicon layer 31A in this order and 2) etch the primary amorphous silicon layer, leaving approximately 0.05-0.1 μm in film thickness. Furthermore, at the time of source-drain wires formation, form electrode terminals 5 of the scanning lines containing part of the scanning lines 11 within the openings 63A, electrode terminals 6 comprising part of the signal lines 12, and electrode terminals of the counter electrode containing part of the counter electrodes 16 (not numbered).

After forming the source-drain wires 12 and 21, 1) deposit a secondary SiNx layer of approximately 0.3 μm in thickness as a transparent insulating layer, calling it a passivation insulating layer 37 on the entire surface of the glass substrate 2, 2) selectively form openings 63 and 64 on electrode terminals 5 and 6 of the scanning lines 11 and the signal lines 12, respectively, and 3) expose most of the electrode terminals 5 and 6, likewise 4) selectively form openings 65 on electrode terminals of the counter electrodes 16, exposing most of electrode terminals of the counter electrodes 16, and 4) complete this as an active substrate 2 as shown in FIGS. 15(f) and 16(f).

When a liquid crystal panel is made by gluing the active substrate 2 thus obtained and a color filter 9 together, Embodiment 8 for this invention is completed. As clearly described above, the pixel electrodes 22 of transparent conductivity are not necessary on the active substrate 2, making the intermediate conductive layer on the top of the source-drain wires not necessary, either. As for the structure of the storage capacitance 15, an structural example of the counter electrodes (storage capacitance lines) 16 and the pixel electrodes (drain electrodes) 21 being overlapped at level (50: a diagonal line going up to the right-hand side) with the gate insulating layer 30 in between as shown in FIG. 15(f), but the structure of the storage capacitance 15 is not limited to this; an insulating layer including the gate insulating layer 30 may be placed between the pixel electrodes 21 and the scanning lines 11 of the upper pixel. Furthermore, FIG. 15(f) does not show a measure against static electricity in which a high resistance component, such as an Off-state insulating gate type transistor and long and narrow conductive line, connects the electrode terminals 5 and 6 of the scanning lines and the signal lines, but measures against static electricity are easily taken as a process has been added in order to set up openings 63A and expose part of the scanning lines 11.

In Embodiment 8, the silicon nitride (SiNx) deposited with a PCVD equipment on an active substrate 2 in the same manner as conventional embodiments is used, giving the merit of having fewer changes in their process at existing mass production plants and being easy to apply. However, as in Embodiment 7, further reduction of number of processes and cost are possible by adding passivation technology with anode-oxidizing source-drain wires, and this will be described as Embodiment 9.

In Embodiment 9, first 1) deposit a primary metal layer about 0.1-0.3 μm in thickness on a principal plane of the glass substrate 2, using a vacuum film-depositing equipment such as an SPT, and 2) selectively form scanning lines 11 composing the gate electrodes 11A and counter electrodes 16 using fine processing technology as shown in FIGS. 17(a) and 18(a).

Next, deposit successively the following 3 thin film layers for example, at approximately 0.3, 0.2, and 0.05 μm respectively, using a PCVD equipment on the entire surface of the glass substrate 2: a) a primary SiNx layer 30 composing a gate insulating layer, b) a primary amorphous silicon layer 31 including almost no impurities and composing the channels for insulating gate type transistors, and c) a secondary amorphous silicon layer 33 including impurities and composing the source-drains for insulating gate type transistors.

As shown in FIGS. 17(b) and 18(b), 1) selectively remove the secondary amorphous silicon layer 33 and the primary amorphous silicon layer 31, using fine processing technology, and 2) form island-like semiconductor layers 33A and 31A above the gate electrodes 11A wider than the gate electrode 11A, and expose the gate insulating layer 30.

Next, as shown in FIGS. 17(C) and 18(C), 1) form openings 63A and 65A on the scanning lines 11 and the counter electrodes 16 doubling the storage capacitor lines, respectively outside the image display area, using fine processing technology, and 2) selectively remove the gate insulating layer 30 within the openings 63A and 65A, exposing part of the scanning lines 11 and the counter electrodes 16.

Now, deposit successively: 1) a thin film layer 34 of approximately 0.1 μm in film thickness as an anode-oxidizable heat-resistant metal layer such as Ti and Ta and 2) an AL thin film layer 35 of approximately 0.3 μm in film thickness as an anode-oxidizable low resistance wire layer. Next, as in FIGS. 17(d) and 18(d), 1) etch the source-drain wire materials consisting of these thin film layers, using fine processing technology such as photosensitive resin patterns 87A and 87B and 2) selectively form a) drain electrodes 21 composing the pixel electrodes and b) signal lines 12 composing source wires for insulating gate type transistors, both comprising a laminate of 34A and 35A. Here also, it is no longer necessary to etch the secondary amorphous silicon layer 33A and the primary amorphous silicon layer 31A and the thickness of the secondary amorphous silicon layer 31A may be thin as 0.1 μm. At the time the source wire 12 and drain wire 21 are formed, electrode terminals 5 of scanning lines containing part of the scanning lines 11 within the openings 63A, and electrode terminals 6 comprising part of the signal lines, are also formed. As in Embodiment 7, form photosensitive resin patterns 87A and 87B using halftone exposure technology, the film thickness of a) 87A (5) and 87A (6) on the electrode terminals 5 and 6 are 3 μm, for example, and 87B (12) and 87B (21) on the source-drain wires 12 and 21 are 1.5 μm.

After the formation of the source-drain wires 12 and 21, the photosensitive resin patterns 87B (12) and 87B (21) disappear if the said photosensitive resin patterns 87A and 87B are reduced in film thickness by 1.5 μm or more, using an ashing method such as oxygen plasma, exposing the source wire 12 and the drain wire 21; reduced photosensitive resin patterns 87C (5) and 87C (6) can be left as they are only on the electrode terminals 5 and 6. Now, 1) anode-oxidize the source wire 12 and the drain wire 21, as shown in FIGS. 17(e) and 18(e) while illuminating light, using photosensitive resin patterns 87C (5) and 87C (6) as masks, forming oxidized layers 69 and 68 on the surface and 2) at the same time, anode-oxidize a) the secondary amorphous silicon layer 33A which are exposed between the source wire 12 and the drain wire 21, and part of the primary amorphous silicon layer 31A, forming the following insulating layers: silicon oxide layers 66 including impurities and silicon oxide layer including no impurities (not shown).

After anode oxidization is finished, when photosensitive patterns 87C (5) ad 87C (6) are removed, electrode terminals 5 ad 6, comprising a low resistance thin film layer, are exposed, as shown FIGS. 17(f) and 18(f).

When a liquid crystal panel is made by gluing the active substrate 2 thus obtained and a color filter 9 together, Embodiment 9 for this invention is completed. As for the structure of the storage capacitance 15, a structural example of the counter electrodes (storage capacitance lines) 16 and the pixel electrodes (drain electrodes) 21 being overlapped at level (50: a diagonal line going up to the right-hand side) with the gate insulating layer 30 in between as shown FIGS. 17(f). Measures against static electricity are not shown here.

It is possible to have an embodiment which uses streamlining of island formation and opening formation in the gate insulating layers adopted in Embodiments 1-8 in addition to streamlining of passivation insulating layer formation for source-drain wires adopted in Embodiment 7 and it is described as Embodiment 10 hereinafter.

Embodiment 10 has almost the same process as Embodiment 8 up to where island formation process of semiconductor layers and contacts formation process, as shown in FIGS. 19(d) and 20(d). Now, deposit successively: 1) a thin film layer 34 of approximately 0.1 μm in film thickness as an anode-oxidizable heat-resistant metal layer such as Ti and Ta and 2) an AL thin film layer 35 of approximately 0.3 μm in film thickness as an anode-oxidizable low resistance wire layer. Next, as shown in FIGS. 19(e) and 20(e), 1) etch the source-drain wire materials consisting of these thin film layers using fine processing technology such as photosensitive resin patterns 87A and 87B, and 2) selectively form a) drain electrodes 21 composing the pixel electrodes and b) signal lines 12 comprising source wires for insulating gate type transistors, both comprising a laminate of 34A and 35A. At the time the source-drain wire 12 and 21 are formed, electrode terminals 5 of the scanning lines containing part of the scanning lines 11 within the openings 63A and electrode terminals 6 of the signal lines composing part of the signal line, are also formed. Here also, it is no longer necessary to etch the secondary amorphous silicon layer 33A and the primary amorphous silicon layer 31A and the thickness of the primary amorphous silicon layer 31A may be thin as 0.1 μm.

After the formation of the source-drain wires 12 and 21, 1) reduce the film thickness of the said photosensitive resin patterns 87A and 87B by 1.5 μm or more, using an ashing method such as oxygen plasma, 2) anode-oxidize the source wire 12 and drain wire 21 while illuminating light, using the reduced photosensitive resin patterns 87C (5) and 87C (6) as masks as shown in FIGS. 19(f) and 20(f), forming oxidized layers 68 and 69 on the surfaces. At the same time, anode-oxidize a) the secondary amorphous silicon layer 33A exposed between the source wire 12 and the drain wire 21, and part of the primary amorphous silicon layer 31A, forming the following insulating layers: a silicon oxide layer 66 including impurities and a silicon oxide layer including no impurities (not shown).

After anode oxidization is finished, when photosensitive patterns 87C (5) ad 87C (6) are removed, and electrode terminals 5 ad 6 consisting of a low resistance thin film layer are exposed, as shown FIGS. 19(g) and 20(g). When a liquid crystal panel is made by gluing the active substrate 2 thus obtained and a color filter 9 together, Embodiment 10 for this invention is completed. The structure of the storage capacitance 15 is the same as Embodiment 9.

The number of photomasks used is different between Embodiments 9 and 10, at 4 and 3 photomasks, respectively. However, it must be obvious that the resulting liquid crystal display devices have almost no difference in their structure. The only difference is whether part of the scanning lines, which are exposed within formed openings, have been reduced in its thickness or whether the surfaces have deteriorated. In short, Embodiment 10 is a case of improved process reduction. Strictly speaking, contacts in the gate insulator self-align with semiconductor islands within the image display area and also within the glass substrate 2 because of the simultaneous pattern formation formed with the same photomask and the relative position between them is unchanged.

Realizations in accordance with the present invention therefore have been described in the context of particular embodiments. These embodiments are meant to be illustrative and not limiting. Many variations, modifications, additions, and improvements are possible. For example, plural instances may be provided for components described herein as a single instance. Additionally, structures and functionality presented as discrete components in the exemplary configurations may be implemented as a combined structure or component. These and other variations, modifications, additions, and improvements may fall within the scope of the invention as defined in the claims that follow.

What is claimed is:

1. A liquid crystal display device, with at least the following characteristics in a liquid crystal display device that is filled with liquid crystals between 1) a primary transparent insulating substrate that aligns, in a 2-dimensional matrix, unit pixels that have on a principal plane at least 1) an insulating gate type transistor, b) scanning lines that also work as gate electrodes and signal lines that also work as source wires for the said insulated gate type transistor, and c) pixel electrodes that are connected to drain wires and d) counter electrodes formed within a specific distance from said pixel electrodes, and 2) a secondary transparent insulating substrate or color filter that faces said primary transparent insulating substrate, comprising:

I) one or more primary metal layers as scanning lines and counter electrodes on a principal plane of a primary transparent insulating substrate;

II) an island-like channel layer through a gate insulating layer above the gate electrodes;

III) a protective insulating layer narrower than the gate electrodes on the said channel layer;

IV) a plurality of openings self aligned with said island-like channel layer, on said scanning lines outside an image display area, exposing parts of the scanning lines within said openings;

V) a pair of semiconductor layers as the source-drain of the insulating gate type transistor, on said channel layer, partly overlapping with the gate electrodes;

VI) a plurality of source wires and drain wires consisting of one or more secondary metal layers and a heat resistant metal layer on said semiconductor layers, and gate insulating layer, and electrodes terminals of scanning lines consisting of secondary metal layers on said openings, and electrode terminals of signal lines comprising parts of said signal lines; and VII) a passivation insulating layer with openings on said electrode terminals of scanning lines and signal lines, on said primary transparent insulating substrate.

2. The liquid crystal display device according to claim 1, wherein said channel layer has no impurity doping, and said semiconductor layers are doped with impurities.

3. The liquid crystal display device according to claim 1, wherein said gate insulating layer further comprises a plasma protecting layer underneath.

4. The liquid crystal display device according to claim 1, wherein said protective insulating layer is a silicon nitride (SiNx) layer.

5. The liquid crystal display device according to claim 1, wherein said secondary metal layer comprises an anode-oxidizable metal layer and said passivation insulating layer is an anodized layer thereof.

6. The liquid crystal display device according to claim 5, wherein said anode-oxidizable metal layer is an aluminum layer.

7. The liquid crystal display device according to claim 5, wherein said anode-oxidizable metal layer is a tantalum layer.

8. The liquid crystal display device according to claim 1, wherein said passivation insulating layer is a photo-sensitive organic insulation layer.

9. The liquid crystal display device according to claim 1, wherein said photo-sensitive organic insulating layer is not covered on the electrode terminals for said signal lines.

* * * * *